United States Patent
Park et al.

(10) Patent No.: US 12,490,494 B2
(45) Date of Patent: Dec. 2, 2025

(54) THREE-DIMENSIONAL SEMICONDUCTOR DEVICE AND METHOD OF FABRICATING THE SAME

(71) Applicant: SAMSUNG ELECTRONICS CO., LTD., Suwon-si (KR)

(72) Inventors: Sungil Park, Suwon-si (KR); Jae Hyun Park, Hwaseong-si (KR); Daewon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 748 days.

(21) Appl. No.: 17/834,527

(22) Filed: Jun. 7, 2022

(65) Prior Publication Data

US 2023/0170398 A1    Jun. 1, 2023

(30) Foreign Application Priority Data

Nov. 29, 2021   (KR) .......................... 10-2021-0167246

(51) Int. Cl.
| | | |
|---|---|---|
| *H10D 62/10* | (2025.01) | |
| *H10D 62/81* | (2025.01) | |
| *H10D 64/27* | (2025.01) | |
| *H10D 64/66* | (2025.01) | |

(52) U.S. Cl.
CPC .......... *H10D 64/662* (2025.01); *H10D 62/81* (2025.01); *H10D 64/311* (2025.01)

(58) Field of Classification Search
CPC ............. H10D 30/014; H10D 30/6735; H10D 30/6757; H10D 30/43; H10D 30/435; H10D 62/121; H10D 62/119; H10D 62/122; H10D 62/123

See application file for complete search history.

(56) References Cited

U.S. PATENT DOCUMENTS

| | | | |
|---|---|---|---|
| 2019/0131394 A1* | 5/2019 | Reznicek | ........... H10D 30/6739 |
| 2020/0006479 A1 | 1/2020 | Reznicek et al. | |
| 2020/0098756 A1 | 3/2020 | Lilak et al. | |
| 2020/0098859 A1* | 3/2020 | Reboh | ................... H10D 30/014 |
| 2020/0105756 A1 | 4/2020 | Crum et al. | |
| 2020/0219970 A1 | 7/2020 | Mannebach et al. | |
| 2020/0219979 A1* | 7/2020 | Rachmady | ............. B82Y 10/00 |
| 2020/0294998 A1 | 9/2020 | Lilak et al. | |
| 2020/0411661 A1 | 12/2020 | Guler et al. | |
| 2021/0057413 A1 | 2/2021 | Dewey et al. | |
| 2021/0074703 A1 | 3/2021 | Weber et al. | |
| 2021/0320035 A1 | 10/2021 | Xie et al. | |
| 2021/0408285 A1* | 12/2021 | Hickey | ................. H10D 64/017 |
| 2022/0271124 A1* | 8/2022 | Li | ......................... H10D 30/797 |

\* cited by examiner

*Primary Examiner* — Eric A. Ward
(74) *Attorney, Agent, or Firm* — Sughrue Mion, PLLC

(57) ABSTRACT

Disclosed are a three-dimensional semiconductor device and a method of fabricating the same. The semiconductor device includes: a first active region on a substrate, the first active region including a pair of lower source/drain regions and a lower channel structure; a second active region on the first active region, the second active region including a pair of upper source/drain regions and an upper channel structure; and a gate electrode on the lower and upper channel structures. The gate electrode includes: first and second metal structures, which are respectively provided adjacent bottom and top surfaces of semiconductor layers of the lower and upper channel structures.

20 Claims, 47 Drawing Sheets

THREE-DIMENSIONAL SEMICONDUCTOR DEVICE AND METHOD OF FABRICATING THE SAME

CROSS-REFERENCE TO RELATED APPLICATION

This application claims priority to Korean Patent Application No. 10-2021-0167246, filed on Nov. 29, 2021, in the Korean Intellectual Property Office, the disclosure of which is hereby incorporated by reference in its entirety.

BACKGROUND

The present disclosure relates to a three-dimensional semiconductor device and a method of fabricating the same, and in particular, to a three-dimensional semiconductor device including a field effect transistor and a method of fabricating the same.

A semiconductor device includes an integrated circuit consisting of metal-oxide-semiconductor field-effect transistors (MOS-FETs). To meet demand for a semiconductor device with a small pattern size and a reduced design rule, the MOS-FETs are being scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

An embodiment of the present disclosure provides a three-dimensional semiconductor device with an increased integration density and improved electrical characteristics.

An embodiment of the present disclosure provides a method of fabricating a three-dimensional semiconductor device with an increased integration density and improved electrical characteristics.

According to an embodiment, a three-dimensional semiconductor device includes: a first active region on a substrate, the first active region comprising a pair of lower source/drain regions and a lower channel structure between the pair of lower source/drain regions; a second active region on the first active region, the second active region comprising a pair of upper source/drain regions and an upper channel structure between the pair of upper source/drain regions; and a gate electrode on the lower channel structure and the upper channel structure. The lower channel structure comprises a plurality of lower semiconductor layers, which are spaced apart from each other along a direction perpendicular to an upper surface of the substrate. The upper channel structure comprises a plurality of upper semiconductor layers spaced apart from each other along the direction. The gate electrode comprises: a first metal structure comprising a first metal and enclosing at least one of the plurality of lower semiconductor layers; and a second metal structure comprising a second metal and enclosing at least one of the plurality of upper semiconductor layers.

According to an embodiment a three-dimensional semiconductor device includes: a plurality of lower semiconductor layers on a substrate and spaced apart from each other along a direction perpendicular to an upper surface of the substrate; a lower source/drain region connected to the plurality of lower semiconductor layers; and a lower gate electrode on the plurality of lower semiconductor layers. The lower gate electrode comprises a first metal structure comprising a first metal and enclosing at least one of the plurality of lower semiconductor layers. A number of semiconductor layers in the plurality of lower semiconductor layers that are enclosed by the first metal structure, is smaller than a number of the plurality of lower semiconductor layers connected to the lower source/drain region.

According to an embodiment a three-dimensional semiconductor device includes: a first active region on a substrate, the first active region comprising a lower channel structure and a lower source/drain region connected to the lower channel structure; a second active region on the first active region, the second active region comprising an upper channel structure and an upper source/drain region connected to the upper channel structure; and a gate electrode on the lower channel structure and the upper channel structure. A center portion of the lower source/drain region has a first thickness. A center portion of the upper source/drain region has a second thickness different from the first thickness. Each of the lower source/drain region and the upper source/drain region comprises a first vertex on a side surface, which protrudes in a first direction, and a second vertex, which is an inflection point defined by the side surface and a top surface thereof. A distance between the first vertex and the second vertex of the lower source/drain region in the first direction is a first horizontal distance. A distance between the first vertex and the second vertex of the upper source/drain region in the first direction is a second horizontal distance different from the second horizontal distance.

According to an embodiment, a method of fabricating a three-dimensional semiconductor device includes: alternately stacking semiconductor layers and sacrificial layers on a substrate to form a stacking layer; patterning the stacking layer to form a stack protruding from the substrate, the stack comprising a lower stack, which comprises a first semiconductor layer and a first sacrificial layer, and an upper stack, which comprises a second semiconductor layer and a second sacrificial layer; forming a sacrificial layer on the stack; etching the stack using the sacrificial layer as an etch mask to form a recess; forming a lower source/drain region, which is connected to the first semiconductor layer, in the recess; forming an upper source/drain region, which is connected to the second semiconductor layer, in the recess on the lower source/drain region; removing the sacrificial layer to expose the stack; removing the first sacrificial layer and the second sacrificial layer of the stack to form a first inner region and a second inner region, respectively; and forming a lower gate electrode and an upper gate electrode to fill the first inner region and the second inner region, respectively. A center portion of the lower source/drain region and a center portion of the upper source/drain region have different thicknesses along a direction perpendicular to an upper surface of the substrate.

BRIEF DESCRIPTION OF THE DRAWINGS

The above and other aspects will be more apparent from the following description of example embodiments taken in conjunction with the accompanying drawings, in which.

DETAILED DESCRIPTION

Example embodiments will now be described more fully with reference to the accompanying drawings, in which example embodiments are shown. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
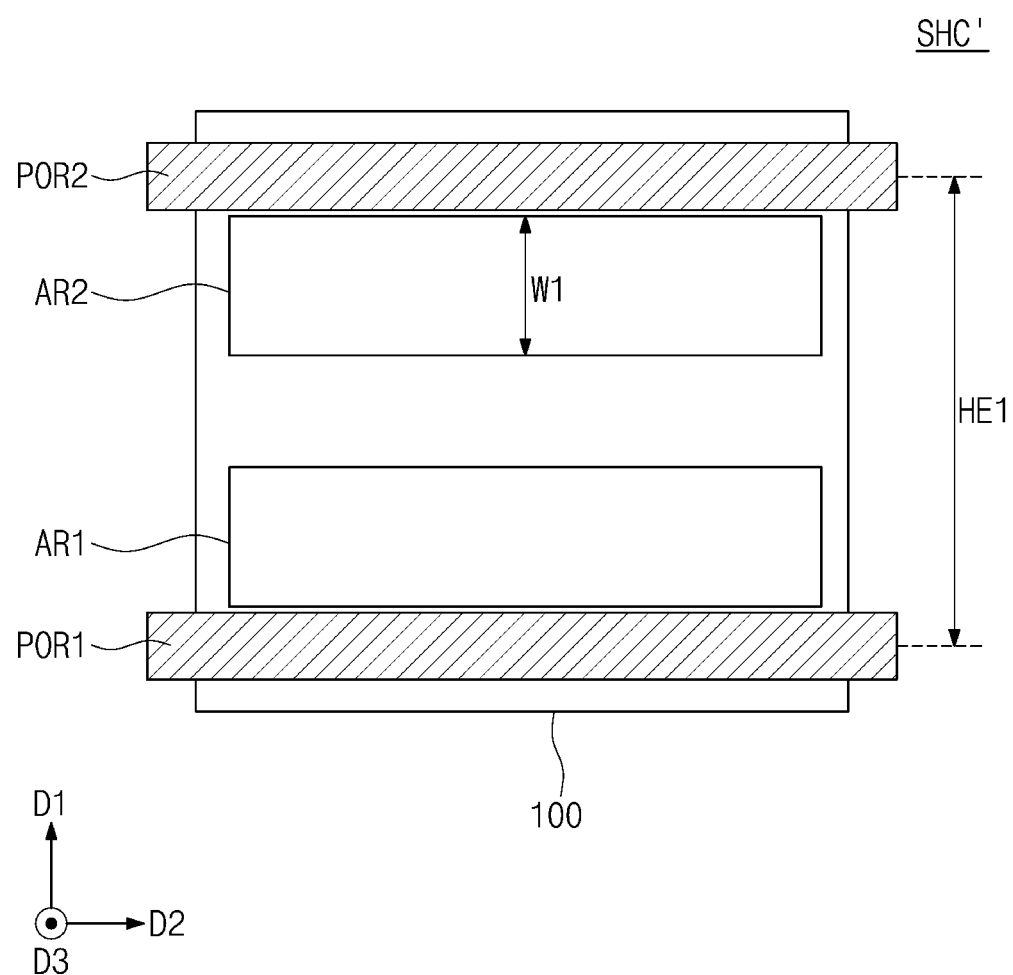
FIG. 1 is a conceptual diagram illustrating a logic cell of a semiconductor device according to a comparative example.

FIG. 1 is a conceptual diagram illustrating a logic cell of a semiconductor device according to a comparative example. FIG. 1 illustrates a logic cell of a two-dimensional device according to the comparative example.

Referring to FIG. 1, a single height cell SHC' may be provided. In detail, a first power line POR1 and a second power line POR2 may be provided on a substrate 100. A drain voltage VDD (i.e., a power voltage) may be applied to one of the first and second power lines POR1 and POR2. A source voltage VSS (i.e., a ground voltage) may be applied to the other of the first and second power lines POR1 and POR2. As an example, the source voltage VSS may be applied to the first power line POR1, and the drain voltage VDD may be applied to the second power line POR2.

The single height cell SHC' may be defined between the first power line POR1 and the second power line POR2. The single height cell SHC' may include a first active region AR1 and a second active region AR2. One of the first and second active regions AR1 and AR2 may be a PMOSFET region, and the other of the first and second active regions AR1 and AR2 may be an NMOSFET region. As an example, the first active region AR1 may be an NMOSFET region, and the second active region AR2 may be a PMOSFET region. In this regard, the single height cell SHC' may have a CMOS structure provided between the first power line POR1 and the second power line POR2.

The semiconductor device according to the comparative example may be a two-dimensional device, in which transistors of a front-end-of-line (FEOL) layer are two-dimensionally arranged. For example, NMOSFETs of the first active region AR1 and PMOSFETs of the second active region AR2 may be formed to be spaced apart from each other in a first direction D1.

Each of the first and second active regions AR1 and AR2 may have a first width W1 in the first direction D1. In the comparative example, a length of the single height cell SHC' in the first direction D1 may be defined as a first height HE1. The first height HE1 may be substantially equal to a distance (e.g., pitch) between the first and second power lines POR1 and POR2.

The single height cell SHC' may constitute one logic cell. The logic cell may indicate a logic device (e.g., AND, OR, XOR, XNOR, inverter, and so forth), which is configured to execute a specific function. The logic cell may include transistors constituting the logic device and interconnection lines connecting transistors to each other.

Because the single height cell SHC' according to the comparative example includes a two-dimensional device, the first and second active regions AR1 and AR2 may not overlap each other and may be spaced apart from each other in the first direction D1. Thus, the first height HE1 of the single height cell SHC' should be defined in such a way that both of the first and second active regions AR1 and AR2, which are spaced apart from each other in the first direction D1, are included in the single height cell SHC'. As a result, the first height HE1 of the single height cell SHC' according to the comparative example should have a relatively large value. In this regard, the single height cell SHC' according to the comparative example may have a relatively large area.

Figure 2:
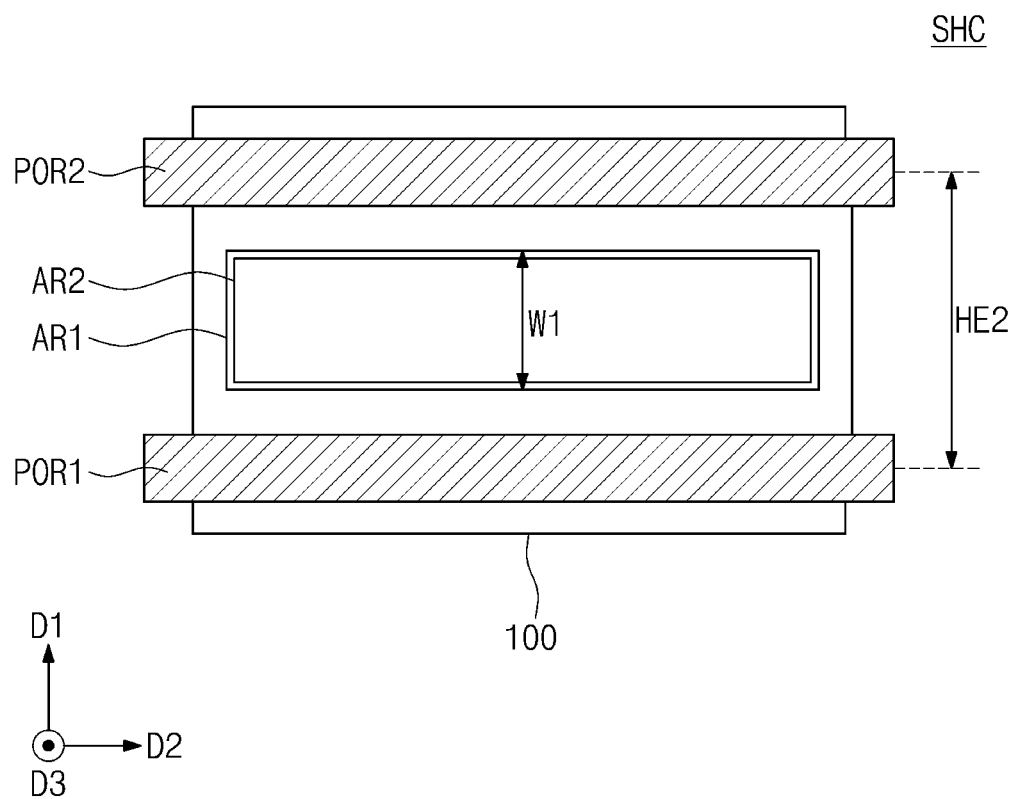
FIG. 2 is a conceptual diagram illustrating a logic cell of a semiconductor device according to an embodiment.

FIG. 2 is a conceptual diagram illustrating a logic cell of a semiconductor device according to an embodiment. FIG. 2 illustrates a logic cell of a three-dimensional device according to an embodiment.

Referring to FIG. 2, a single height cell SHC including a three-dimensional device (e.g., stacked transistors) may be provided. In detail, the first power line POR1 and the second power line POR2 may be provided on the substrate 100. The single height cell SHC may be defined between the first power line POR1 and the second power line POR2.

The single height cell SHC may include the first and second active regions AR1 and AR2. One of the first and second active regions AR1 and AR2 may be a PMOSFET region, and the other of the first and second active regions AR1 and AR2 may be an NMOSFET region.

The semiconductor device according to the present embodiment may be a three-dimensional device, in which transistors of an FEOL layer are vertically stacked. The first active region AR1 as a bottom tier may be provided on the substrate 100, and the second active region AR2 as a top tier may be stacked on the first active region AR1. For example, the NMOSFETs of the first active region AR1 may be provided on the substrate 100, and the PMOSFETs of the second active region AR2 may be stacked on the NMOS-FETs. The first active region AR1 and the second active region AR2 may be spaced apart from each other in a vertical direction (i.e., a third direction D3).

Each of the first and second active regions AR1 and AR2 may have a first width W1 in the first direction D1. A length, in the first direction D1, of the single height cell SHC according to the present embodiment may be defined as a second height HE2.

Because the single height cell SHC according to the present embodiment includes a three-dimensional device (i.e., stacked transistors), the first and second active regions AR1 and AR2 may overlap each other. Thus, the second height HE2 of the single height cell SHC may be designed to have a value that is slightly larger than a width of a single active region (i.e., the first width W1). As a result, the second height HE2 of the single height cell SHC according to the present embodiment may be smaller than the first height HE1 of the single height cell SHC' described with reference to FIG. 1. In this regard, the single height cell SHC according to the present embodiment may have a relatively small area. In the three-dimensional semiconductor device according to the present embodiment, it may be possible to reduce an area for the logic cell and thereby to increase an integration density of the semiconductor device.

Figure 3:
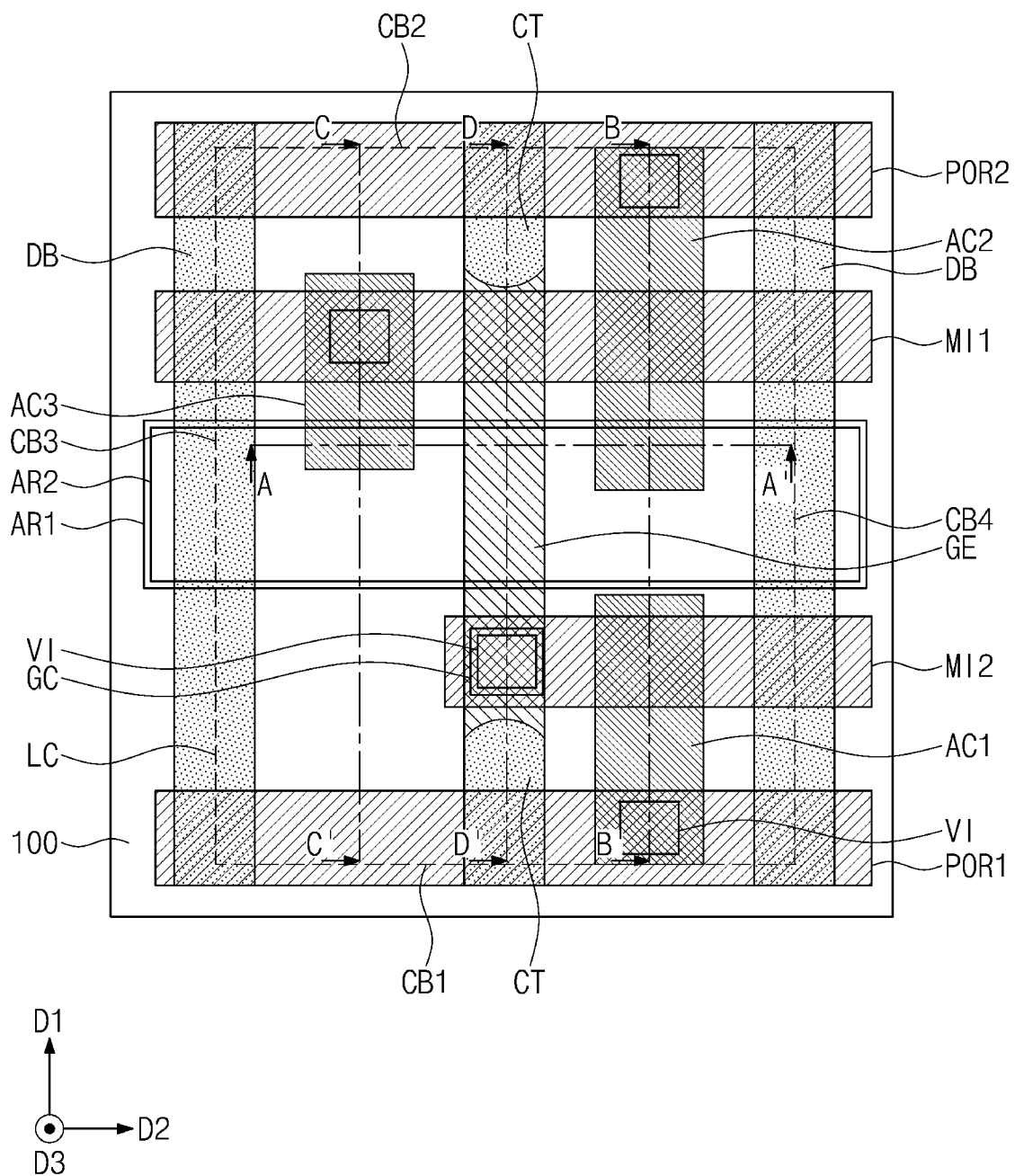
FIG. 3 is a plan view illustrating a three-dimensional semiconductor device according to an embodiment.

FIG. 3 is a plan view illustrating a three-dimensional semiconductor device according to an embodiment. FIGS. 4A to 4D are sectional views taken along lines A-A', B-B', C-C', and D-D', respectively, of FIG. 3. The three-dimensional semiconductor device shown in FIGS. 3 and 4A to 4D is a detailed example of the single height cell SHC of FIG. 2.

Referring to FIG. 3 and FIGS. 4A to 4D, a logic cell LC may be provided on the substrate 100. The logic cell LC according to the present embodiment may be an inverter cell. The substrate 100 may be a semiconductor substrate, which is formed of silicon, germanium, silicon germanium, or the like, or a compound semiconductor substrate. In an embodiment, the substrate 100 may be a silicon wafer.

The logic cell LC may include the first and second active regions AR1 and AR2, which are sequentially stacked on the substrate 100. One of the first and second active regions AR1 and AR2 may be a PMOSFET region, and the other of the first and second active regions AR1 and AR2 may be an NMOSFET region. The first active region AR1 may be provided as a bottom tier of the FEOL layer, and the second active region AR2 may be provided as a top tier of the FEOL layer. The NMOS- and PMOS-FETs of the first and second active regions AR1 and AR2 may be vertically stacked to form a three-dimensional stack transistor. In an embodiment, the first active region AR1 may be an NMOSFET region, and the second active region AR2 may be a PMOSFET region. In another embodiment, the first active region AR1 may be a PMOSFET region, and the second active region AR2 may be an NMOSFET region. When viewed in a plan view, the stacked first and second active regions AR1 and AR2 may be located between the first power line POR1 and the second power line POR2.

An active pattern AP may be defined by a trench TR, which is formed in an upper portion of the substrate 100. The active pattern AP may be a vertically protruding portion of the substrate 100. When viewed in a plan view, the active pattern AP may have a bar shape extending in a second direction D2. The first and second active regions AR1 and AR2 may be sequentially stacked on the active pattern AP.

A device isolation layer ST may be provided to fill the trench TR. The device isolation layer ST may include a silicon oxide layer. A top surface of the device isolation layer ST may be coplanar with or lower than a top surface of the active pattern AP. The device isolation layer ST may not cover lower and upper channel patterns CH1 and CH2, which will be described below.

The first active region AR1 including a lower channel pattern CH1 and lower source/drain patterns SD1 may be provided on the active pattern AP. The lower channel pattern CH1 may be interposed between a pair of the lower source/drain patterns SD1. The lower channel pattern CH1 may connect the pair of the lower source/drain patterns SD1 to each other.

The lower channel pattern CH1 may include a first semiconductor pattern SP1 and a second semiconductor pattern SP2, which are sequentially stacked. The first and second semiconductor patterns SP1 and SP2 may be spaced apart from each other in the vertical direction (i.e., the third direction D3). Each of the first and second semiconductor patterns SP1 and SP2 may be formed of or include silicon (Si), germanium (Ge), or silicon germanium (SiGe). In an embodiment, each of the first and second semiconductor patterns SP1 and SP2 may be formed of or include crystalline silicon.

The lower source/drain patterns SD1 may be provided on the top surface of the active pattern AP. Each of the lower source/drain patterns SD1 may be an epitaxial pattern, which is formed by a selective epitaxial growth (SEG) process. As an example, a top surface of the lower source/drain pattern SD1 may be higher than a top surface of the second semiconductor pattern SP2 of the lower channel pattern CH1.

The lower source/drain patterns SD1 may be doped with impurities to have a first conductivity type. The first conductivity type may be an n-type or a p-type. In the present embodiment, the first conductivity type may be an n-type. The lower source/drain patterns SD1 may be formed of or include silicon (Si) and/or silicon germanium (SiGe).

A first interlayer insulating layer 110 may be provided on the lower source/drain patterns SD1. The first interlayer insulating layer 110 may cover the lower source/drain patterns SD1. A second interlayer insulating layer 120 and the second active region AR2 may be provided on the first interlayer insulating layer 110.

The second active region AR2 may include an upper channel pattern CH2 and upper source/drain patterns SD2. The upper channel pattern CH2 may vertically overlap the lower channel pattern CH1. The upper source/drain patterns SD2 may vertically overlap the lower source/drain patterns SD1. The upper channel pattern CH2 may be interposed between a pair of the upper source/drain patterns SD2. The upper channel pattern CH2 may connect the pair of the upper source/drain patterns SD2 to each other.

The upper channel pattern CH2 may include a fourth semiconductor pattern SP4 and a fifth semiconductor pattern SP5, which are sequentially stacked. The fourth and fifth semiconductor patterns SP4 and SP5 may be spaced apart from each other in the third direction D3. The fourth and fifth semiconductor patterns SP4 and SP5 of the upper channel pattern CH2 may be formed of or include the same semiconductor materials as the first and second semiconductor patterns SP1 and SP2 of the lower channel pattern CH1.

A dummy channel pattern DSP may be interposed between the lower channel pattern CH1 and the upper channel pattern CH2 thereon. The dummy channel pattern DSP may be spaced apart from the lower source/drain patterns SD1. The dummy channel pattern DSP may be spaced apart from the upper source/drain patterns SD2. In this regard, the dummy channel pattern DSP may not be connected to any source/drain pattern.

Referring back to FIG. 4A, the dummy channel pattern DSP may include a third semiconductor pattern SP3 between the second semiconductor pattern SP2 and the fourth semiconductor pattern SP4. Opposite ends of the third semiconductor pattern SP3 may be respectively covered with liner layers LIN. The third semiconductor pattern SP3 may be spaced apart from the lower and upper source/drain patterns SD1 and SD2 by the liner layers LIN. The third semiconductor pattern SP3 may be formed of or include the same semiconductor material as the first and second semiconductor patterns SP1 and SP2 of the lower channel pattern CH1.

Referring to FIG. 3 and FIGS. 4A to 4D, the upper source/drain patterns SD2 may be provided on a top surface of the first interlayer insulating layer 110. Each of the upper source/drain patterns SD2 may be an epitaxial pattern, which is formed by a selective epitaxial growth (SEG) process. As an example, a top surface of the upper source/drain pattern SD2 may be higher than a top surface of the fifth semiconductor pattern SP5 of the upper channel pattern CH2.

The upper source/drain patterns SD2 may be doped with impurities to have a second conductivity type. The second conductivity type may be different from the first conductivity type of the lower source/drain pattern SD1. The second conductivity type may be a p-type. The upper source/drain patterns SD2 may be formed of or include silicon germanium (SiGe) and/or silicon (Si).

The second interlayer insulating layer 120 may cover the upper source/drain patterns SD2. Each of first to third active contacts AC1, AC2, and AC3, which will be described below, may extend through the second interlayer insulating layer 120. A third interlayer insulating layer 130 may be provided on the second interlayer insulating layer 120. A top surface of the third interlayer insulating layer 130 may be coplanar with a top surface of each of the first to third active contacts AC1, AC2, and AC3.

A gate electrode GE may be provided on the stacked lower and upper channel patterns CH1 and CH2. When viewed in a plan view, the gate electrode GE may be a bar-shaped pattern extended in the first direction D1. The gate electrode GE may vertically overlap the stacked lower and upper channel patterns CH1 and CH2.

The gate electrode GE may extend from a top surface of the device isolation layer ST (or the top surface of the active pattern AP) to a gate capping pattern GP in the vertical direction (i.e., the third direction D3). The gate electrode GE may extend from the lower channel pattern CH1 of the first active region AR1 to the upper channel pattern CH2 of the second active region AR2 in the third direction D3. The gate electrode GE may extend from the lowermost semiconductor pattern (i.e., the first semiconductor pattern SP1) to the uppermost semiconductor pattern (i.e., the fifth semiconductor pattern SP5) in the third direction D3.

The gate electrode GE may be provided on top, bottom, and opposite side surfaces of each of the first to fifth semiconductor patterns SP1 to SP5. That is, the transistor according to the present embodiment may include a three-dimensional field effect transistor (e.g., MBCFET or GAAFET) in which the gate electrode GE is provided to three-dimensionally surround the channel region.

The gate electrode GE may include a lower gate electrode LGE, which is provided in the bottom tier of the FEOL layer (i.e., the first active region AR1), and an upper gate electrode UGE, which is provided in the top tier of the FEOL layer (i.e., the second active region AR2). The lower gate electrode LGE and the upper gate electrode UGE may vertically overlap each other. The lower gate electrode LGE and the upper gate electrode UGE may be connected to each other. In this regard, the gate electrode GE according to the present embodiment may be a common gate electrode, in which the lower gate electrode LGE on the lower channel pattern CH1 and the upper gate electrode UGE on the upper channel pattern CH2 are connected to each other.

The lower gate electrode LGE may include a first portion PO1 interposed between the active pattern AP and the first semiconductor pattern SP1, a second portion PO2 interposed between the first and second semiconductor patterns SP1 and SP2, and a third portion PO3 interposed between the second and third semiconductor patterns SP2 and SP3.

The upper gate electrode UGE may include a fourth portion PO4 interposed between the third and fourth semiconductor patterns SP3 and SP4, a fifth portion PO5 interposed between the fourth and fifth semiconductor patterns SP4 and SP5, and a sixth portion PO6 on the fifth semiconductor pattern SP5.

A pair of gate spacers GS may be respectively disposed on opposite side surfaces of the gate electrode GE. Referring back to FIG. 4A, the pair of the gate spacers GS may be respectively disposed on opposite side surfaces of the sixth portion PO6. The gate spacers GS may extend along the gate electrode GE and in the first direction D1. Top surfaces of the gate spacers GS may be higher than a top surface of the gate electrode GE. The top surfaces of the gate spacers GS may be coplanar with the top surface of the second interlayer insulating layer 120. The gate spacers GS may be formed of or include at least one of SiCN, SiCON, or SiN. As another example, the gate spacers GS may include a multi-layer containing at least two of SiCN, SiCON, or SiN. A pair of the liner layers LIN may be respectively provided on opposite side surfaces of each of the third and fourth portions PO3 and PO4 of the gate electrode GE.

The gate capping pattern GP may be provided on the top surface of the gate electrode GE. The gate capping pattern GP may extend along the gate electrode GE and in the first direction D1. For example, the gate capping pattern GP may be formed of or include at least one of SiON, SiCN, SiCON, or SiN.

A gate insulating layer may be interposed between the gate electrode GE and the first to fifth semiconductor patterns SP1 to SP5. More specifically, a lower gate insulating layer LGI may be interposed between the lower gate electrode LGE and the first and second semiconductor patterns SP1 and SP2. An upper gate insulating layer UGI may be interposed between the upper gate electrode UGE and the fourth and fifth semiconductor patterns SP4 and SP5.

Each of the lower and upper gate insulating layers UGI and LGI may include a silicon oxide layer, a silicon oxynitride layer, and/or a high-k dielectric layer. In an embodiment, each of the lower and upper gate insulating layers UGI and LGI may include a silicon oxide layer directly covering a surface of the semiconductor pattern SP1-SP5 and a high-k dielectric layer on the silicon oxide layer. In this regard, each of the lower and upper gate insulating layers UGI and LGI may have a multi-layered structure.

The high-k dielectric layer may be formed of or include at least one of high-k dielectric materials whose dielectric constants are higher than that of silicon oxide. As an example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an embodiment, the lower gate insulating layer LGI may contain a first dipole element. The first dipole element may include lanthanum (La), aluminum (Al), or combinations thereof. In this regard, the lower gate insulating layer LGI may contain lanthanum (La), aluminum (Al) or combinations thereof as its impurity. The lower gate insulating layer LGI may include a dipole interface, which is formed between the high-k dielectric layer and the silicon oxide layer by the dipole element.

As an example, in the case where the lower gate insulating layer LGI contains lanthanum (La), an effective work function of the lower gate electrode LGE may be decreased. In this case, a threshold voltage of the transistor of the first active region AR1, which is the NMOSFET region, may be decreased. As another example, in the case where the lower gate insulating layer LGI contains aluminum (Al), the effective work function of the lower gate electrode LGE may be increased. In this case, the threshold voltage of the transistor of the first active region AR1, which is the NMOSFET region, may be increased.

In an embodiment, the upper gate insulating layer UGI may not contain the dipole element. In this regard, the highest concentration of the dipole element in the upper gate insulating layer UGI may be lower than the highest concentration of the dipole element in the lower gate insulating layer LGI.

In another embodiment, the upper gate insulating layer UGI may contain a second dipole element. The second dipole element may be the same as or different from the first dipole element. The highest concentration of the second dipole element in the upper gate insulating layer UGI may be equal to or different from the highest concentration of the first dipole element in the lower gate insulating layer LGI.

The lower gate electrode LGE may include a first metal pattern MP1 on the first and second semiconductor patterns SP1 and SP2, and a second metal pattern MP2 on the first metal pattern MP1. The first metal pattern MP1 may include a second work function metal, and the second metal pattern MP2 may include a first work function metal. By adjusting compositions of the first and second work function metals, the transistor of the first active region AR1 may be formed to have a desired threshold voltage.

The second work function metal of the first metal pattern MP1 may be a p-type work function metal having a relatively high work function. The first metal pattern MP1 may be formed of or include at least one of metal nitrides. The first metal pattern MP1 may include at least one metallic element, which is selected from the group consisting of titanium (Ti), tantalum (Ta), aluminum (Al), tungsten (W), and molybdenum (Mo), and nitrogen (N). For example, the first metal pattern MP1 may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The first work function metal of the second metal pattern MP2 may be an n-type work function metal having a relatively low work function. The second metal pattern MP2 may be formed of or include at least one of metal carbides. The second metal pattern MP2 may be formed of or include at least one of metal carbides that are doped with silicon and/or aluminum and contain silicon and/or aluminum. As an example, the second metal pattern MP2 may be formed of or include aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC). As another example, the second metal pattern MP2 may be formed of or include titanium carbide (TiAlSiC), which is doped with aluminum and silicon, or tantalum carbide (TaAlSiC), which is doped with aluminum and silicon. As another example, the second metal pattern MP2 may be formed of or include aluminum-doped titanium (TiAl). As still another example, the second metal pattern MP2 may be formed of or include a metal nitride doped with silicon and/or aluminum (e.g., aluminum-doped titanium nitride (TiAlN)).

A work function of the second metal pattern MP2 may be controlled by adjusting a doping concentration of dopants or impurities (e.g., silicon or aluminum) contained in the second metal pattern MP2. As an example, the concentration of the impurity (e.g., silicon or aluminum) in the second metal pattern MP2 may range from 0.1 at % to 25 at %.

Each of the first, second and third portions PO1, PO2, and PO3 of the lower gate electrode LGE may be composed of the second metal pattern MP2 and the first metal pattern MP1 enclosing the second metal pattern MP2. In an embodiment, a thickness of the second metal pattern MP2 may be larger than a thickness of the first metal pattern MP1.

Figure 4A:
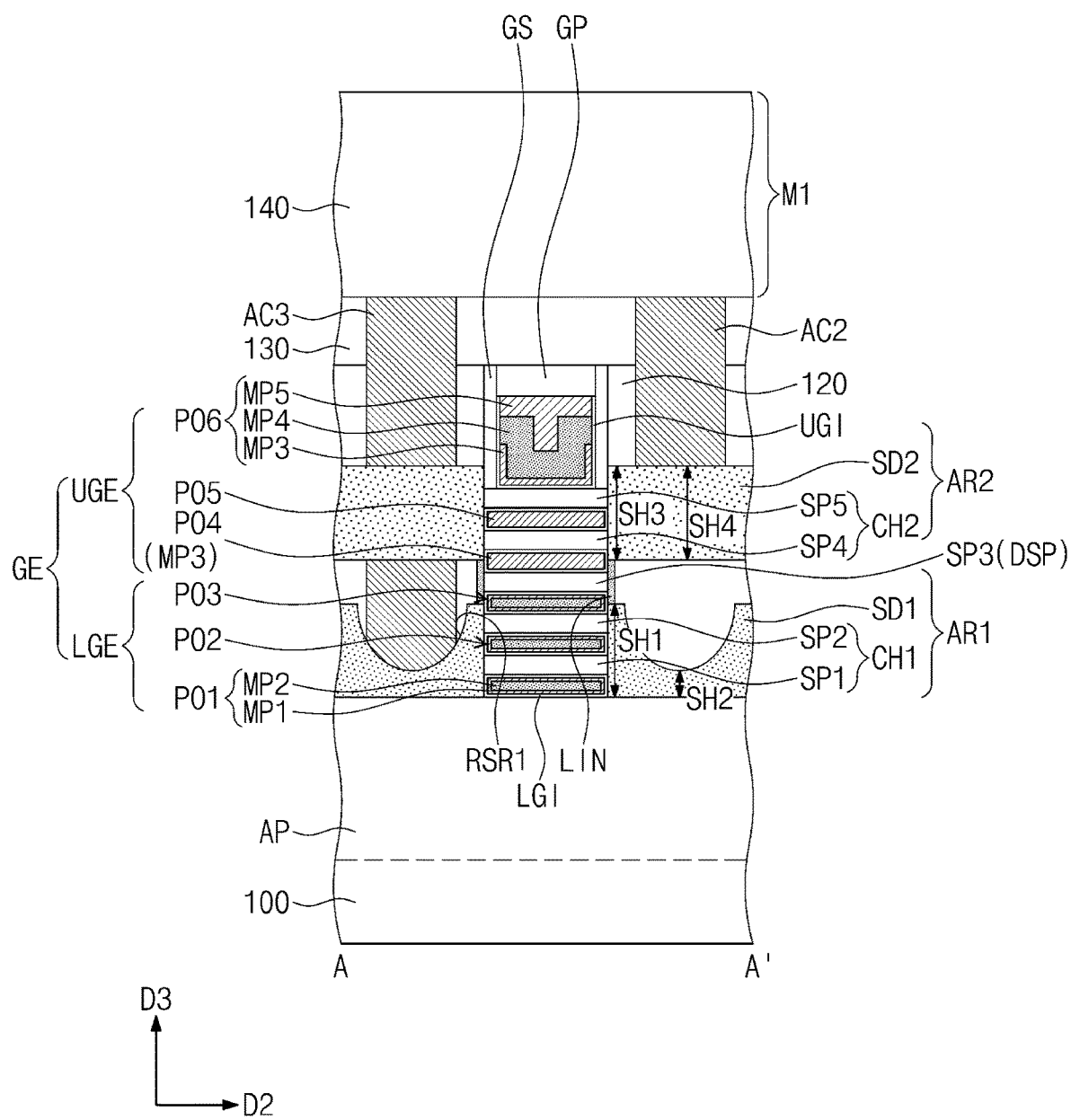
FIGS. 4A, 4B, 4C and 4D are sectional views taken along lines A-A', B-B', C-C', and D-D', respectively, of FIG. 3.
Figure 4B:
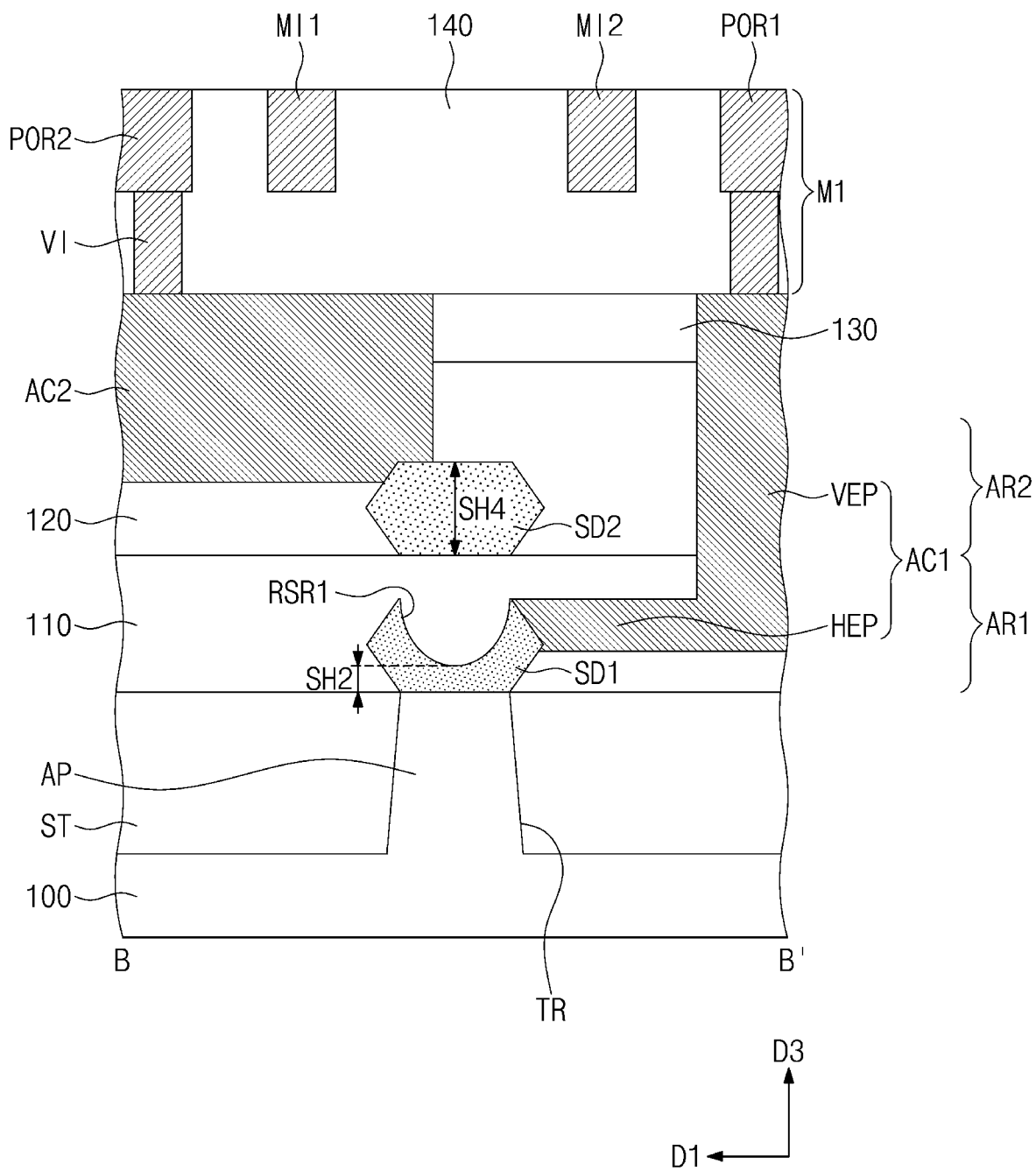
Figure 4C:
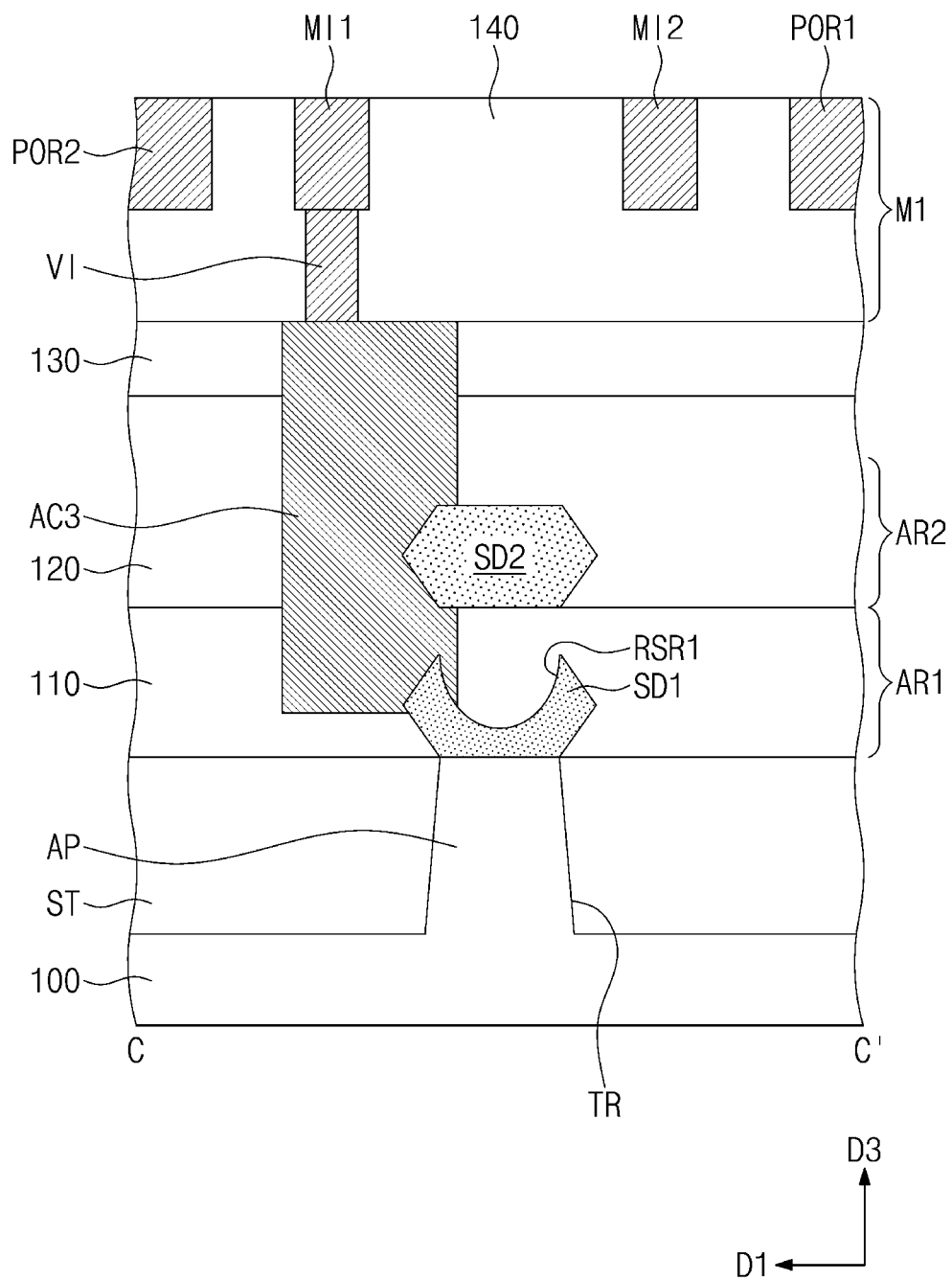
Figure 4D:
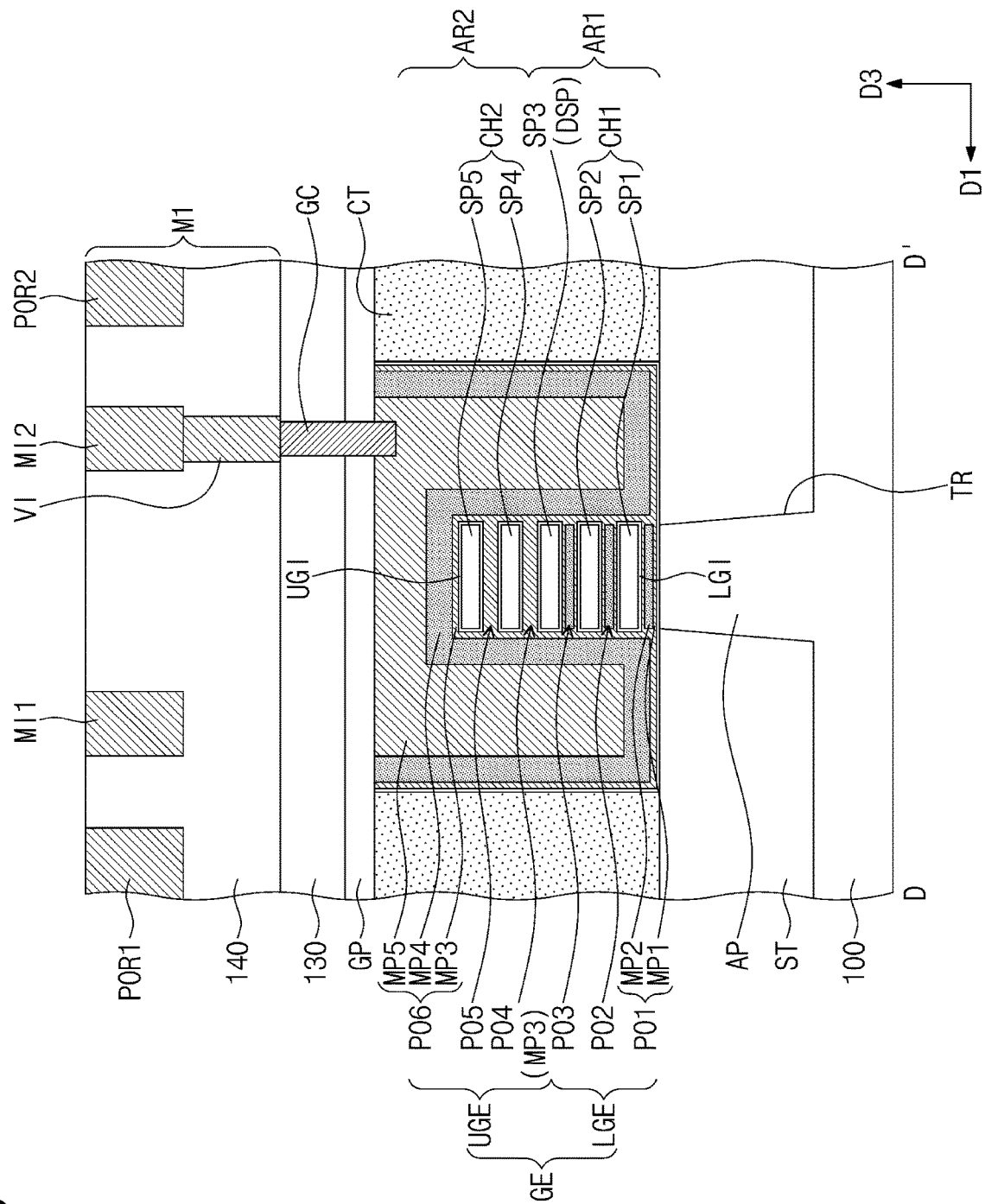

A remaining portion of the lower gate electrode LGE excluding the first, second, and third portions PO1, PO2, and PO3 may further include fourth and fifth metal patterns MP4 and MP5, in addition to the first and second metal patterns MP1 and MP2 (e.g., see FIG. 4D). The fourth and fifth metal patterns MP4 and MP5 will be described below.

The upper gate electrode UGE of the gate electrode GE may include a third metal pattern MP3 on the fourth and fifth semiconductor patterns SP4 and SP5. The third metal pattern MP3 may be provided to enclose the fourth and fifth semiconductor patterns SP4 and SP5. The upper gate electrode UGE may further include a fourth metal pattern MP4 and a fifth metal pattern MP5, which are provided on the third metal pattern MP3.

The third metal pattern MP3 may include the second work function metal, and the fourth metal pattern MP4 may include the first work function metal. By adjusting compositions of the first and second work function metals, the transistor of the second active region AR2 may be formed to have a desired threshold voltage.

The second work function metal of the third metal pattern MP3 may be a p-type work function metal having a relatively high work function, similar to the first metal pattern MP1 described above. The third metal pattern MP3 may be formed of or include at least one of metal nitrides. The third metal pattern MP3 may be formed of or include a metal nitride, which is the same as or different from that in the first metal pattern MP1. A thickness, in the third direction D3, of the third metal pattern MP3 in the fourth and fifth portions PO4 and PO5 may be larger than a thickness, in the third direction D3, of the first metal pattern MP1 in the first to third portions PO1, PO2, and PO3.

The first work function metal of the fourth metal pattern MP4 may be an n-type work function metal having a relatively low work function, similar to the second metal pattern MP2 described above. The fourth metal pattern MP4 may be formed of or include at least one of metal carbides that are doped with silicon and/or aluminum and contain silicon and/or aluminum. The fourth metal pattern MP4 may be formed of or include a material, which is the same as or different from the second metal pattern MP2. A thickness of the fourth metal pattern MP4 may be different from a thickness of the second metal pattern MP2. For example, the thickness of the fourth metal pattern MP4 may be larger than the thickness of the second metal pattern MP2.

The fourth and fifth portions PO4 and PO5 of the upper gate electrode UGE may be composed of the third metal pattern MP3. The sixth portion PO6 of the upper gate electrode UGE may include the third metal pattern MP3, the fourth metal pattern MP4, and the fifth metal pattern MP5, which are sequentially stacked (e.g., see FIG. 4A).

In an embodiment, the fifth metal pattern MP5 may include the second work function metal. For example, the fifth metal pattern MP5 may be formed of or include the same metal nitride material as the third metal pattern MP3. In another embodiment, the fifth metal pattern MP5 may be formed of or include at least one of low resistance metallic materials. For example, the fifth metal pattern MP5 may be formed of or include at least one of low resistance metallic materials (e.g., tungsten (W), ruthenium (Ru), aluminum (Al), titanium (Ti), and tantalum (Ta)).

Referring back to FIG. 3, the logic cell LC according to the present embodiment may include a first cell boundary CB1 and a second cell boundary CB2, which extend in the second direction D2, and are provided at opposite sides of the logic cell LC. Gate cutting patterns CT may be disposed on the first and second cell boundaries CB1 and CB2. When viewed in a plan view, the gate cutting patterns CT on the first and second cell boundaries CB1 and CB2 may be disposed to overlap with the gate electrode GE.

The gate cutting pattern CT may be provided to penetrate the gate electrode GE. The gate electrode GE may be separated from another gate electrode, which is adjacent thereto in the first direction D1, by the gate cutting pattern CT. For example, referring to FIG. 4D, a pair of the gate cutting patterns CT may be respectively provided at opposite end portions of the gate electrode GE. The gate cutting patterns CT may be formed of or include at least one of insulating materials (e.g., silicon oxide, silicon nitride, or combinations thereof).

The logic cell LC according to the present embodiment may include a third cell boundary CB3, which extends in the first direction D1. A fourth cell boundary CB4, which extends in the first direction D1, may be defined at an opposite side of the third cell boundary CB3. Cell isolation structures DB may be disposed on the third and fourth cell boundaries CB3 and CB4, respectively. The cell isolation structures DB may extend in the first direction D1 to separate the logic cell LC of FIG. 3 from other logic cells adjacent thereto.

A gate contact GC may be provided to penetrate a fourth interlayer insulating layer 140 and the gate capping pattern GP, and be electrically connected to the gate electrode GE. In detail, the gate contact GC may be coupled to the first and second power lines POR1 and POR2. The gate contact GC may be a pillar-shaped pattern extending in the third direction D3. The gate contact GC may be formed of or include at least one of metallic materials (e.g., copper (Cu), aluminum (Al), ruthenium (Ru), cobalt (Co), tungsten (W), and molybdenum (Mo)).

Referring back to FIGS. 3 and 4B, a first active contact AC1 may be provided on the lower source/drain pattern SD1 adjacent to a first side of the gate electrode GE. The first active contact AC1 may include a vertical extended portion VEP and a horizontal extended portion HEP. The horizontal extended portion HEP may extend in the first direction D1 to allow the vertical extended portion VEP to overlap the first power line POR1.

The vertical extended portion VEP may be a pillar-shaped portion, which vertically extends to penetrate the first to third interlayer insulating layers 110, 120, and 130. The vertical extended portion VEP of the first active contact AC1 may be horizontally offset from the stacked lower and upper source/drain patterns SD1 and SD2. The horizontal extended portion HEP may be provided in the bottom tier of the FEOL layer. The horizontal extended portion HEP may extend from the vertical extended portion VEP in the first direction D1 and may be coupled to the lower source/drain pattern SD1.

The horizontal and vertical extended portions HEP and VEP may be connected to each other to form one first active contact AC1. For example, the first active contact AC1 may be formed of or include at least one of doped semiconductor materials and/or metallic materials. The metallic materials may include copper (Cu), aluminum (Al), ruthenium (Ru), cobalt (Co), tungsten (W), and molybdenum (Mo).

A second active contact AC2 may be provided on the upper source/drain pattern SD2 adjacent to the first side of the gate electrode GE. The second active contact AC2 may be spaced apart from the first active contact AC1 in the first direction D1. A first portion of the second active contact AC2 may overlap the upper source/drain pattern SD2. A second portion of the second active contact AC2 may overlap the second power line POR2.

The second active contact AC2 may be provided in the top tier of the FEOL layer. The second active contact AC2 may be a vertically-extended pillar-shaped pattern. The second active contact AC2 may be directly coupled to the upper source/drain pattern SD2. In an embodiment, the second active contact AC2 may be formed of or include the same material as the first active contact AC1.

Referring back to FIGS. 3 and 4C, a third active contact AC3 may be provided on the lower and upper source/drain patterns SD1 and SD2 adjacent to a second side of the gate electrode GE, which is opposite to the first side. The third active contact AC3 may vertically extend to contact both of the lower and upper source/drain patterns SD1 and SD2. In this regard, the third active contact AC3 may be a common contact, which is connected in common to the lower and upper source/drain patterns SD1 and SD2. A first portion of the third active contact AC3 may overlap the lower and upper source/drain patterns SD1 and SD2, and a second portion of the third active contact AC3 may overlap a first interconnection line MI1 of a first metal layer M1. In an embodiment, the third active contact AC3 may be formed of or include the same material as the first active contact AC1.

The fourth interlayer insulating layer 140 may be provided on the third interlayer insulating layer 130. The first metal layer M1 may be provided in the fourth interlayer insulating layer 140. The first metal layer M1 may include the first power line POR1, the second power line POR2, and first and second interconnection lines MI1 and MI2.

When viewed in a plan view, the first power line POR1 may be provided on the first cell boundary CB1, and the second power line POR2 may be provided on the second cell boundary CB2. The gate cutting patterns CT may vertically overlap the first and second power lines POR1 and POR2. The drain voltage VDD may be applied to one of the first and second power lines POR1 and POR2, and the source voltage VSS may be applied to the other of the first and second power lines POR1 and POR2. In an embodiment, the source voltage VSS may be applied to the first power line POR1, and the drain voltage VDD may be applied to the second power line POR2.

The first and second interconnection lines MI1 and MI2 may be disposed between the first and second power lines POR1 and POR2. Each of the first and second interconnection lines MI1 and MI2 may be a line- or bar-shaped pattern, which extends in the second direction D2. The first and second power lines POR1 and POR2 and the first and second interconnection lines MI1 and MI2 may be formed of or include at least one of metallic materials (e.g., copper (Cu), aluminum (Al), ruthenium (Ru), cobalt (Co), tungsten (W), and molybdenum (Mo)).

The first metal layer M1 may include vias VI, which are provided in a lower portion thereof. The first metal layer M1 and the active and gate contacts AC1-AC3 and GC may be connected to each other through the vias VI. For example, the first power line POR1 may be connected to the first active contact AC1 through the via VI, and the second power line POR2 may be connected to the second active contact AC2 through the via VI. The first interconnection line MI1 may be connected to the third active contact AC3 through the via VI. The second interconnection line MI2 may be connected to the gate contact GC through the via VI.

Additional metal layers (e.g., M2, M3, M4, and so forth) may be stacked on the first metal layer M1. The first metal layer M1 and the metal layers (e.g., M2, M3, M4, and so forth) on the first metal layer M1 may constitute a back-end-of-line (BEOL) layer of the semiconductor device. The metal layers (e.g., M2, M3, M4, and so forth) on the first metal layer M1 may include routing lines, which are used to connect the logic cells to each other.

A three-dimensional semiconductor device according to an embodiment may have a structure that is configured to control a ratio between NFET and PFET currents (i.e., an NP ratio=NFET current/PFET current), and such a structure will be described in more detail with reference to FIGS. 4A and 4B.

In the semiconductor device according to the present embodiment, the lower source/drain pattern SD1 of the transistor (e.g., NFET) of the first active region AR1 may be provided to include a first recessed region RSR1. The first recessed region RSR1 may be an empty region, which is formed by recessing an upper portion of the lower source/drain pattern SD1. In an embodiment, the lowermost point of the first recessed region RSR1 may be located at a level between bottom and top surfaces of the first semiconductor pattern SP1.

A side portion of the lower source/drain pattern SD1 may have a first thickness SH1. A center portion of the lower source/drain pattern SD1 may have a second thickness SH2. The side portion of the lower source/drain pattern SD1 may be a portion that is connected to the first and second semiconductor patterns SP1 and SP2. The center portion of the lower source/drain pattern SD1 may overlap the bottommost portion of the first recessed region RSR1. The first thickness SH1 may be larger than the second thickness SH2. Each of the first and second thicknesses SH1 and SH2 may be a distance between the top and bottom surfaces of the lower source/drain pattern SD1 measured in the third direction D3.

A side portion of the upper source/drain pattern SD2 may have a third thickness SH3. A center portion of the upper source/drain pattern SD2 may have a fourth thickness SH4. The side portion of the upper source/drain pattern SD2 may be a portion that is connected to the fourth and fifth semiconductor patterns SP4 and SP5. The third thickness SH3 and the fourth thickness SH4 may be substantially equal to each other. The third thickness SH3 may be substantially equal to the first thickness SH1.

Due to the first recessed region RSR1, the lower source/drain pattern SD1 may have a reduced volume. A contact resistance between the lower source/drain pattern SD1 and the first active contact AC1 may be increased by the first recessed region RSR1. As a result, the transistor of the first active region AR1 may have an increased resistance and a reduced current.

The upper source/drain pattern SD2 may not include the recessed region, unlike the lower source/drain pattern SD1. Thus, a volume of the upper source/drain pattern SD2 may be larger than the volume of the lower source/drain pattern SD1. A contact resistance between the upper source/drain pattern SD2 and the second active contact AC2 may be relatively low. As a result, the transistor (e.g., PFET) of the second active region AR2 may have a low resistance and a large current, compared with the transistor of the first active region AR1.

In the three-dimensional semiconductor device according to the present embodiment, it may be possible to adjust the NP ratio (NFET current/PFET current) to a relatively small value. For example, the NP ratio of the semiconductor device according to the present embodiment may be smaller than one.

FIGS. 5A to 13B are sectional views illustrating a method of fabricating a semiconductor device, according to an embodiment. In detail, FIGS. 5A, 6A, 7A, 8A, 9A, 10A, 11A, 12A, and 13A are sectional views corresponding to the line A-A' of FIG. 3. FIGS. 7B, 8B, 9B, 10B, and 11B are sectional views corresponding to the line C-C' of FIG. 3. FIGS. 5B, 6B, 12B, and 13B are sectional views corresponding to the line D-D' of FIG. 3.

Figure 5A:
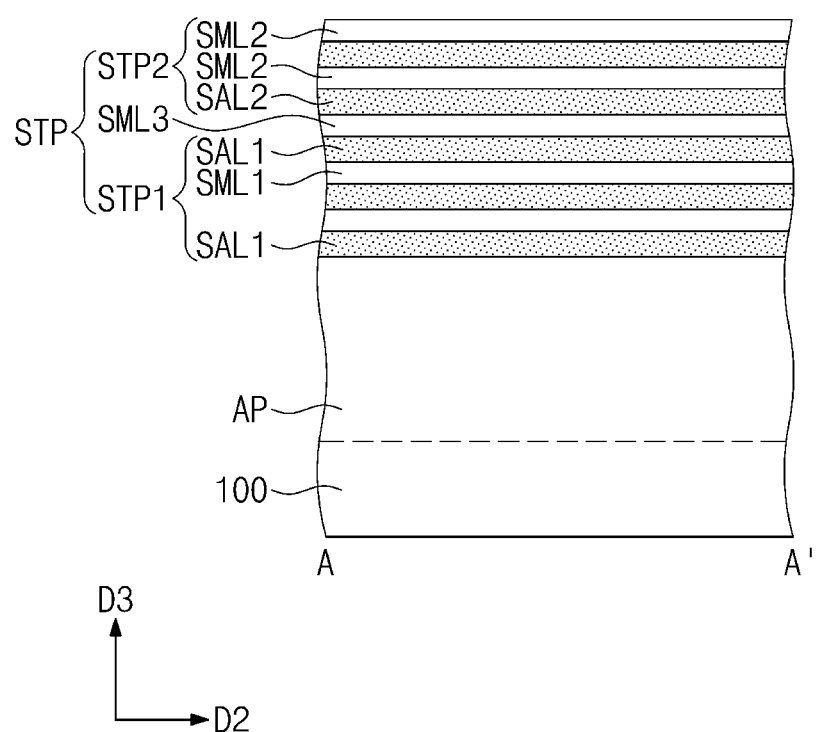
FIGS. 5A, 5B, 6A, 6B, 7A, 7B, 8A, 8B, 9A, 9B, 10A, 10B, 11A, 11B, 12A, 12B, 13A and 13B are sectional views illustrating a method of fabricating a semiconductor device, according to an embodiment.
Figure 5B:
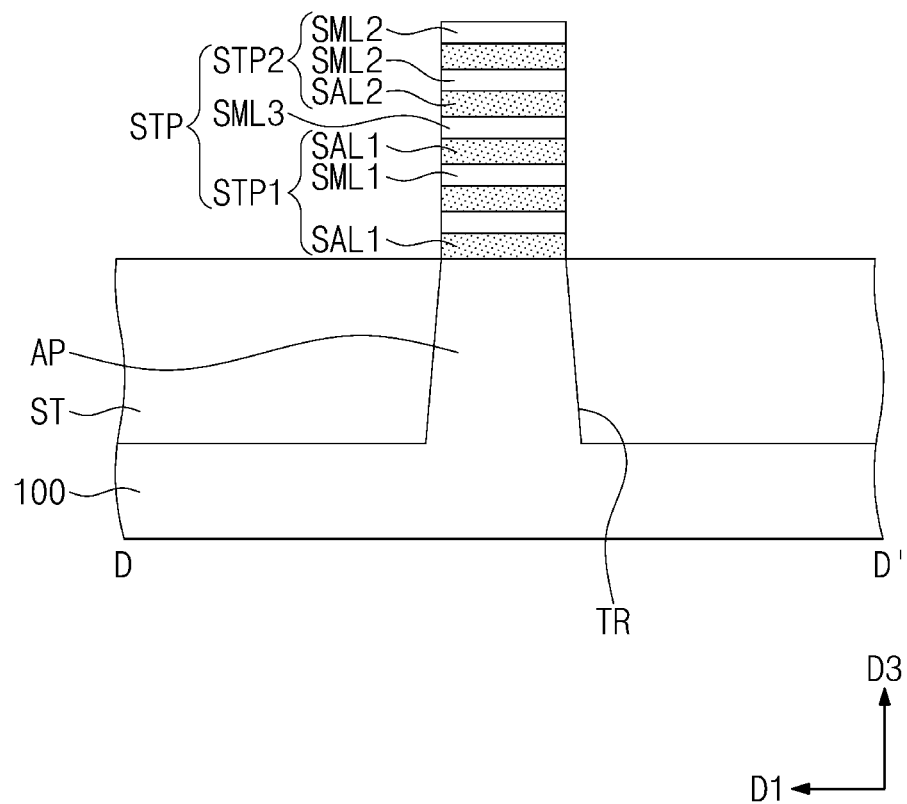

Referring to FIGS. 5A and 5B, first sacrificial layers SAL1 and first semiconductor layers SML1 may be alternately stacked on the substrate 100. The first sacrificial layers SAL1 may be formed of or include at least one of silicon (Si), germanium (Ge), or silicon germanium (SiGe), and the first semiconductor layers SML1 may be formed of a material, which includes at least one of silicon (Si), germanium (Ge), or silicon germanium (SiGe) but is different from that of the first sacrificial layers SAL1. For example, the first sacrificial layers SAL1 may be formed of or include silicon germanium (SiGe), and the first semiconductor layers SML1 may be formed of or include silicon (Si). A concentration of germanium (Ge) in each of the first sacrificial layers SAL1 may range from 10 at % to 30 at %.

A third semiconductor layer SML3 may be formed on the uppermost one of the first semiconductor layers SML1. In an embodiment, a thickness of the third semiconductor layer SML3 may be substantially equal to a thickness of the first semiconductor layer SML1. In another embodiment, the thickness of the third semiconductor layer SML3 may be larger than a thickness of each of the first semiconductor layer SML1 and the first sacrificial layer SAL1. The third semiconductor layer SML3 may be formed of or include the same semiconductor material as the first semiconductor layers SML1.

Second sacrificial layers SAL2 and second semiconductor layers SML2 may be alternately stacked on the third semiconductor layer SML3. Each of the second sacrificial layers SAL2 may be formed of or include the same material as the first sacrificial layer SAL1, and each of the second semiconductor layers SML2 may be formed of or include the same material as the first semiconductor layer SML1. The third semiconductor layer SML3 may be interposed between the first sacrificial layer SAL1 and the second sacrificial layer SAL2.

A stacking pattern STP may be formed by patterning the first and second sacrificial layers SAL1 and SAL2 and the first to third semiconductor layers SML1, SML2, and SML3, which are stacked on the substrate 100. The formation of the stacking pattern STP may include forming a hard mask pattern on the uppermost one of the second semiconductor layers SML2 and etching the layers (e.g., SAL1, SAL2, SML1, SML2, and SML3), which are stacked on the substrate 100, using the hard mask pattern as an etch mask. During the formation of the stacking pattern STP, an upper portion of the substrate 100 may be patterned to form the trench TR defining the active pattern AP. The stacking pattern STP may have a bar shape extending in the second direction D2.

The stacking pattern STP may include a lower stacking pattern STP1 on the active pattern AP, an upper stacking pattern STP2 on the lower stacking pattern STP1, and the third semiconductor layer SML3 between the lower and upper stacking patterns STP1 and STP2. The lower stacking pattern STP1 may include the first sacrificial layers SAL1 and the first semiconductor layers SML1, which are alternately stacked. The upper stacking pattern STP2 may include the second sacrificial layers SAL2 and the second semiconductor layers SML2, which are alternately stacked.

The device isolation layer ST may be formed on the substrate 100 to fill the trench TR. In detail, an insulating layer may be formed on the substrate 100 to cover the active pattern AP and the stacking pattern STP. The device isolation layer ST may be formed by recessing the insulating layer to expose the stacking pattern STP.

Figure 6A:
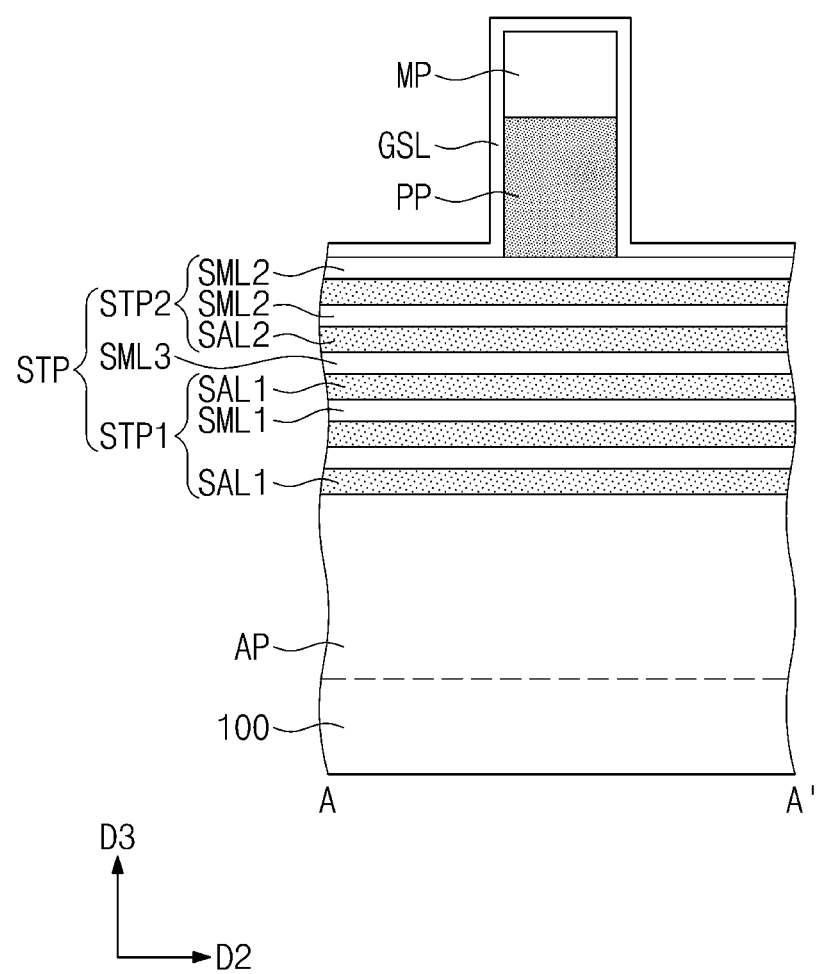
Figure 6B:
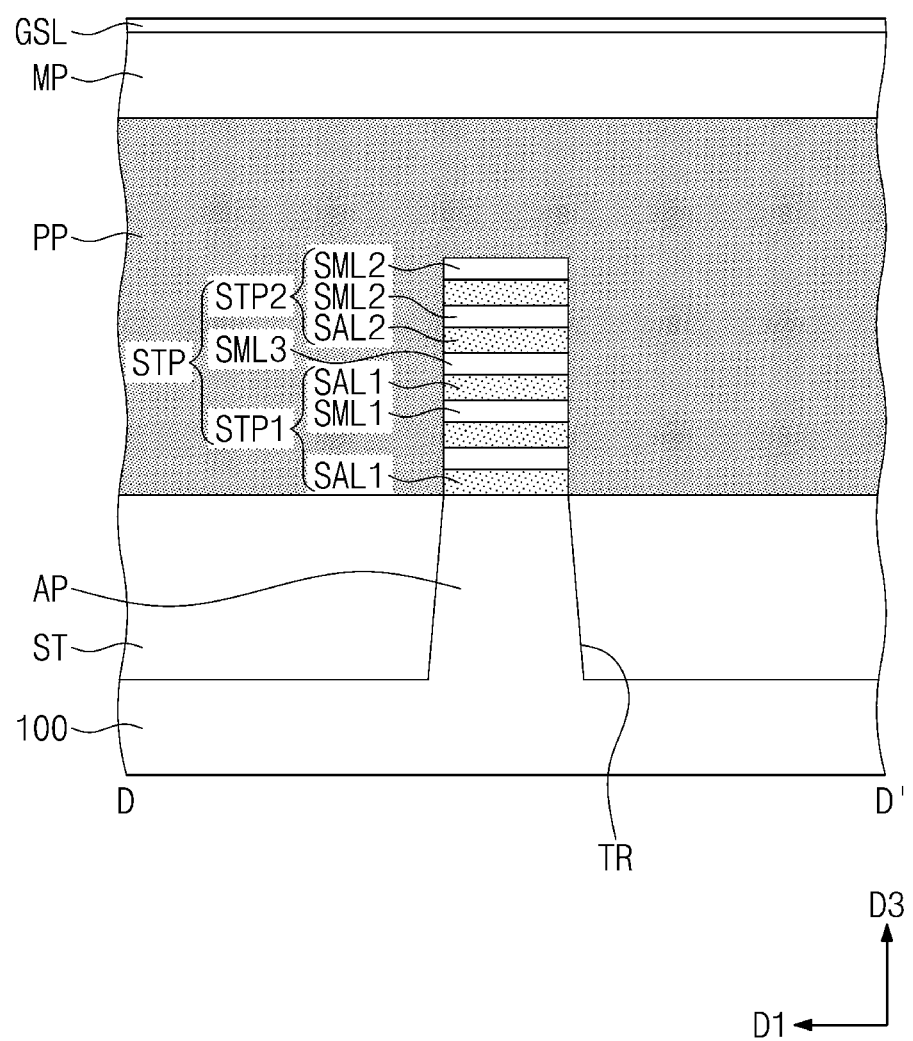

Referring to FIGS. 6A and 6B, a sacrificial pattern PP may be formed to cross the stacking pattern STP. The sacrificial pattern PP may be formed to have a line shape extending in the first direction D1. In detail, the formation of the sacrificial pattern PP may include forming a sacrificial layer on the substrate 100, forming a hard mask pattern MP on the sacrificial layer, and patterning the sacrificial layer using the hard mask pattern MP as an etch mask. The sacrificial layer may be formed of or include amorphous silicon and/or polysilicon.

A spacer layer GSL may be conformally formed on the substrate 100. The spacer layer GSL may cover the sacrificial pattern PP and the hard mask pattern MP. For example, the spacer layer GSL may be formed of or include at least one of SiCN, SiCON, or SiN.

Figure 7A:
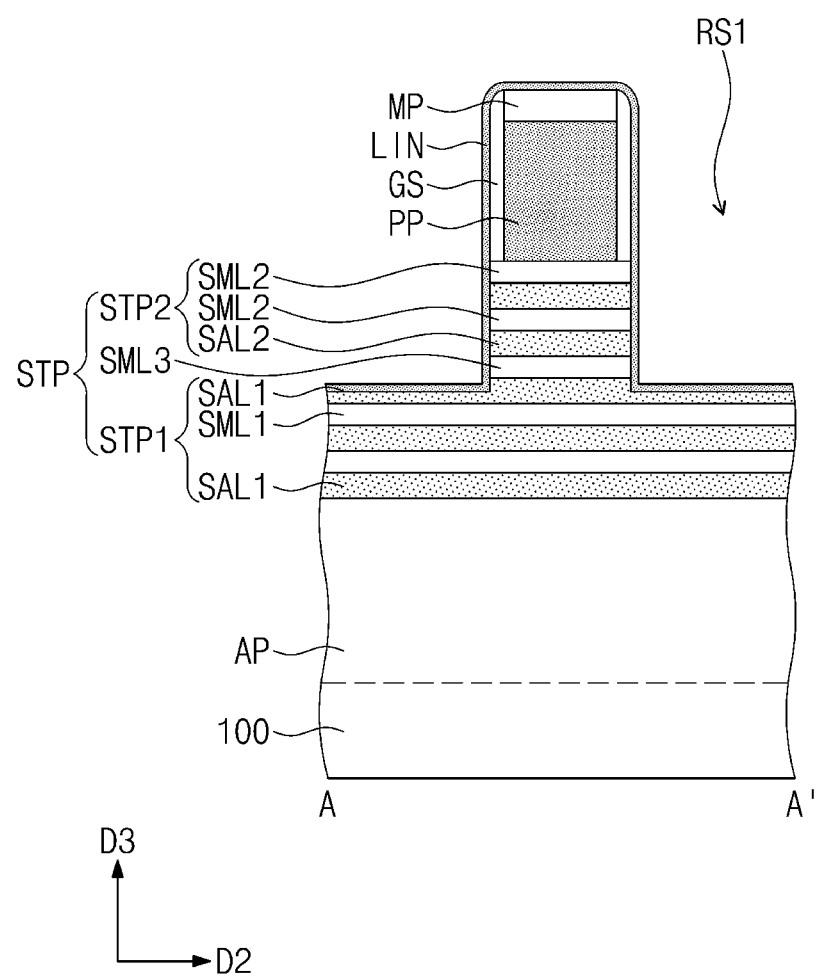
Figure 7B:
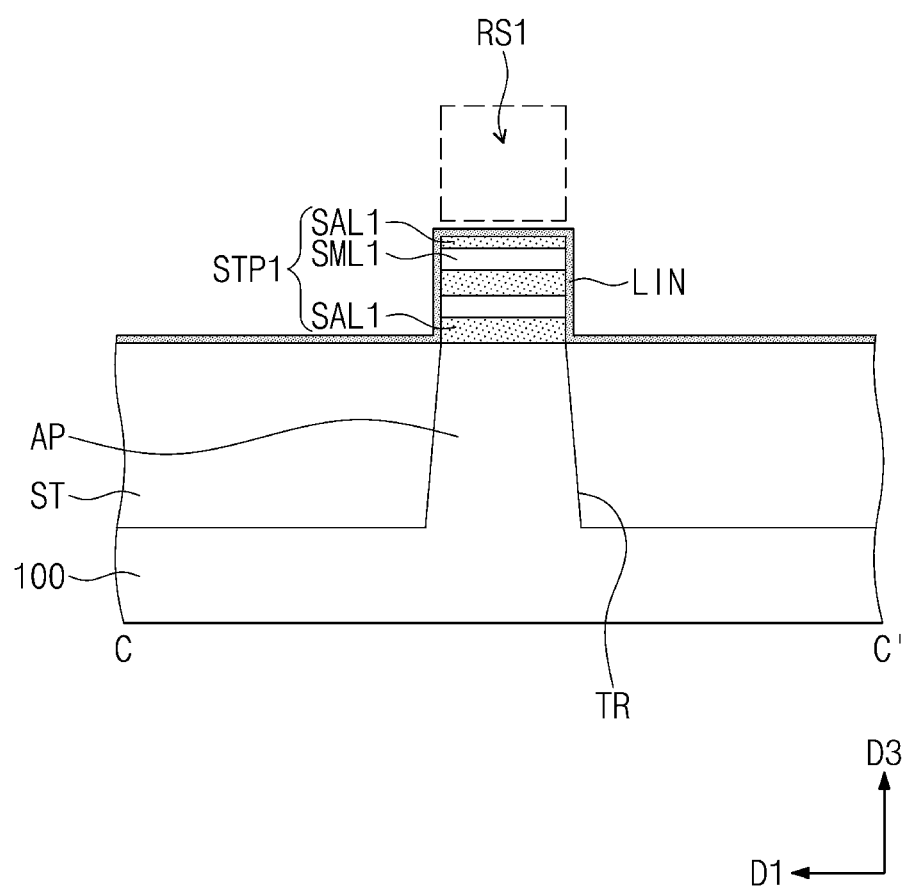

Referring to FIGS. 7A and 7B, a first etching process on the stacking pattern STP may be performed using the spacer layer GSL and the hard mask patterns MP as an etch mask. First recesses RS1 may be respectively formed at both sides of the sacrificial pattern PP by the first etching process. The first recess RS1 may be an empty region, which is formed by recessing the upper stacking pattern STP2.

The first etching process may be an anisotropic etching process. As a result of the first etching process, the gate spacer GS covering a side surface of the sacrificial pattern PP may be formed from the spacer layer GSL. The first etching process may be performed until the uppermost one of the first sacrificial layers SAL1 of the lower stacking pattern STP1 is exposed. In this regard, the first recess RS1 may be formed to expose the lower stacking pattern STP1 (e.g., see FIG. 7B).

The liner layer LIN may be conformally formed on the substrate 100. The liner layer LIN may cover the gate spacers GS and the hard mask patterns MP. The liner layer LIN may be formed to cover an inner surface of the first recess RS1. The liner layer LIN may cover the exposed portion of the lower stacking pattern STP1. In an embodiment, the liner layer LIN may be formed of or include silicon nitride.

Figure 8A:
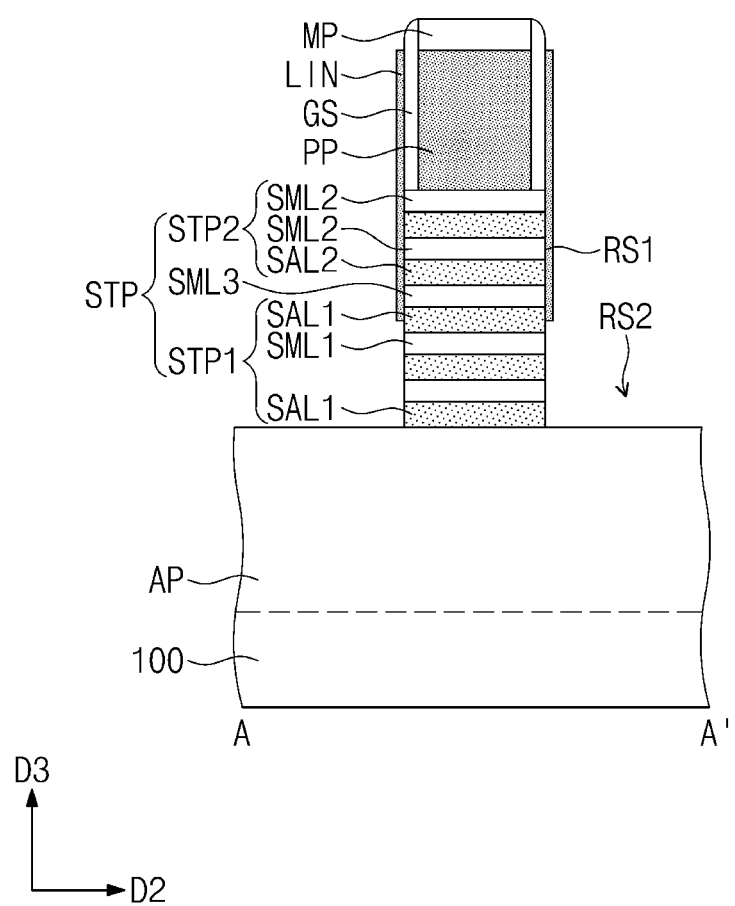
Figure 8B:
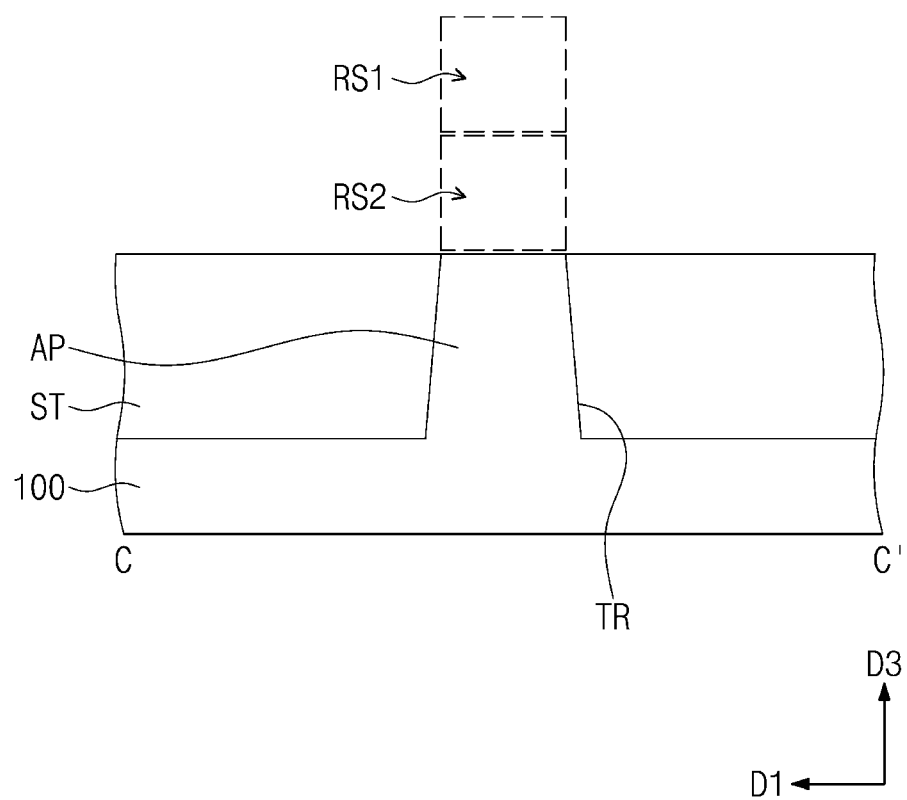

Referring to FIGS. 8A and 8B, a second etching process on the stacking pattern STP may be performed using the liner layer LIN, the gate spacers GS, and the hard mask patterns MP as an etch mask. Second recesses RS2 may be respectively formed at both sides of the sacrificial pattern PP by the second etching process. The second recess RS2 may be formed by recessing the portion of the lower stacking pattern STP1 exposed by the first recess RS1. The second recess RS2 may extend from the first recess RS1 in a downward direction.

The second etching process may be an anisotropic etching process. The second etching process may be performed until the top surface of the active pattern AP is exposed. In this regard, the second recess RS2 may be formed to expose the top surface of the active pattern AP.

Figure 9A:
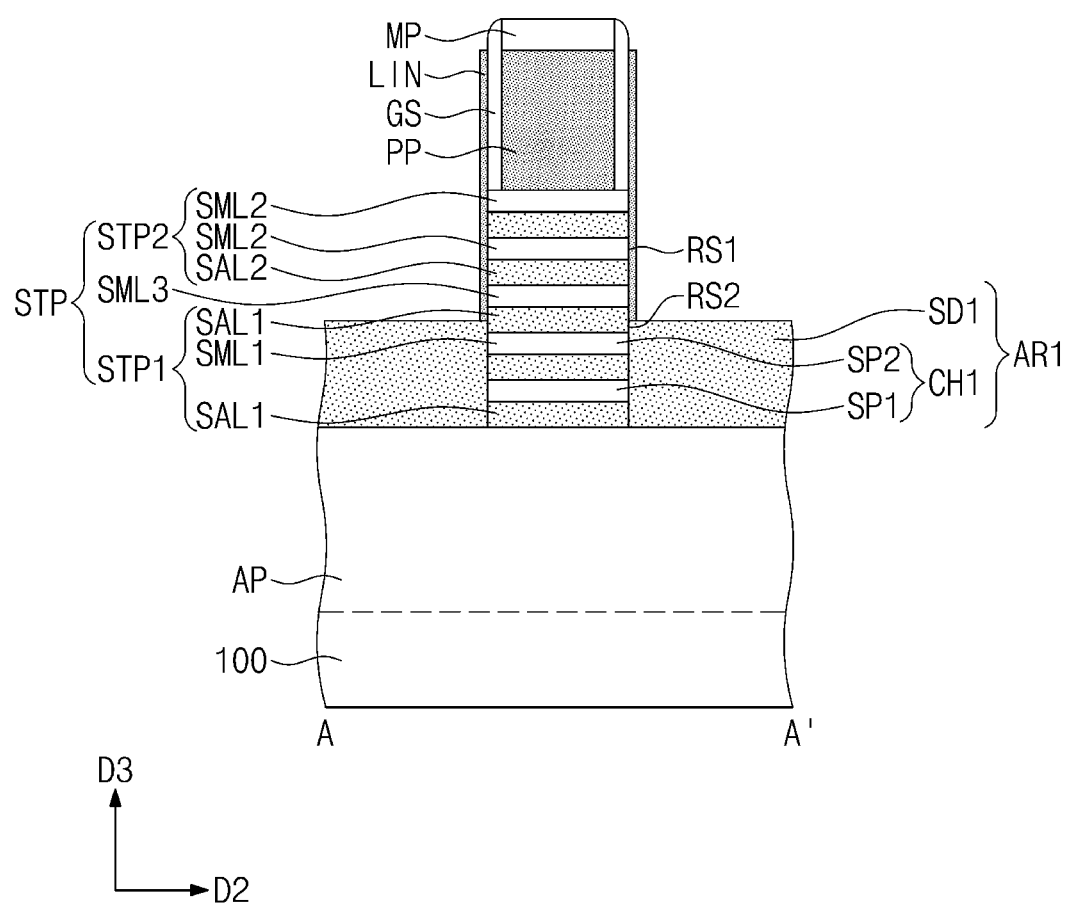
Figure 9B:
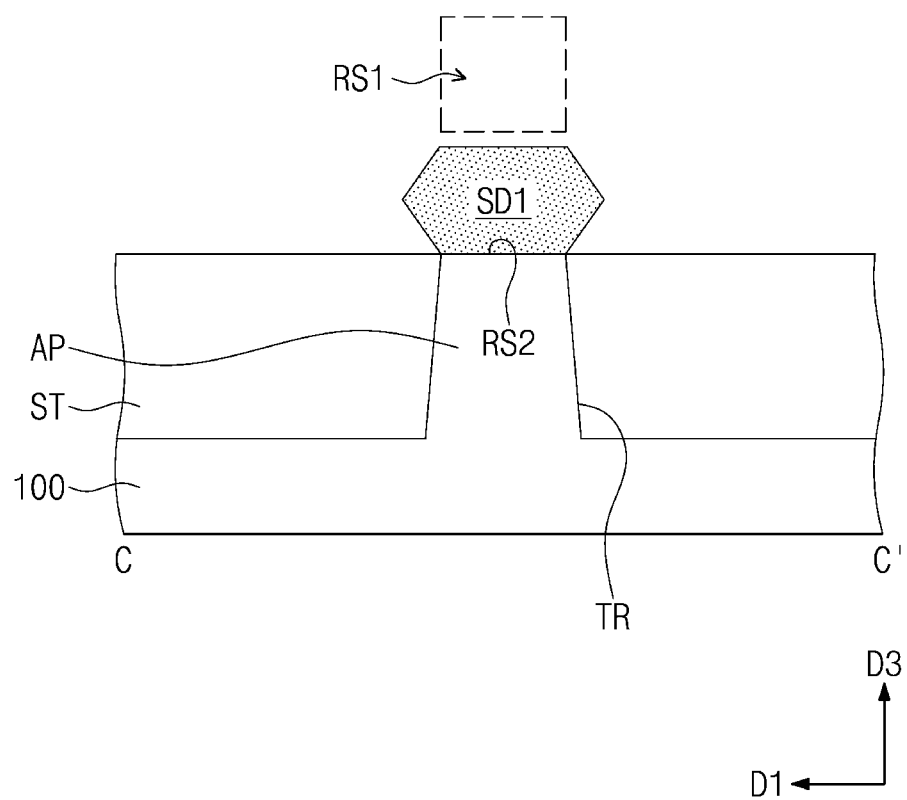

Referring to FIGS. 9A and 9B, the lower source/drain patterns SD1 may be formed in the second recesses RS2, respectively. In detail, the lower source/drain pattern SD1 may be formed by performing a first SEG process using an inner surface of the second recess RS2 as a seed layer. The lower source/drain pattern SD1 may be grown using the first semiconductor layers SML1 and the substrate 100, which are exposed by the second recess RS2, as a seed. As an example, the first SEG process may include a chemical vapor deposition (CVD) process or a molecular beam epitaxy (MBE) process.

During the first SEG process, impurities may be injected into the lower source/drain pattern SD1 in an in-situ manner. As another example, impurities may be injected into the lower source/drain pattern SD1, after the formation of the lower source/drain pattern SD1. The lower source/drain pattern SD1 may be doped to have a first conductivity type (e.g., an n-type).

The first semiconductor layers SML1, which are interposed between pairs of the lower source/drain patterns SD1, may constitute the lower channel pattern CH1. That is, the first and second semiconductor patterns SP1 and SP2 of the lower channel pattern CH1 may be respectively formed from the first semiconductor layers SML1. The lower channel pattern CH1 and a pair of the lower source/drain patterns SD1 at both sides thereof may constitute the first active region AR1, which is the bottom tier of the three-dimensional device.

An inner side surface of the first recess RS1 may be covered with the liner layer LIN. That is, the second semiconductor layers SML2 of the upper stacking pattern STP2 may not be exposed by the liner layer LIN, during the first SEG process. Accordingly, an additional semiconductor layer may not be grown in the first recess RS1, during the first SEG process.

Figure 10A:
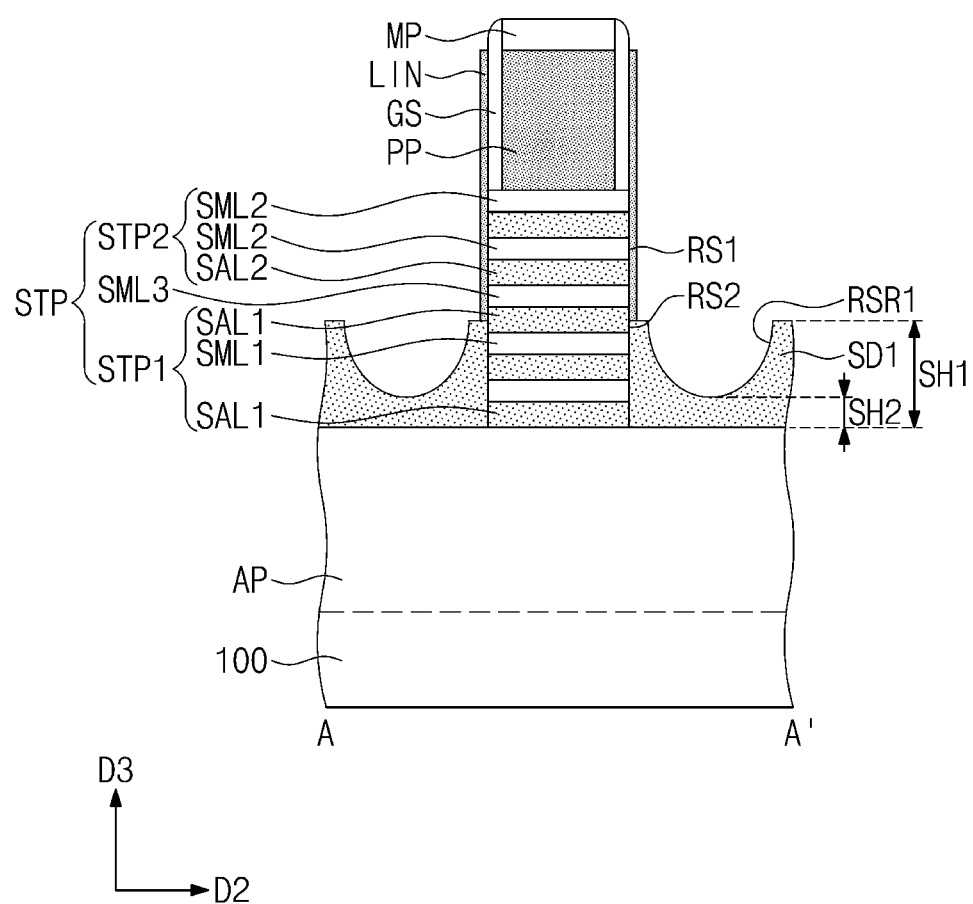
Figure 10B:
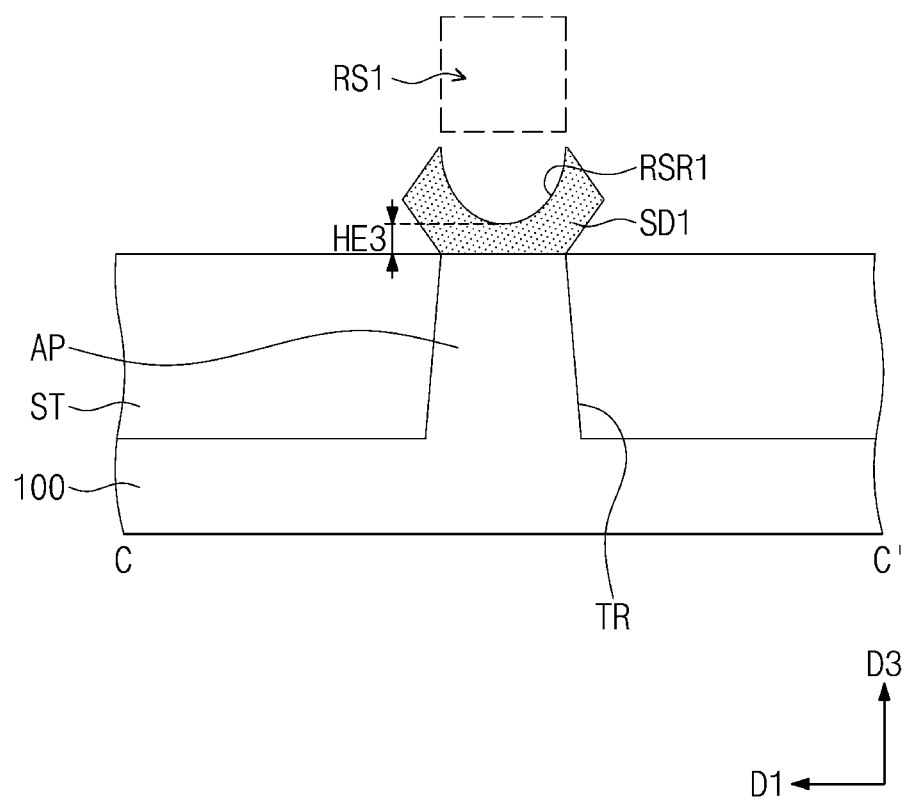

Referring to FIGS. 10A and 10B, a selective etching process may be performed on at least one of the lower source/drain patterns SD1 to recess an upper portion of at least one of the lower source/drain patterns SD1. As a result of the etching process, the first recessed region RSR1 may be formed in an upper portion of the lower source/drain pattern SD1. The etching process may include a wet etching process and/or a dry etching process which is performed to selectively etch only the lower source/drain pattern SD1.

During the etching process, the center portion of the lower source/drain pattern SD1 may be largely etched, and the side portion of the lower source/drain pattern SD1 may be minimally etched. The side portion of the lower source/drain pattern SD1 may be a portion that is connected to the first and second semiconductor patterns SP1 and SP2. After the etching process, a top surface of the side portion of the lower source/drain pattern SD1 may be in contact with the liner layer LIN.

After the etching process, the side portion of the lower source/drain pattern SD1 may have a first thickness SH1. The center portion of the lower source/drain pattern SD1 may have a second thickness SH2. The second thickness SH2 may be smaller than the first thickness SH1. A volume of the lower source/drain pattern SD1 may be reduced by the etching process (e.g., compare FIGS. 9B and 10B).

Figure 11A:
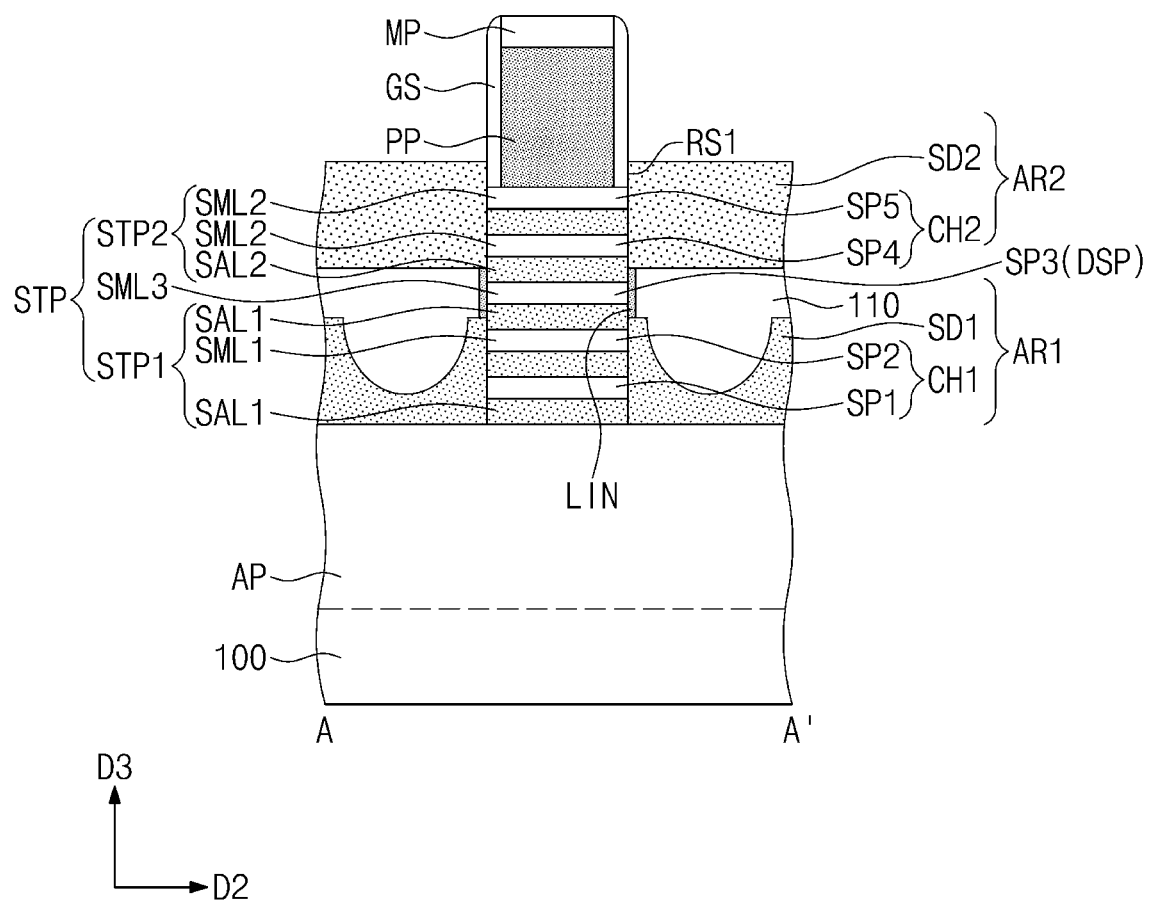
Figure 11B:
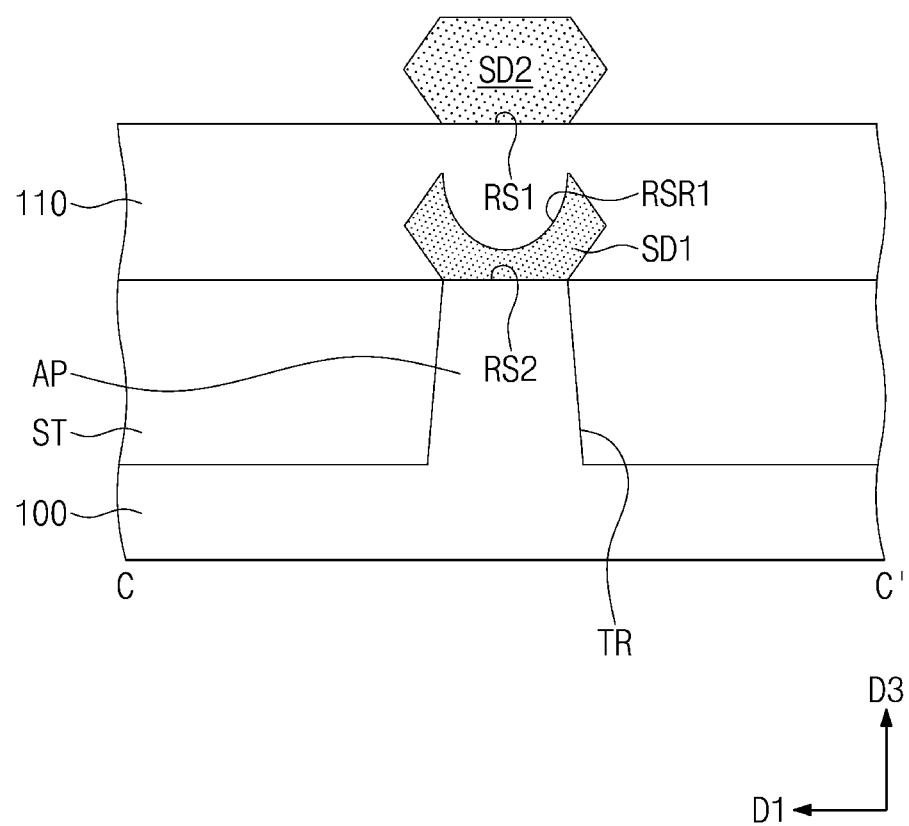

Referring to FIGS. 11A and 11B, the first interlayer insulating layer 110 may be formed to cover the lower source/drain patterns SD1. The first interlayer insulating layer 110 may be recessed such that a top surface thereof is located at a level lower than a bottom surface of the lowermost one of the second semiconductor layers SML2 of the upper stacking pattern STP2.

A portion of the liner layer LIN exposed by the first recess RS1 may be removed. A portion of the liner layer LIN, which is covered with the first interlayer insulating layer 110, may remain on a side surface of the third semiconductor layer SML3. Because the liner layer LIN is partially removed, the second semiconductor layers SML2 may be exposed through the first recess RS1.

The upper source/drain patterns SD2 may be formed in the first recesses RS1, respectively. In detail, the upper source/drain pattern SD2 may be formed by a second SEG process using an inner side surface of the first recess RS1 as a seed layer. The upper source/drain pattern SD2 may be grown using the second semiconductor layers SML2, which are exposed by the first recess RS1, as a seed layer. The upper source/drain patterns SD2 may be doped to have a second conductivity type (e.g., p-type) that is different from the first conductivity type.

The second semiconductor layers SML2, which are interposed between a pair of the upper source/drain patterns SD2, may constitute the upper channel pattern CH2. That is, the fourth and fifth semiconductor patterns SP4 and SP5 of the upper channel pattern CH2 may be respectively formed from the second semiconductor layers SML2. The upper channel pattern CH2 and a pair of the upper source/drain patterns SD2 at both sides thereof may constitute the second active region AR2, which is the top tier of the three-dimensional device.

The third semiconductor pattern SP3 of the dummy channel pattern DSP may be formed from the third semiconductor layer SML3, which has opposite ends covered with the liner layer LIN. The third semiconductor pattern SP3 may be a dummy channel pattern which is not connected to any of the lower and upper source/drain patterns SD1 and SD2.

Figure 12A:
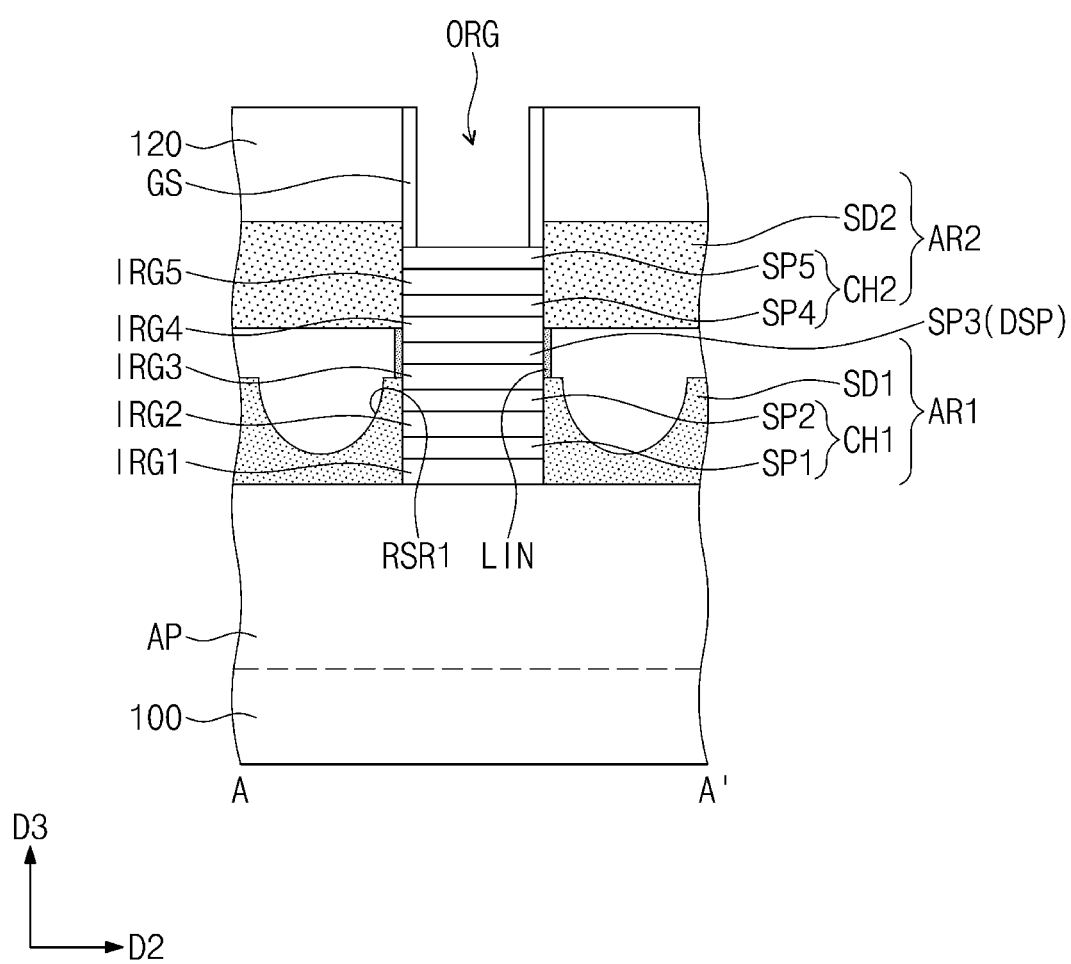
Figure 12B:
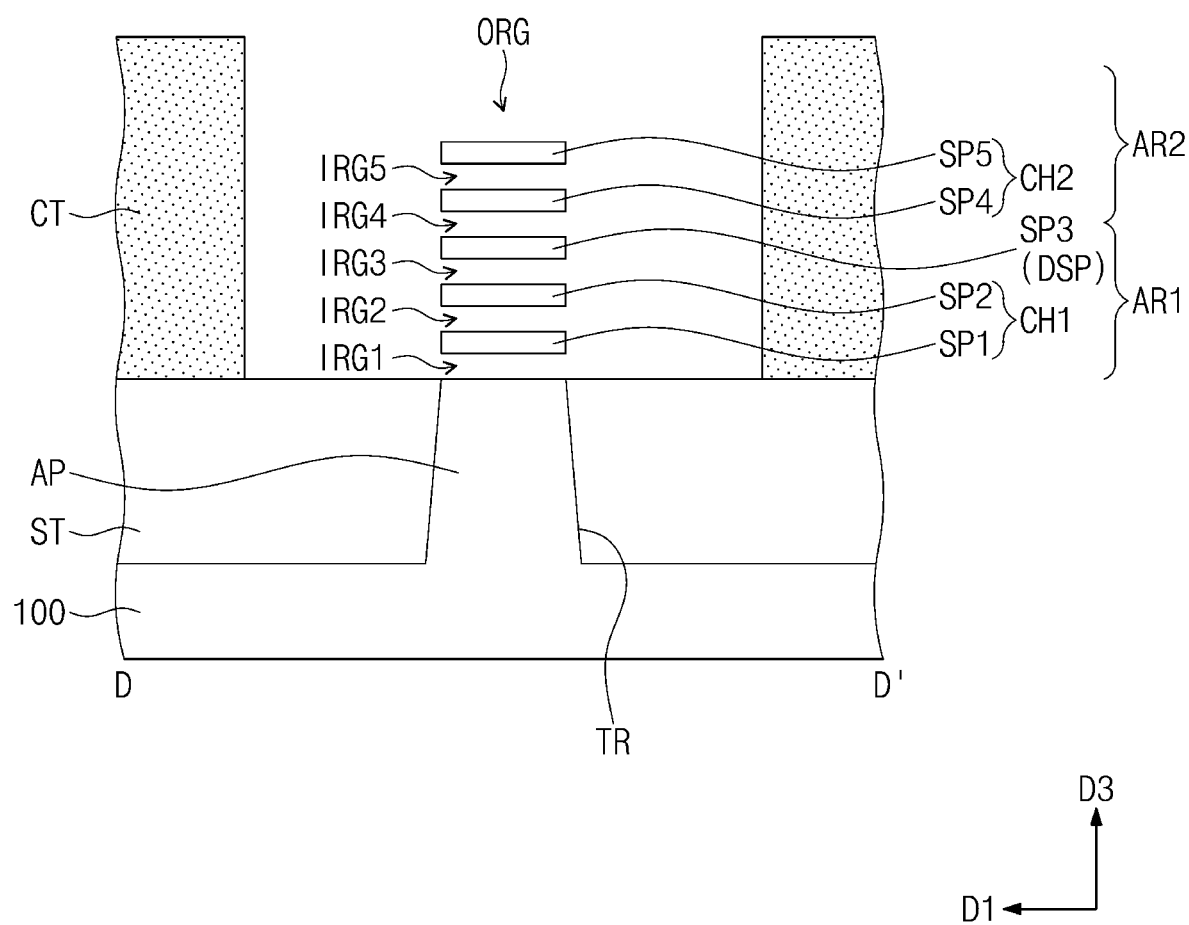

Referring to FIGS. 12A and 12B, the second interlayer insulating layer 120 may be formed to cover the hard mask patterns MP, the gate spacers GS, and the upper source/drain patterns SD2. As an example, the second interlayer insulating layer 120 may include a silicon oxide layer.

The second interlayer insulating layer 120 may be planarized until the top surfaces of the sacrificial patterns PP are exposed. The planarization of the third interlayer insulating layer 130 may be performed by an etch-back or chemical mechanical polishing (CMP) process. All of the hard mask patterns MP may be removed during the planarization process. As a result, a top surface of the third interlayer insulating layer 130 may be coplanar with the top surfaces of the sacrificial patterns PP and the top surfaces of the gate spacers GS.

The gate cutting pattern CT may be formed to penetrate the sacrificial pattern PP. The gate cutting patterns CT may be formed on the first and second cell boundaries CB1 and CB2 of the logic cell LC (e.g., see FIG. 3). The gate cutting patterns CT may include a silicon oxide layer and/or a silicon nitride layer.

The exposed sacrificial patterns PP may be selectively removed. Because the sacrificial patterns PP are removed, an outer region ORG may be formed to expose the lower and upper channel patterns CH1 and CH2 (e.g., see FIG. 12B). The removal of the sacrificial patterns PP may include a wet etching process which is performed using an etching solution capable of selectively etching polysilicon.

The first and second sacrificial layers SAL1 and SAL2, which are exposed through the outer region ORG, may be selectively removed to form the first to fifth inner regions IRG1 to IRG5, respectively (e.g., see FIG. 12B). In detail, an etching process may be performed to leave the first to fifth semiconductor patterns SP1 to SP5 and to remove only the first and second sacrificial layers SAL1 and SAL2. The etching process may have a high etch rate with respect to silicon germanium having a relatively high germanium concentration. For example, the etching process may have a high etch rate with respect to silicon germanium having a germanium concentration higher than 10 at %.

Because the first and second sacrificial layers SAL1 and SAL2 are selectively removed, the first and second semiconductor patterns SP1 and SP2 may be left on the first active region AR1, and the fourth and fifth semiconductor patterns SP4 and SP5 may be left on the second active region AR2. The dummy channel pattern DSP including the third semiconductor pattern SP3 may be left between the second semiconductor pattern SP2 and the fourth semiconductor pattern SP4.

An empty space between the active pattern AP and the first semiconductor pattern SP1 may be defined as the first inner region IRG1, an empty space between the first and second semiconductor patterns SP1 and SP2 may be defined as the second inner region IRG2, and an empty space between the second and third semiconductor patterns SP2 and SP3 may be defined as the third inner region IRG3. An empty space between the third and fourth semiconductor patterns SP3 and SP4 may be defined as the fourth inner region IRG4, and an empty space between the fourth and fifth semiconductor patterns SP4 and SP5 may be defined as the fifth inner region IRG5.

Figure 13A:
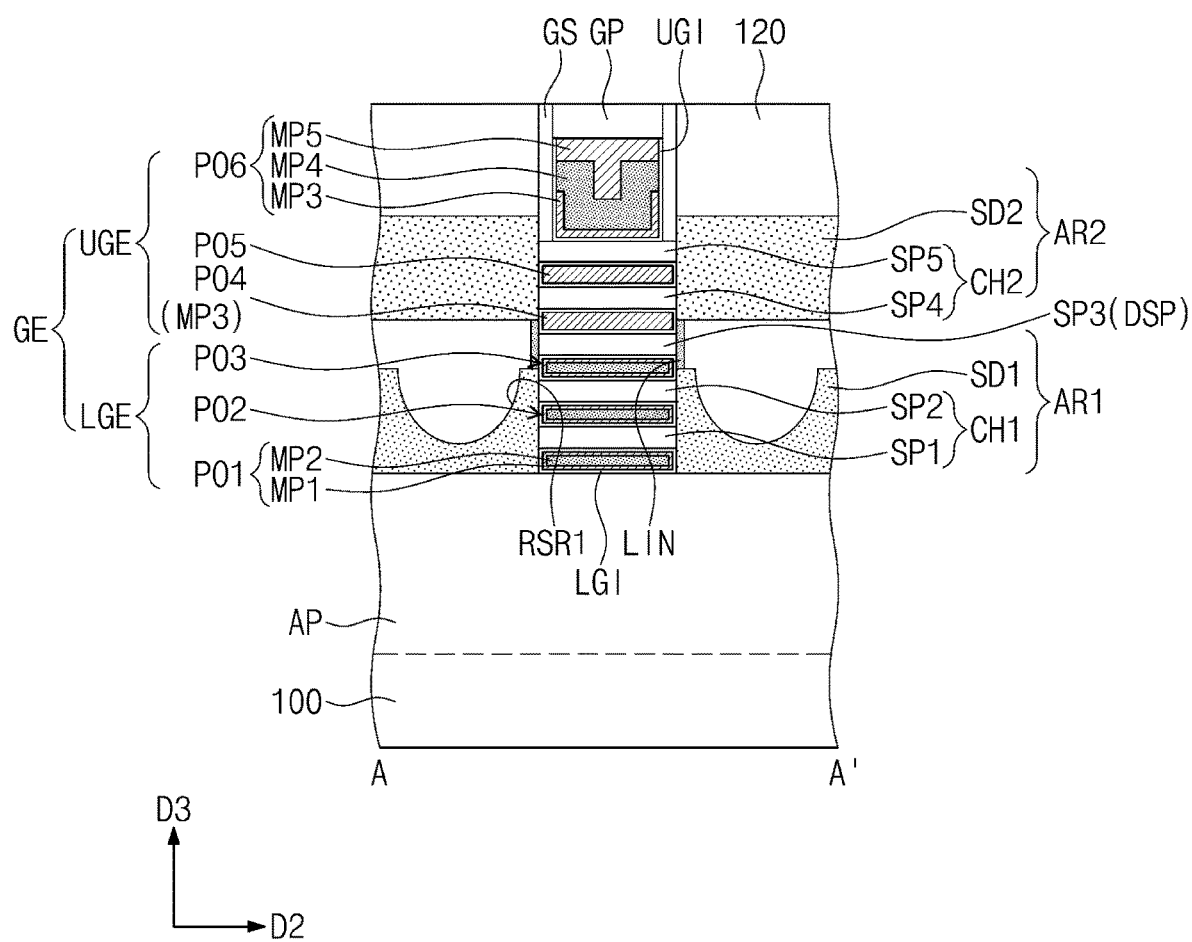
Figure 13B:
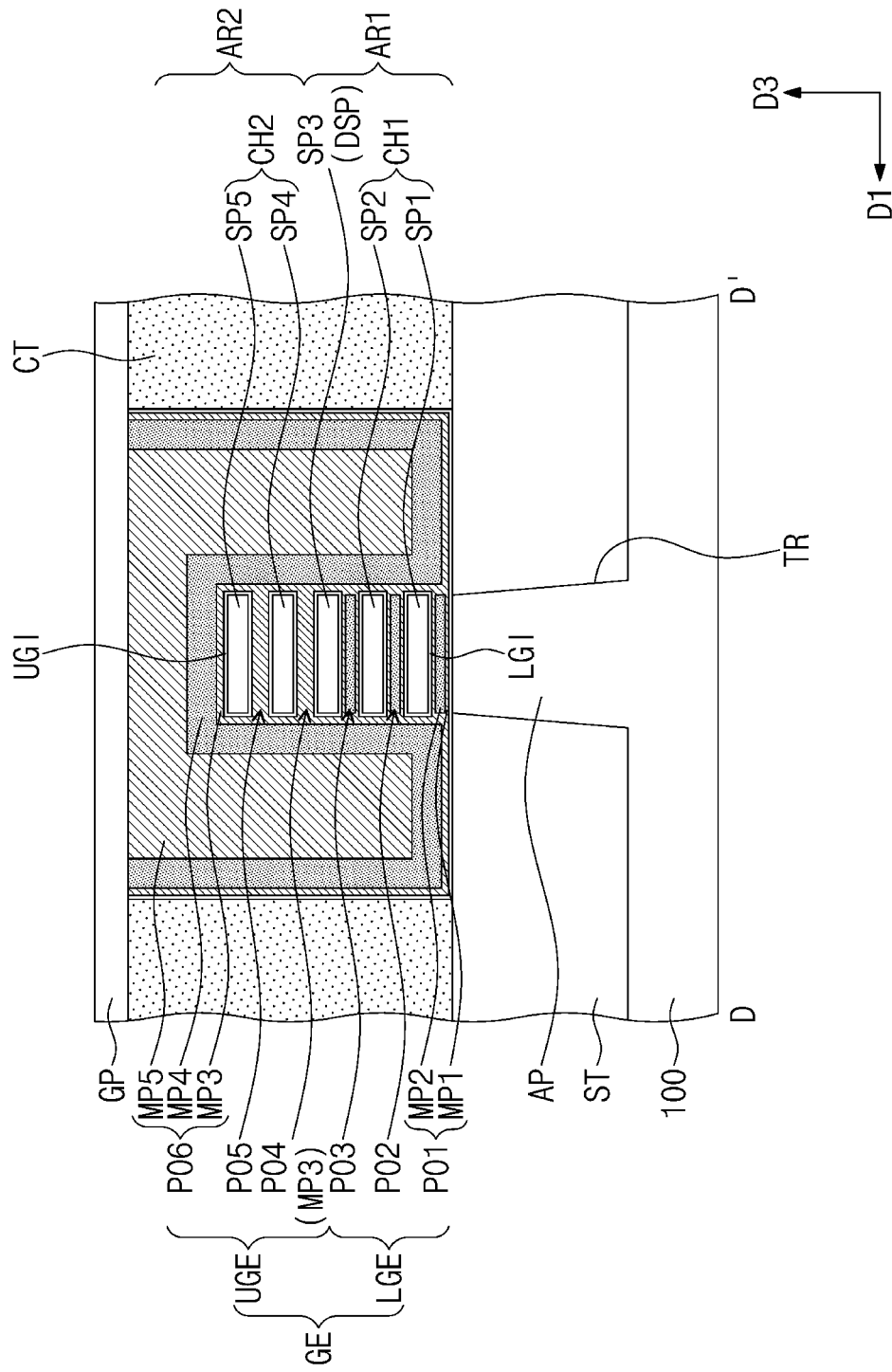

Referring to FIGS. 13A and 13B, the upper gate insulating layer UGI and the lower gate insulating layer LGI may be conformally formed to cover exposed surfaces of the first to fifth semiconductor patterns SP1 to SP5. In detail, the lower gate insulating layer LGI may be formed on the first and second semiconductor patterns SP1 and SP2, and the upper gate insulating layer UGI may be formed on the fourth and fifth semiconductor patterns SP4 and SP5.

The lower gate electrode LGE may be formed on the lower gate insulating layer LGI. The formation of the lower gate electrode LGE may include forming first to third portions PO1, PO2, and PO3 in the first to third inner regions IRG1, IRG2, and IRG3, respectively.

The upper gate electrode UGE may be formed on the upper gate insulating layer UGI. The formation of the upper gate electrode UGE may include forming the fourth and fifth portions PO4 and PO5 in the fourth and fifth inner regions IRG4 and IRG5, respectively, and forming the sixth portion PO6 in the outer region ORG. The lower gate electrode LGE and the upper gate electrode UGE may be connected to each other to form a single gate electrode GE.

The gate electrode GE may be recessed to have a reduced height. The gate capping pattern GP may be formed on the recessed gate electrode GE. A planarization process may be performed on the gate capping pattern GP such that the gate capping pattern GP has a top surface coplanar with a top surface of the second interlayer insulating layer 120.

Referring back to FIG. 3 and FIGS. 4A to 4D, the third interlayer insulating layer 130 may be formed on the second interlayer insulating layer 120. The first active contact AC1 may be formed to penetrate the first to third interlayer insulating layers 110, 120, and 130 and to be coupled to the lower source/drain pattern SD1. The second active contact AC2 may be formed to penetrate the second and third interlayer insulating layers 120 and 130 and to be coupled to the upper source/drain pattern SD2. The third active contact AC3 may be formed to penetrate the first to third interlayer insulating layers 110, 120, and 130 and may be connected in common to the lower and upper source/drain patterns SD1 and SD2, which overlap each other. The gate contact GC may be formed to penetrate the third interlayer insulating layer 130 and the gate capping pattern GP and to be coupled to the gate electrode GE.

The fourth interlayer insulating layer 140 may be formed on the third interlayer insulating layer 130. The first metal layer M1 may be formed in the fourth interlayer insulating layer 140. The formation of the first metal layer M1 may include forming the first and second power lines POR1 and POR2 and the first and second interconnection lines MI1 and MI2 in an upper portion of the fourth interlayer insulating layer 140.

The via VI may be formed below each of the first and second power lines POR1 and POR2 and the first and second interconnection lines MI1 and MI2. The first to third active contacts AC1, AC2, and AC3 and the gate contacts GC may be electrically connected to the first metal layer M1 through the vias VI.

As an example, the vias VI may be formed before forming the first and second power lines POR1 and POR2 and the first and second interconnection lines MI1 and MI2. As another example, the vias VI, along with the first and second power lines POR1 and POR2 and the first and second interconnection lines MI1 and MI2, may be formed by a dual damascene process.

Additional metal layers (e.g., M2, M3, M4, and so forth) may be formed on the first metal layer M1. The first metal layer M1 and the metal layers (e.g., M2, M3, M4, and so forth) on the first metal layer M1 may constitute the BEOL layer of the semiconductor device.

FIGS. 14 to 19 are sectional views illustrating a method of forming a gate electrode according to an embodiment and corresponding to the line D-D' of FIG. 3.

Figure 14:
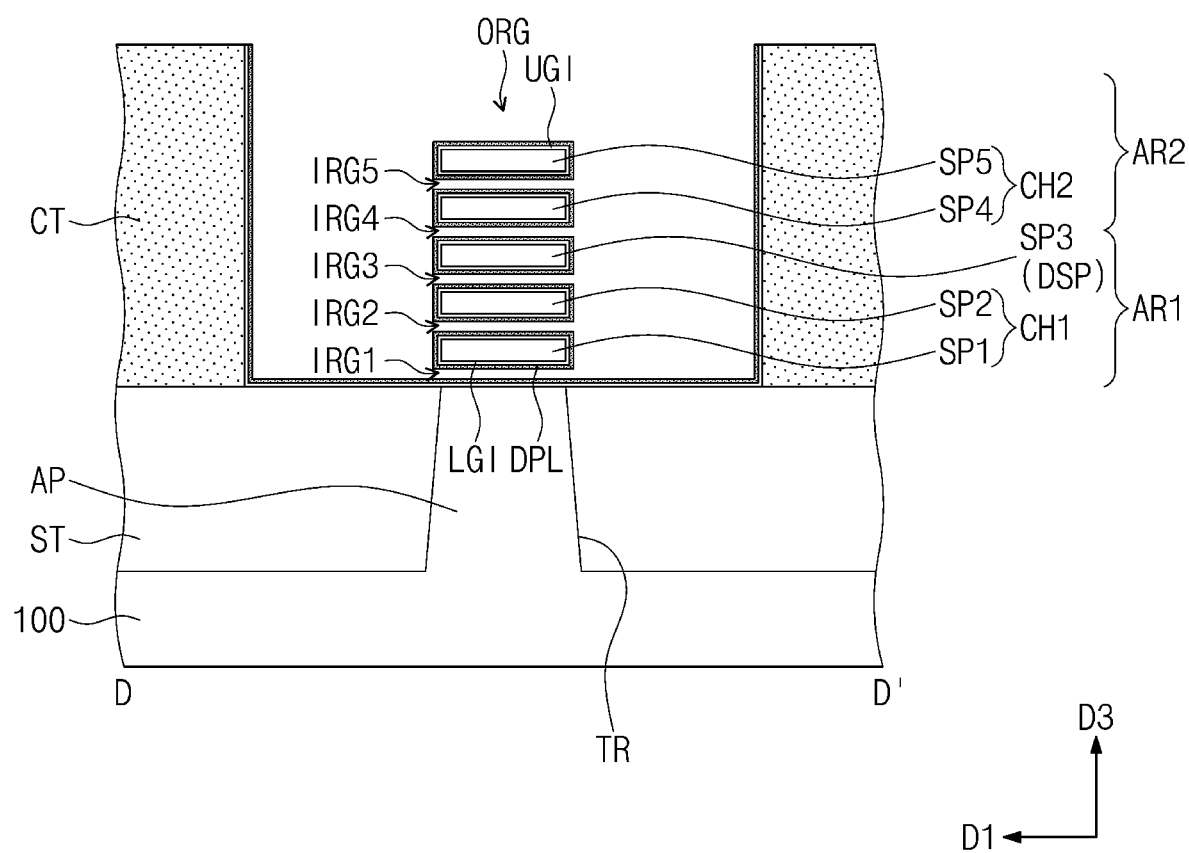
FIGS. 14 to 19 are sectional views corresponding to the line D-D' of FIG. 3 illustrating a method of forming a gate electrode according to an embodiment.

Referring to FIG. 14, the upper gate insulating layer UGI and the lower gate insulating layer LGI may be conformally formed on the structure of FIG. 12B. The lower gate insulating layer LGI may be formed on the first to third semiconductor patterns SP1, SP2, and SP3 and the upper gate insulating layer UGI may be formed on the fourth and fifth semiconductor patterns SP4 and SP5.

The formation of the lower and upper gate insulating layers LGI and UGI may include forming a silicon oxide layer on the first to fifth semiconductor patterns SP1 to SP5 and forming a high-k dielectric layer on the silicon oxide layer.

A dipole-containing layer DPL may be conformally formed on the lower and upper gate insulating layers LGI and UGI. The dipole-containing layer DPL may contain a dipole element. The dipole element may contain lanthanum (La), aluminum (Al), or combinations thereof. In this regard, the dipole-containing layer DPL may include a lanthanum oxide layer, an aluminum oxide layer, or combinations thereof.

Figure 15:
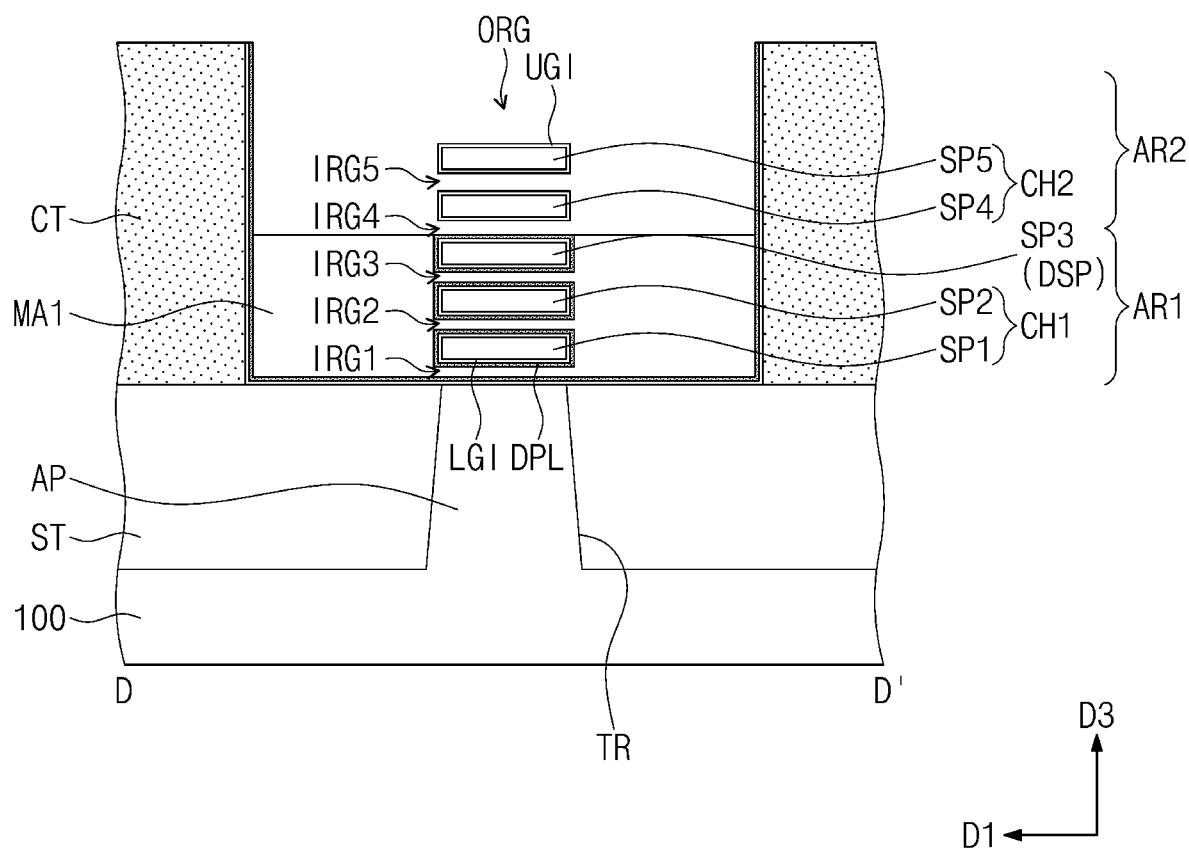

Referring to FIG. 15, a first mask layer MA1 may be formed to cover the lower gate insulating layer LGI and to expose the upper gate insulating layer UGI. In detail, the first mask layer MA1 may be formed to cover the lower channel pattern CH1, the dummy channel pattern DSP, and the upper channel pattern CH2. The first mask layer MA1 may fill the first to fifth inner regions IRG1-IRG5. For example, the first mask layer MA1 may be formed of or include at least one of organic polymer materials.

The first mask layer MA1 may be selectively recessed such that a top surface of the first mask layer MA1 is located at a level similar to a top surface of the third semiconductor pattern SP3. Because the first mask layer MA1 is recessed, the fourth and fifth inner regions IRG4 and IRG5 may be exposed to the outside. Because the first mask layer MA1 is recessed, the dipole-containing layer DPL covering the upper gate insulating layer UGI may be exposed.

The exposed dipole-containing layer DPL on the upper gate insulating layer UGI may be selectively removed using the first mask layer MA1 as an etch mask. Accordingly, the dipole-containing layer DPL may be selectively left on only the lower gate insulating layer LGI, not the upper gate insulating layer UGI.

Next, the first mask layer MA1 may be removed, and a thermal treatment process may be performed on the dipole-containing layer DPL to diffuse a dipole element in the dipole-containing layer DPL into the lower gate insulating layer LGI. Accordingly, a dipole-interface may be formed between the high-k dielectric layer and the silicon oxide layer of the lower gate insulating layer LGI. The dipole element, which is diffused into the lower gate insulating layer LGI, may cause a change in an effective work function of the lower gate electrode LGE to be formed in a subsequent step.

During the thermal treatment process, the dipole-containing layer DPL may be removed while the dipole element is exhausted from the dipole-containing layer DPL. Because the dipole-containing layer DPL is formed to have a very small thickness that is smaller than 1 nm, the dipole-containing layer DPL may be easily removed.

Figure 16:
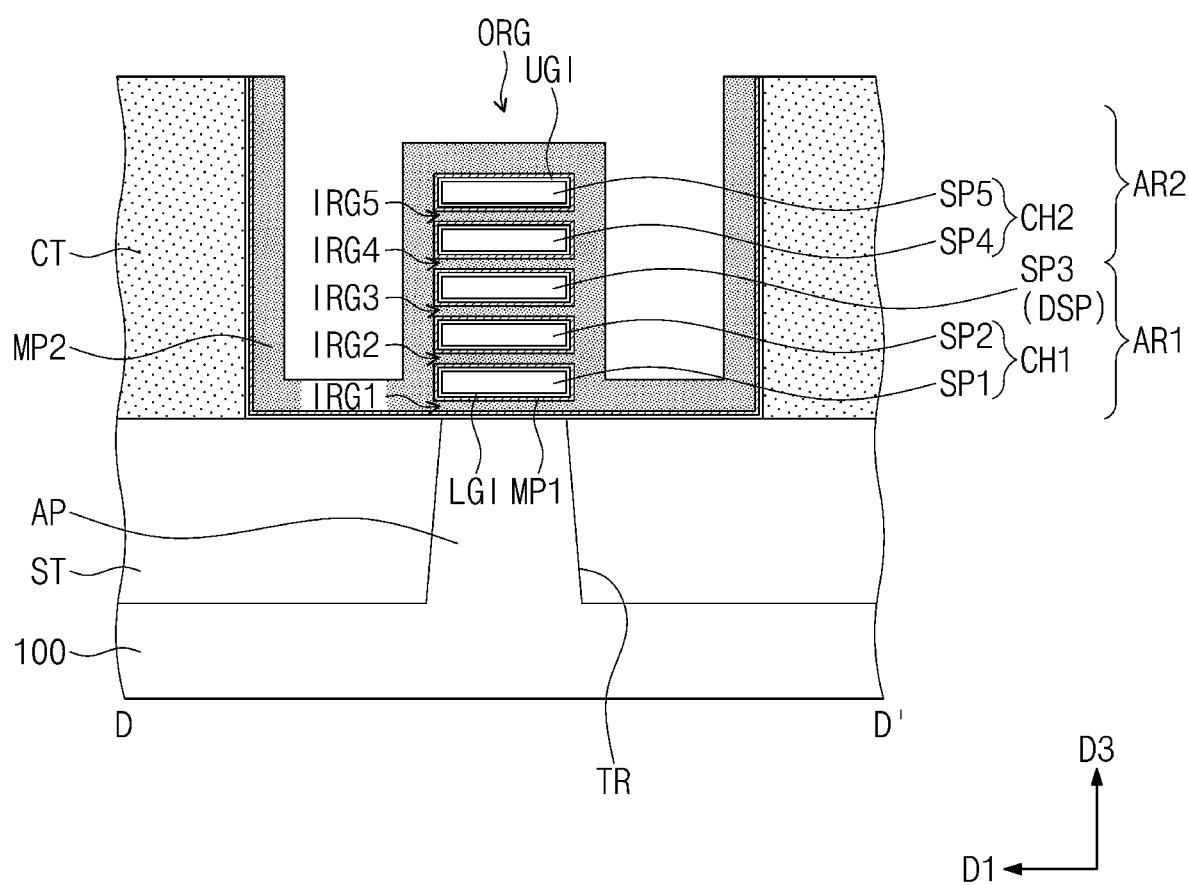

Referring to FIG. 16, the first metal pattern MP1 may be conformally formed on the lower and upper gate insulating layers LGI and UGI. The first metal pattern MP1 may be provided to enclose each of the first to fifth semiconductor patterns SP1 to SP5.

The first metal pattern MP1 may be formed of or include a second work function metal (e.g., a p-type work function metal). The formation of the first metal pattern MP1 may include conformally depositing a metal nitride layer on the lower and upper gate insulating layers LGI and UGI. For example, the first metal pattern MP1 may be formed of or include at least one of titanium nitride (TiN), tantalum nitride (TaN), titanium oxynitride (TiON), titanium silicon nitride (TiSiN), titanium aluminum nitride (TiAlN), tungsten carbon nitride (WCN), or molybdenum nitride (MoN).

The second metal pattern MP2 may be formed on the first metal pattern MP1. The second metal pattern MP2 may be formed to fully fill a remaining portion of the first to fifth inner regions IRG1-IRG5. The second metal pattern MP2 may be formed in the outer region ORG.

The second metal pattern MP2 may include a first work function metal (e.g., an n-type work function metal). The formation of the second metal pattern MP2 may include depositing a metal carbide layer, which is doped with silicon and/or aluminum, on the first metal pattern MP1. For example, the second metal pattern MP2 may be formed of or include at least one of aluminum-doped titanium carbide (TiAlC), aluminum-doped tantalum carbide (TaAlC), aluminum-doped vanadium carbide (VAlC), silicon-doped titanium carbide (TiSiC), or silicon-doped tantalum carbide (TaSiC).

Figure 17:
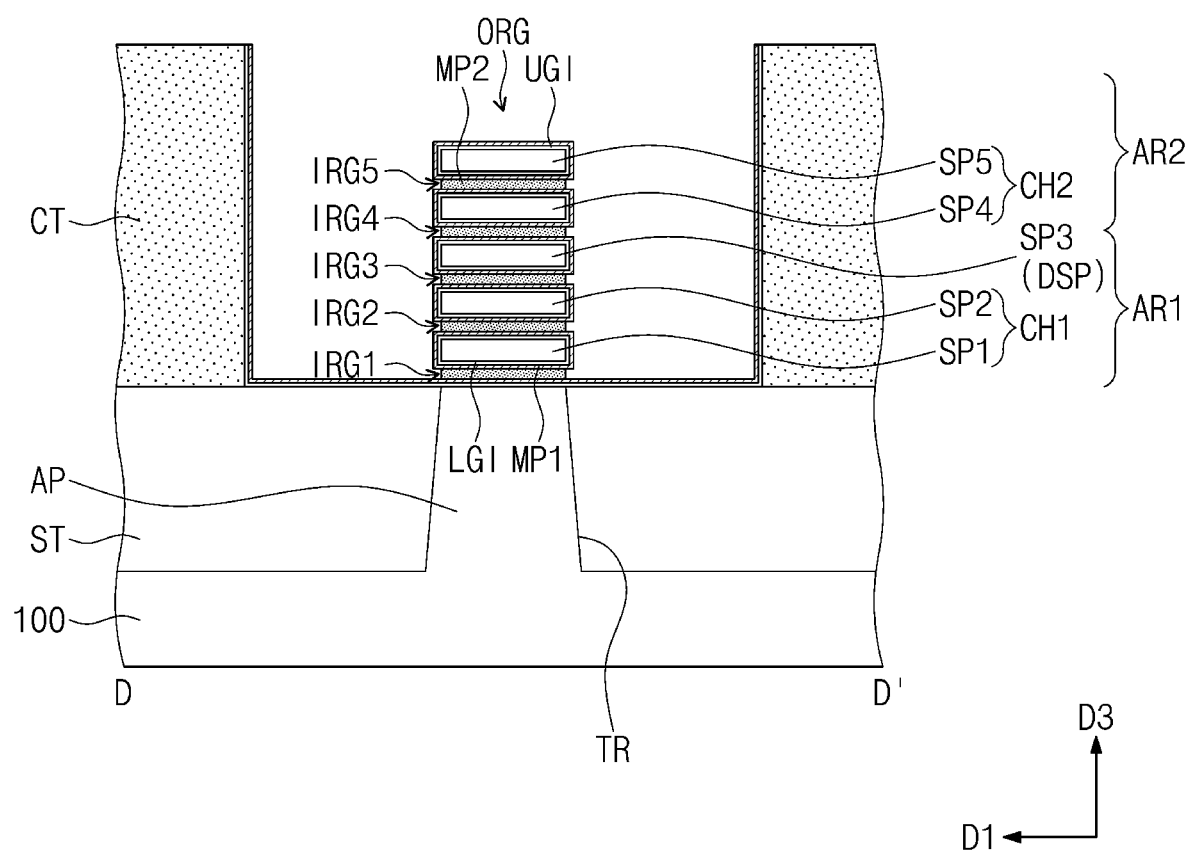

Referring to FIG. 17, an etching process on the second metal pattern MP2 may be performed to remove the second metal pattern MP2 from the outer region ORG. The etching process may include a wet etching process of removing only the second metal pattern MP2 selectively. A portion of the second metal pattern MP2 may be removed from the outer region ORG, and other portions of the second metal pattern MP2 may be left in the first to fifth inner regions IRG1-IRG5.

Figure 18:
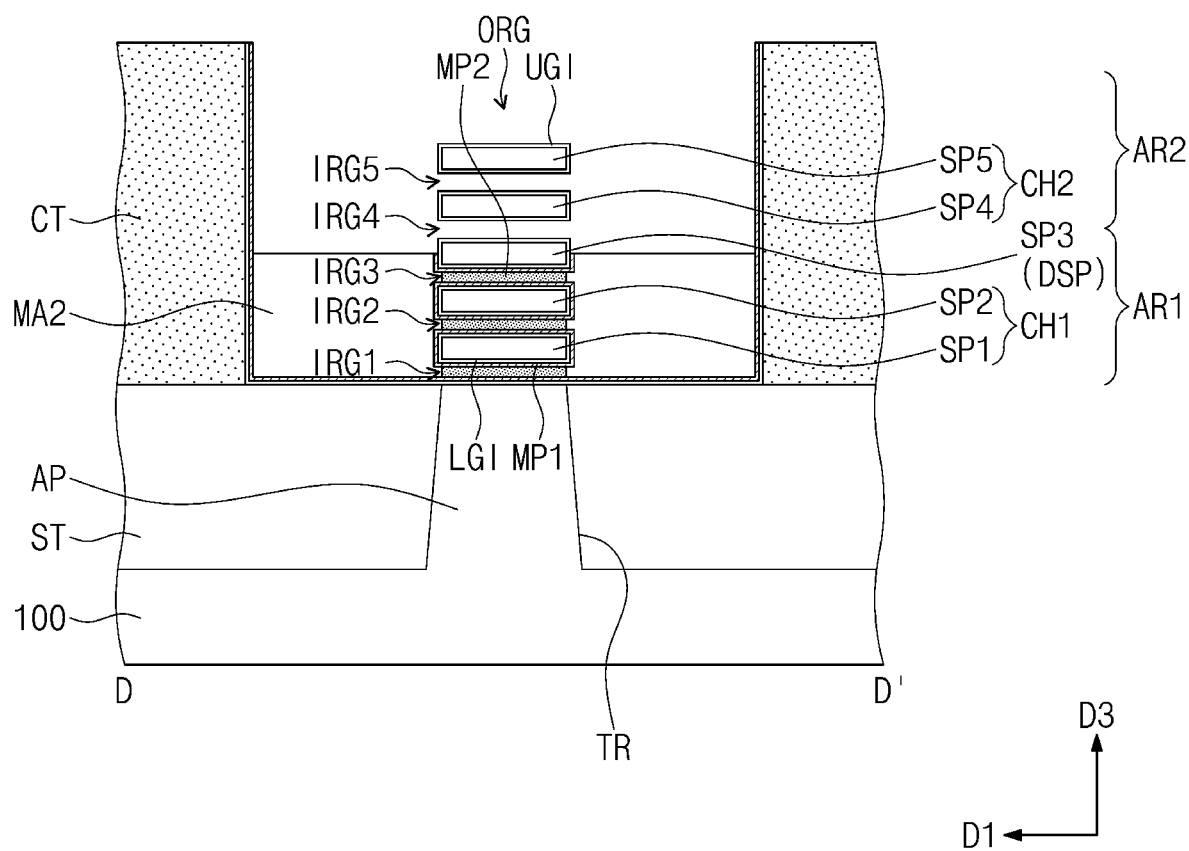

Referring to FIG. 18, a second mask layer MA2 may be formed in the outer region ORG. The second mask layer MA2 may be recessed such that a top surface of the second mask layer MA2 is located at a level similar to the third semiconductor pattern SP3 serving as the dummy channel pattern DSP. For example, the top surface of the second mask layer MA2 may be located at a level between top and bottom surfaces of the third semiconductor pattern SP3.

All of exposed portions of the first and second metal patterns MP1 and MP2 may be removed using the second mask layer MA2 as an etch mask. Accordingly, the fourth and fifth inner regions IRG4 and IRG5 may be exposed. The upper gate insulating layer UGI in the fourth and fifth inner regions IRG4 and IRG5 may be again exposed to the outside.

The first and second metal patterns MP1 and MP2, which are left below the top surface of the second mask layer MA2, may form the lower gate electrode LGE. The lower gate electrode LGE may include the first to third portions PO1, PO2, and PO3, which are respectively formed in the first to third inner regions IRG1, IRG2, and IRG3. Each of the first to third portions PO1, PO2, and PO3 may include the first metal pattern MP1 and the second metal pattern MP2.

Figure 19:
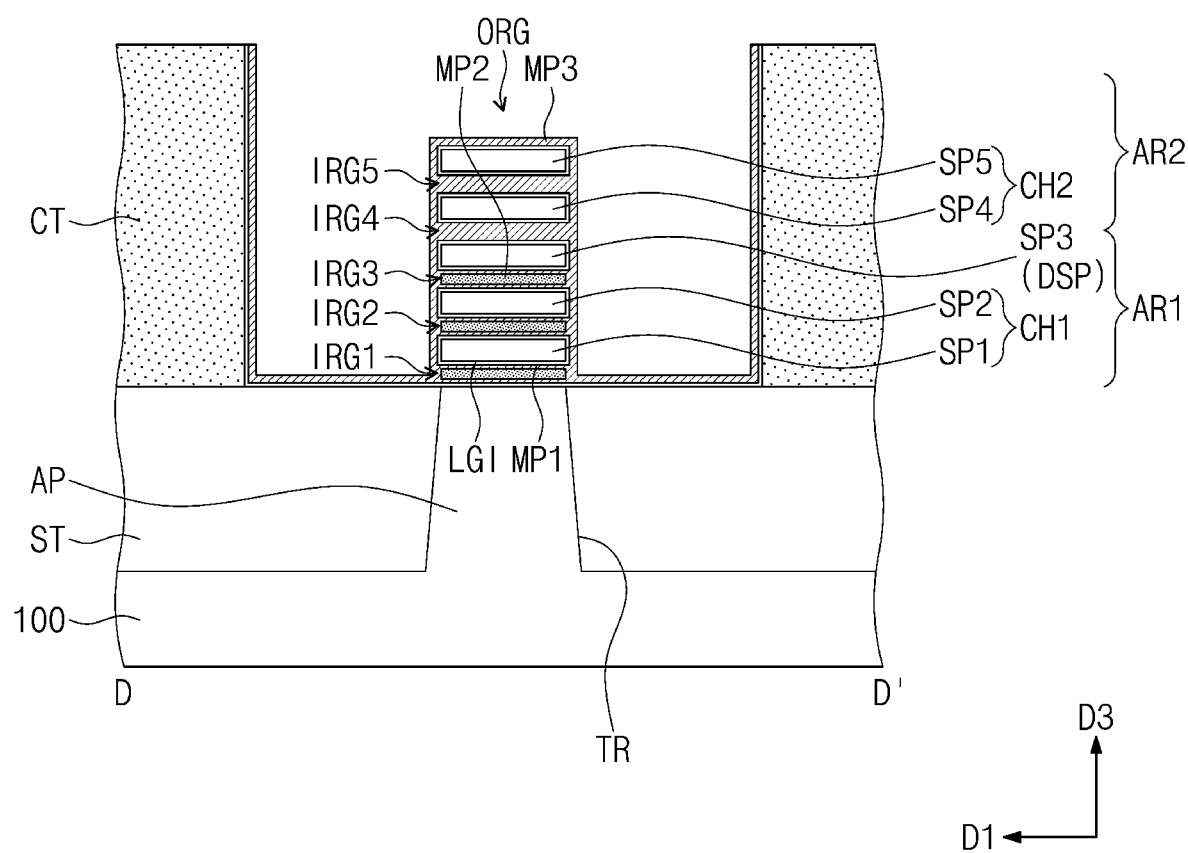

Referring to FIG. 19, the third metal pattern MP3 may be formed on the upper gate insulating layer UGI. The third metal pattern MP3 may be formed to have a thickness that is large enough to fully fill the fourth and fifth inner regions IRG4 and IRG5. For example, the third metal pattern MP3 may be the second work function metal and may be formed of or include the same metal nitride layer as the first metal pattern MP1. Accordingly, the third metal pattern MP3, along with the first metal pattern MP1, may constitute a single metal nitride layer.

Referring back to FIG. 13B, the fourth metal pattern MP4 may be formed on the third metal pattern MP3 to partially fill the outer region ORG. The fourth metal pattern MP4 may be the first work function metal and may be formed of or include a metal carbide, which is the same as or different from the second metal pattern MP2.

The fifth metal pattern MP5 may be formed on the fourth metal pattern MP4 to fill a remaining portion of the outer region ORG. The fifth metal pattern MP5 may include the second work function metal (e.g., titanium nitride) or the low resistance metal (e.g., tungsten).

Because the third to fifth metal patterns MP3 to MP5 are formed on the upper gate insulating layer UGI, the upper gate electrode UGE may be formed. The upper gate electrode UGE may include the fourth and fifth portions PO4 and PO5, which are included in the fourth and fifth inner regions IRG4 and IRG5, respectively. Each of the fourth and fifth portions PO4 and PO5 may include the third metal pattern MP3. The upper gate electrode UGE may further include the sixth portion PO6 formed in the outer region ORG. The sixth portion PO6 may include the third to fifth metal patterns MP3, MP4, and MP5, which are sequentially stacked.

Figure 20A:
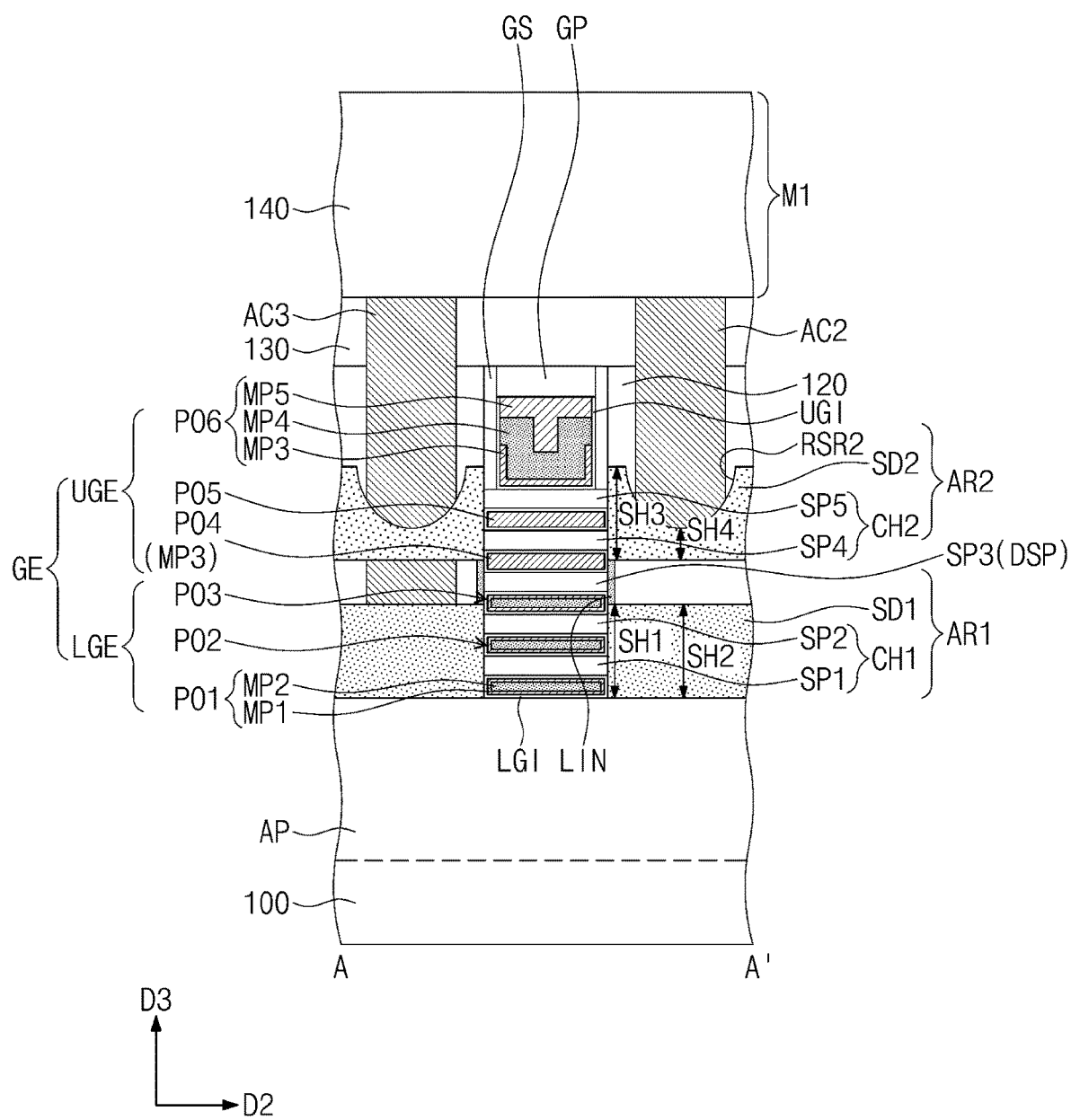
FIGS. 20A and 20B are sectional views, which are respectively taken along the lines A-A' and B-B' of FIG. 3 to illustrate a three-dimensional semiconductor device according to an embodiment.
Figure 20B:
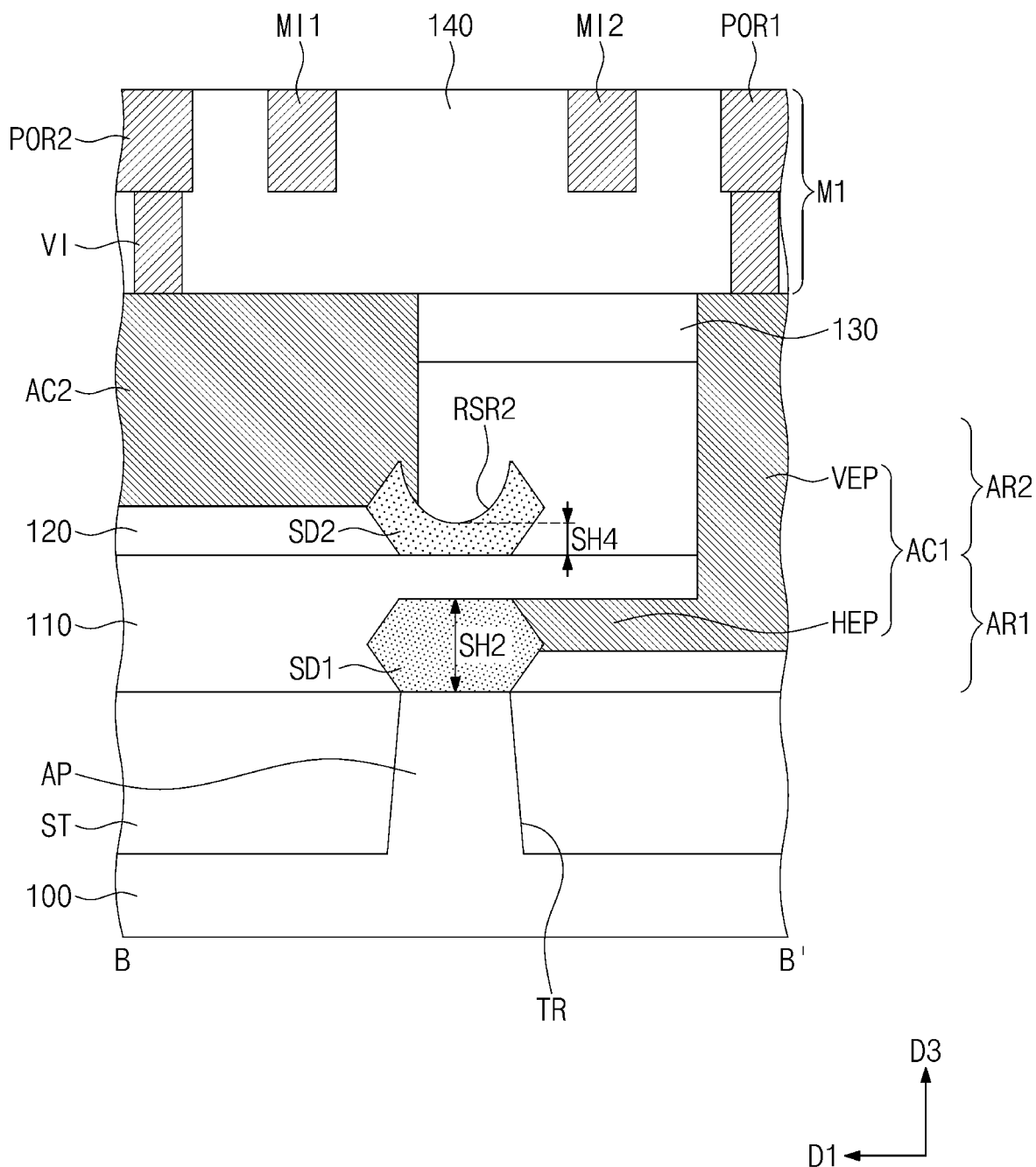

FIGS. 20A and 20B are sectional views, which are respectively taken along the lines A-A' and B-B' of FIG. 3 to illustrate a three-dimensional semiconductor device according to an embodiment. In the following description, an element previously described with reference to FIGS. 3 and 4A to 4D may be identified by the same reference number without repeating an overlapping description thereof, for the sake of brevity.

Referring to FIG. 3 and FIGS. 20A and 20B, in a semiconductor device according to the present embodiment, the upper source/drain pattern SD2 of the transistor (e.g., PFET) of the second active region AR2 may include a second recessed region RSR2. An upper portion of the upper source/drain pattern SD2 may be recessed, and thus, the second recessed region RSR2 may be defined. In an embodiment, the lowermost point of the second recessed region RSR2 may be located at a level between bottom and top surfaces of the fourth semiconductor pattern SP4. By contrast, the first recessed region RSR1 may be omitted from the lower source/drain pattern SD1.

The side portion of the upper source/drain pattern SD2 may have the third thickness SH3. The center portion of the upper source/drain pattern SD2 may have the fourth thickness SH4. The side portion of the upper source/drain pattern SD2 may be a portion that is connected to the fourth and fifth semiconductor patterns SP4 and SP5. The center portion of the upper source/drain pattern SD2 may overlap the bottommost portion of the second recessed region RSR2. The third thickness SH3 may be larger than the fourth thickness SH4.

The first thickness SH1 of the side portion of the lower source/drain pattern SD1 may be substantially equal to the second thickness SH2 of the center portion of the lower source/drain pattern SD1. In addition, the first thickness SH1 may be substantially equal to the third thickness SH3.

A volume of the upper source/drain pattern SD2 may be reduced by the second recessed region RSR2. A contact resistance between the upper source/drain pattern SD2 and the second active contact AC2 may be increased by the second recessed region RSR2. As a result, the transistor of the second active region AR2 may have an increased resistance and a reduced current. By contrast, a current of the transistor of the first active region AR1 may be relatively increased, compared with a current of the transistor of the second active region AR2.

In the three-dimensional semiconductor device according to the present embodiment, it may be possible to adjust the NP ratio (NFET current/PFET current) to a relatively large value. For example, the NP ratio of the semiconductor device according to the present embodiment may be greater than one.

In general, it may be desirable for the NP ratio of a logic cell (LC) to be close to one, but in certain cases, it may be necessary to intentionally increase or decrease the NP ratio of the logic cell LC for optimized design conditions. If the NP ratio should be decreased, the three-dimensional semiconductor device may be formed to have the same structure as the example described with reference to FIGS. 3 and 4A to 4D. If the NP ratio should be increased, the three-dimensional semiconductor device may be formed to have the same structure as the example described with reference to FIGS. 3, 20A, and 20B.

Figure 21A:
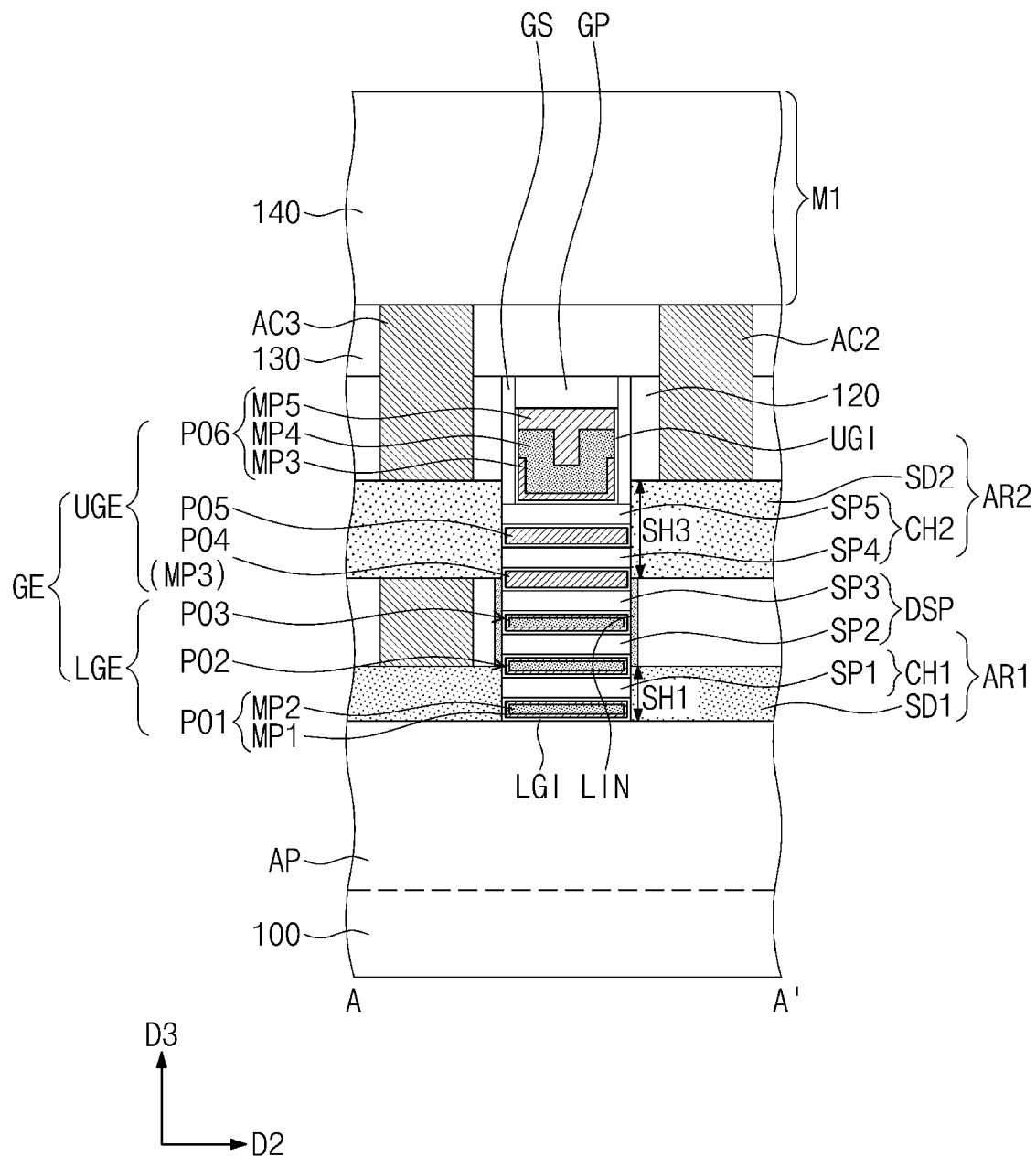
FIGS. 21A, 21B and 21C are sectional views, which are respectively taken along the lines A-A', B-B', and C-C' of FIG. 3 to illustrate a three-dimensional semiconductor device according to an embodiment.
Figure 21B:
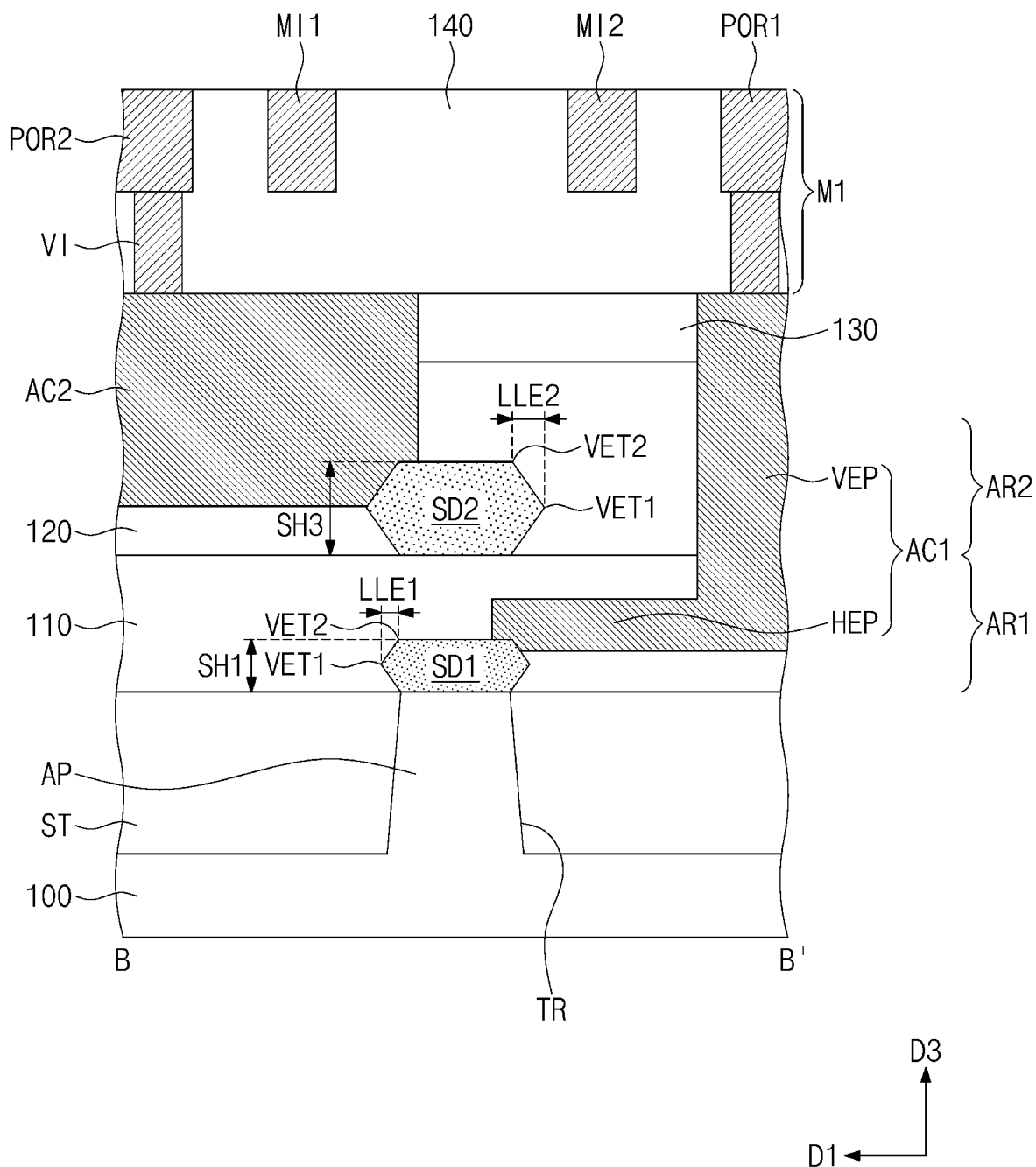
Figure 21C:
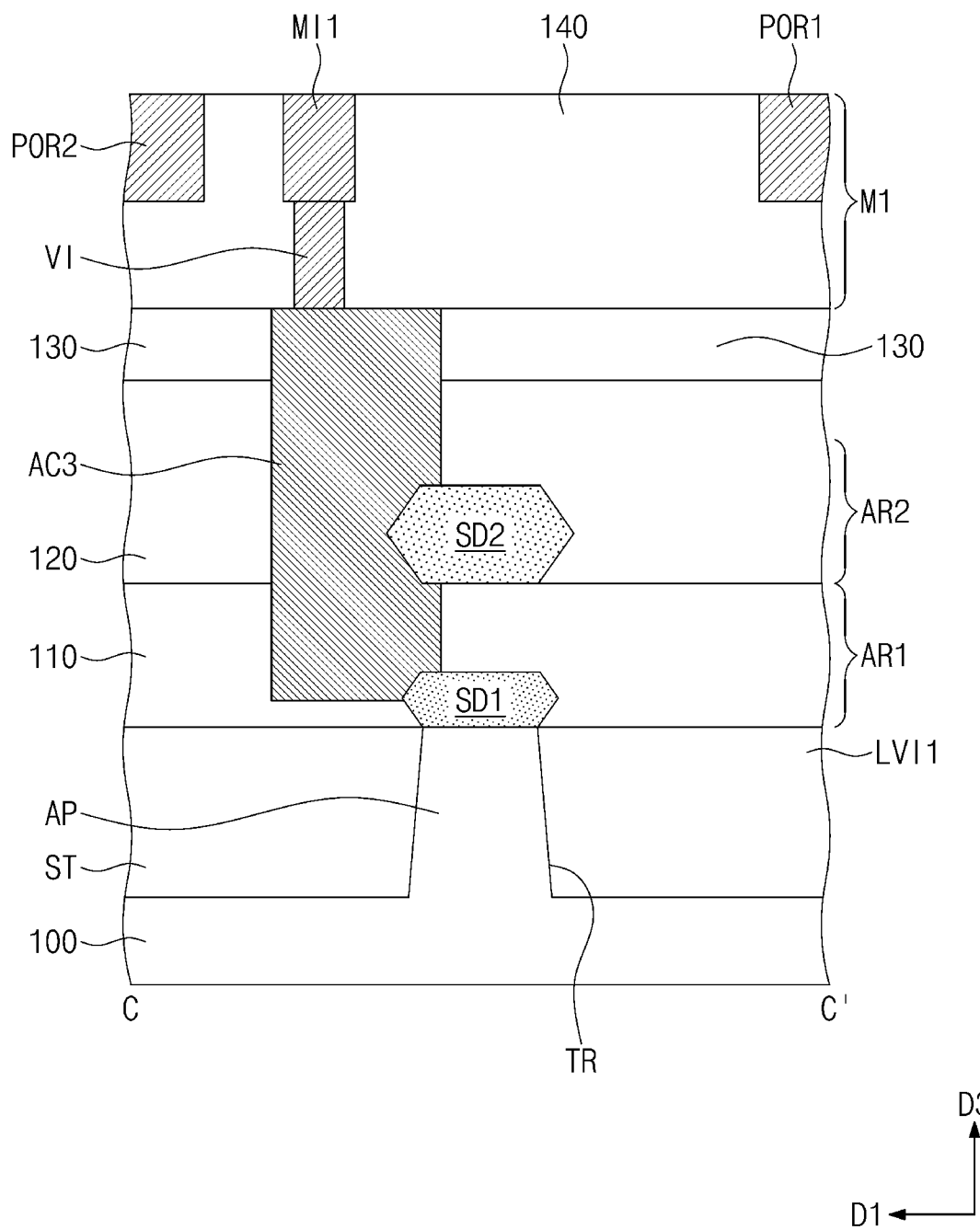
Figure 22A:
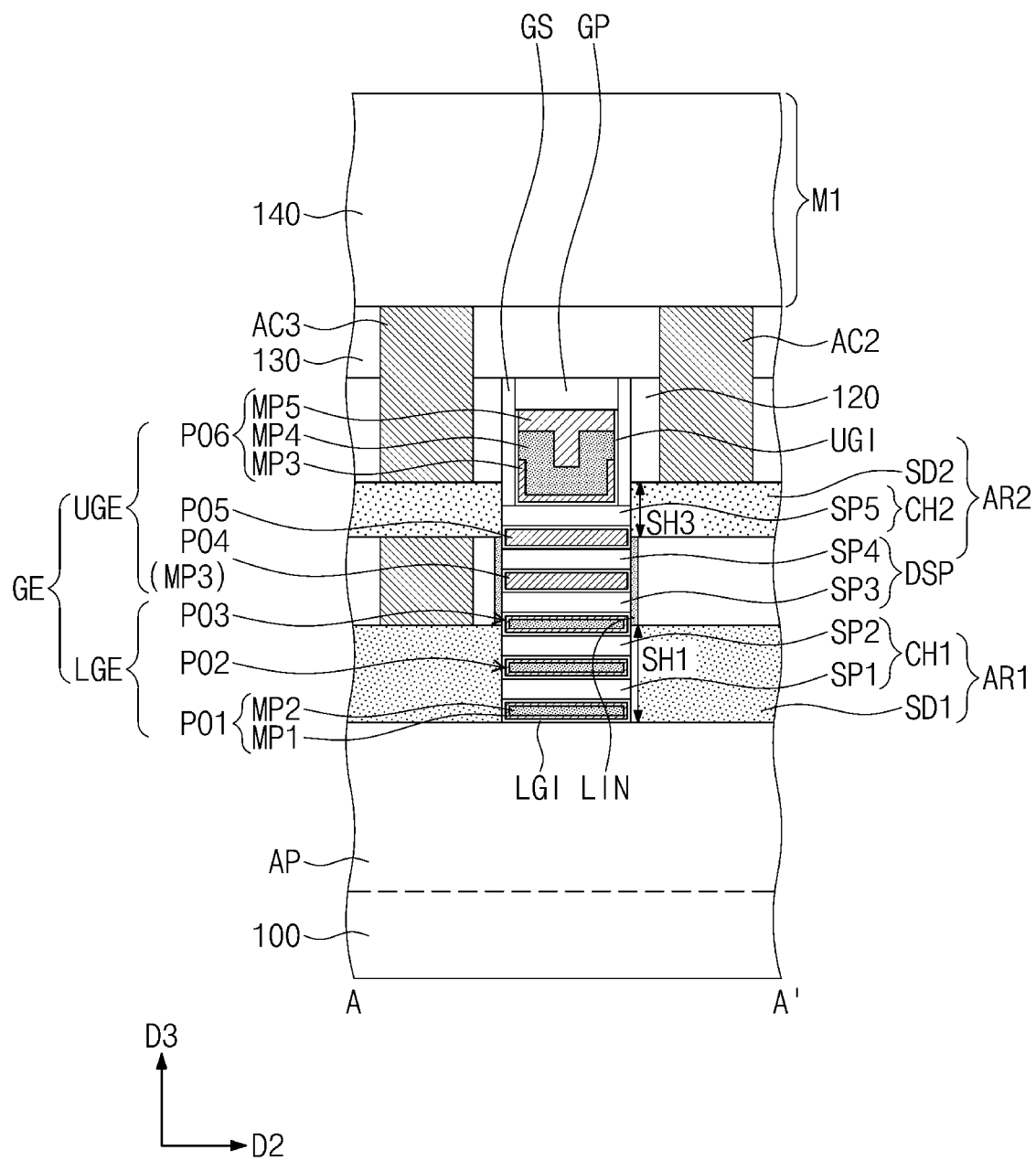
FIGS. 22A, 22B and 22C are sectional views, which are respectively taken along the lines A-A', B-B', and C-C' of FIG. 3 to illustrate a three-dimensional semiconductor device according to another embodiment.
Figure 22B:
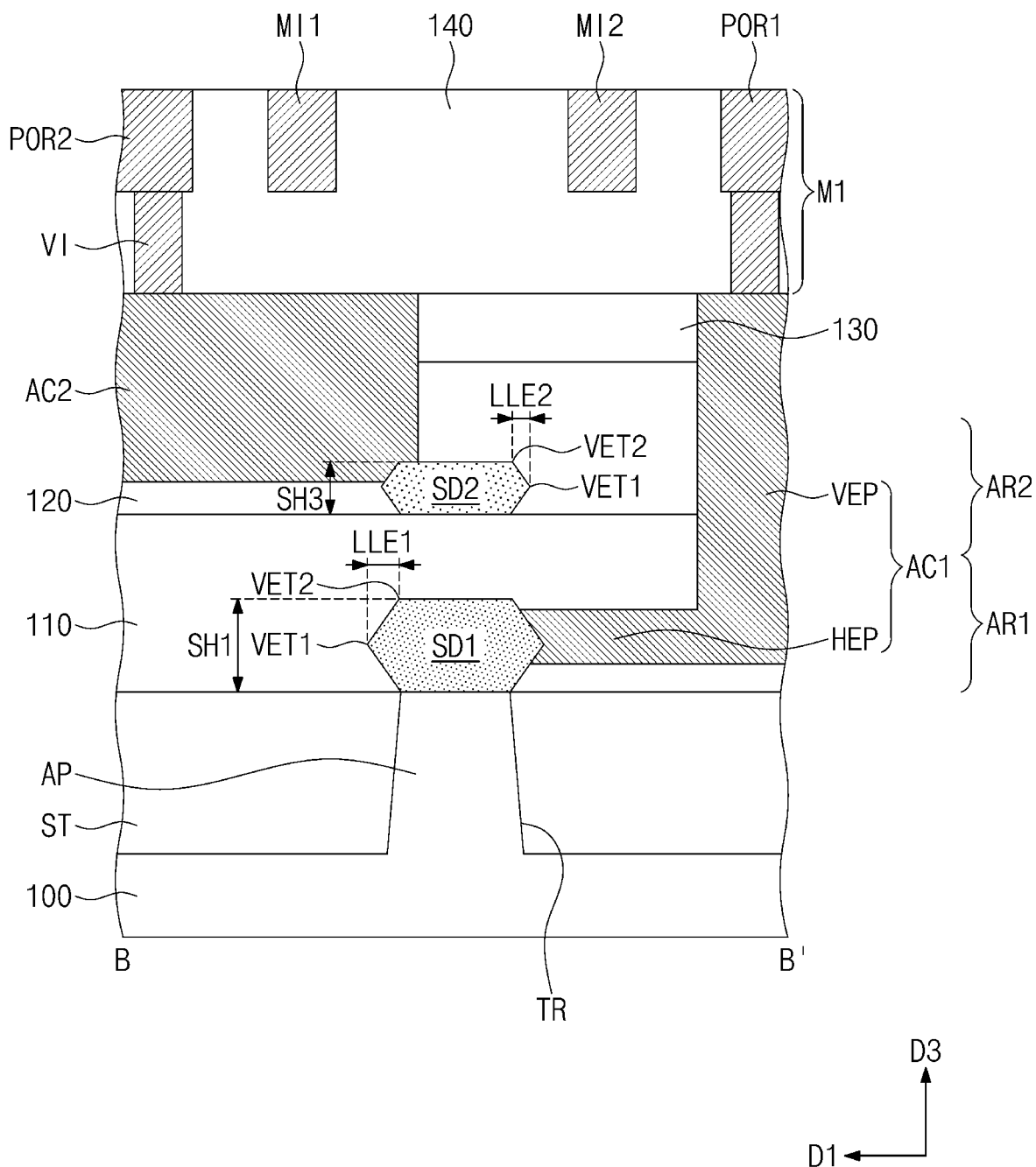
Figure 22C:
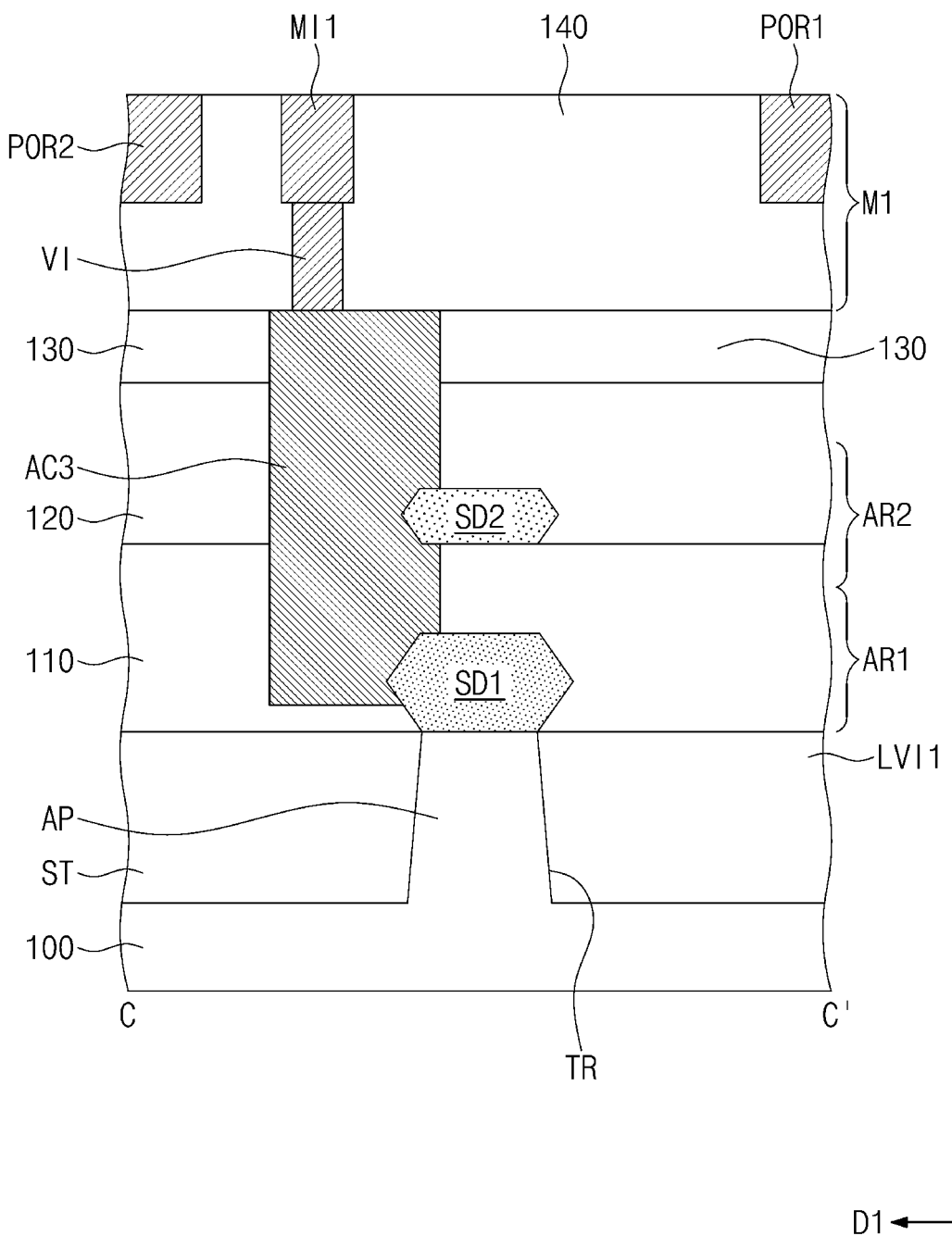

FIGS. 21A to 21C are sectional views, which are respectively taken along the lines A-A', B-B', and C-C' of FIG. 3 to illustrate a three-dimensional semiconductor device according to an embodiment. FIGS. 22A to 22C are sectional views, which are respectively taken along the lines A-A', B-B', and C-C' of FIG. 3 to illustrate a three-dimensional semiconductor device according to another embodiment. In the following description, an element previously described with reference to FIGS. 3 and 4A to 4D may be identified by the same reference number without repeating an overlapping description thereof, for the sake of brevity.

Referring to FIG. 3 and FIGS. 21A to 21C, the lower source/drain pattern SD1 of the transistor (e.g., NFET) of the first active region AR1 may be formed to have a relatively small height. In detail, a top surface of the lower source/drain pattern SD1 may be lower than a bottom surface of the second semiconductor pattern SP2. The top surface of the lower source/drain pattern SD1 may be located at a level between bottom and top surfaces of the second portion PO2 of the lower gate electrode LGE. The lower source/drain pattern SD1, including the side portion, may be shorter than that described with reference to FIG. 3 and FIGS. 4A to 4D.

The side portion of the lower source/drain pattern SD1 may be connected to only the first semiconductor pattern SP1. The side portion of the lower source/drain pattern SD1 may not be connected to the second semiconductor pattern SP2. The side portion of the lower source/drain pattern SD1 may have the first thickness SH1.

The upper source/drain pattern SD2 may be substantially the same as that described with reference to FIG. 3 and FIGS. 4A to 4D. The upper source/drain pattern SD2 may be connected to two semiconductor patterns (i.e., the fourth and fifth semiconductor patterns SP4 and SP5). The side portion of the upper source/drain pattern SD2 may have the third thickness SH3. The third thickness SH3 may be larger than the first thickness SH1.

The dummy channel pattern DSP may include the second and third semiconductor patterns SP2 and SP3. Each of the second and third semiconductor patterns SP2 and SP3 may be a dummy channel pattern which is not connected to any of the lower and upper source/drain patterns SD1 and SD2.

Referring back to FIG. 21B, the lower source/drain pattern SD1 may be formed to have a relatively small height (i.e., the first thickness SH1). Because the lower source/drain pattern SD1 is formed to have the relatively small height, the horizontal growth of the lower source/drain pattern SD1 may be relatively suppressed during the first SEG process of the lower source/drain pattern SD1.

In detail, the lower source/drain pattern SD1 may include a first vertex VET1, which has a horizontally protruding shape, and a second vertex VET2, which is defined by side and top surfaces thereof, as an inflection point. When measured in the first direction D1, a distance between the first and second vertices VET1 and VET2 of the lower source/drain pattern SD1 may be a first horizontal distance LLE1.

The upper source/drain pattern SD2 may also include a first vertex VET1, which has a horizontally protruding shape, and a second vertex VET2, which is defined by side and top surfaces thereof, as an inflection point. A distance between the first and second vertices VET1 and VET2 of the upper source/drain pattern SD2 in the first direction D1 may be a second horizontal distance LLE2. Here, the second horizontal distance LLE2 may be larger than the first horizontal distance LLE1.

In the three-dimensional semiconductor device according to the present embodiment, the number of the channel portions of the lower channel pattern CH1 (i.e., the number of the semiconductor patterns constituting the lower channel pattern CH1) may be one. By contrast, the number of the channel portions of the upper channel pattern CH2 (i.e., the number of the semiconductor patterns constituting the upper channel pattern CH2) may be two. Because the number of the channel portions of the upper channel pattern CH2 is greater than the number of the channel portions of the lower channel pattern CH1, the transistor (e.g., PFET) of the second active region AR2 may have a large current, compared with the transistor (e.g., NFET) of the first active region AR1. Thus, it may be possible to adjust an NP ratio (NFET current/PFET current) of the device according to the present embodiment to a relatively small value. For example, the NP ratio of the device according to the present embodiment may be smaller than one.

Referring to FIG. 3 and FIGS. 22A to 22C, the upper source/drain pattern SD2 of the transistor (e.g., PFET) of the second active region AR2 may be formed to have a relatively small height (or thickness). In detail, a bottom surface of the upper source/drain pattern SD2 may be higher than the top surface of the fourth semiconductor pattern SP4. The bottom surface of the upper source/drain pattern SD2 may be located at a level between bottom and top surfaces of the fifth portion PO5 of the upper gate electrode UGE.

The side portion of the upper source/drain pattern SD2 may be connected to only the fifth semiconductor pattern SP5. The side portion of the upper source/drain pattern SD2 may not be connected to the fourth semiconductor pattern SP4. The side portion of the upper source/drain pattern SD2 may have the third thickness SH3. The third thickness SH3 may be smaller than the first thickness SH1 of the lower source/drain pattern SD1.

The dummy channel pattern DSP may include the third and fourth semiconductor patterns SP3 and SP4. Each of the third and fourth semiconductor patterns SP3 and SP4 may be a dummy channel pattern which is not connected to any of the lower and upper source/drain patterns SD1 and SD2.

Referring back to FIG. 22B, the upper source/drain pattern SD2 may be formed to have a relatively small height (i.e., the third thickness SH3). Because the upper source/drain pattern SD2 is formed to have the relatively small height, the horizontal growth of the upper source/drain pattern SD2 may be relatively suppressed during the second SEG process of the upper source/drain pattern SD2. In detail, the second horizontal distance LLE2 between the first and second vertices VET1 and VET2 of the upper source/drain pattern SD2 may be smaller than the first horizontal distance LLE1 between the first and second vertices VET1 and VET2 of the lower source/drain pattern SD1.

In the three-dimensional semiconductor device according to the present embodiment, the number of the channel portions of the upper channel pattern CH2 (i.e., the number of the semiconductor patterns constituting the upper channel pattern CH2) may be one. By contrast, the number of the channel portions of the lower channel pattern CH1 (i.e., the number of the semiconductor patterns constituting the lower channel pattern CH1) may be two. Because the number of the channel portions of the lower channel pattern CH1 is greater than the number of the channel portions of the upper channel pattern CH2, the transistor (e.g., NFET) of the first active region AR1 may have a large current, compared with the transistor (e.g., PFET) of the second active region AR2. Thus, it may be possible to adjust an NP ratio (NFET current/PFET current) of the device according to the present embodiment to a relatively large value. For example, the NP ratio of the device according to the present embodiment may be greater than one.

Figure 23A:
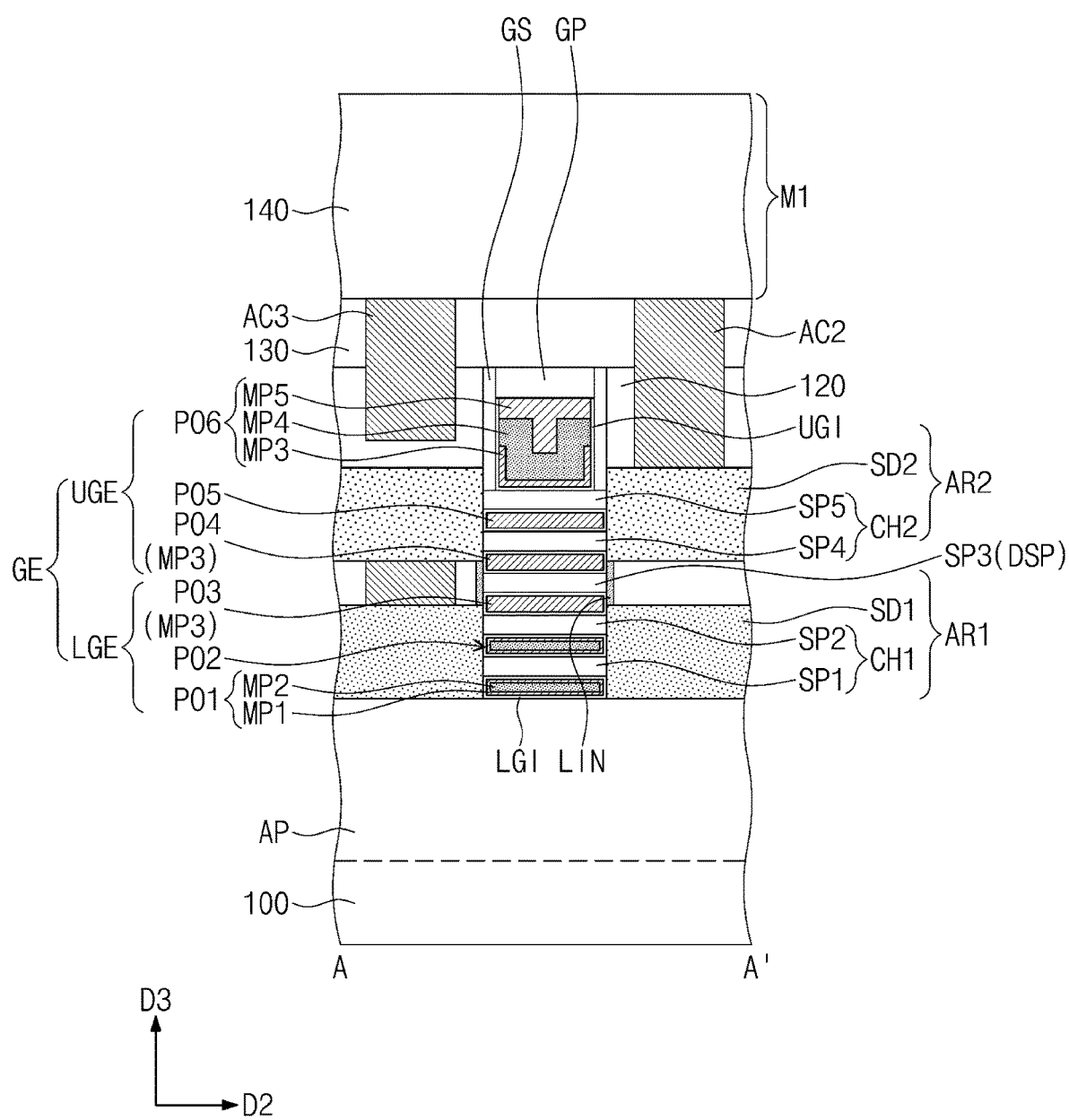
FIGS. 23A and 23B are sectional views, which are respectively taken along the lines A-A' and D-D' of FIG. 3 to illustrate a three-dimensional semiconductor device according to an embodiment.
Figure 23B:
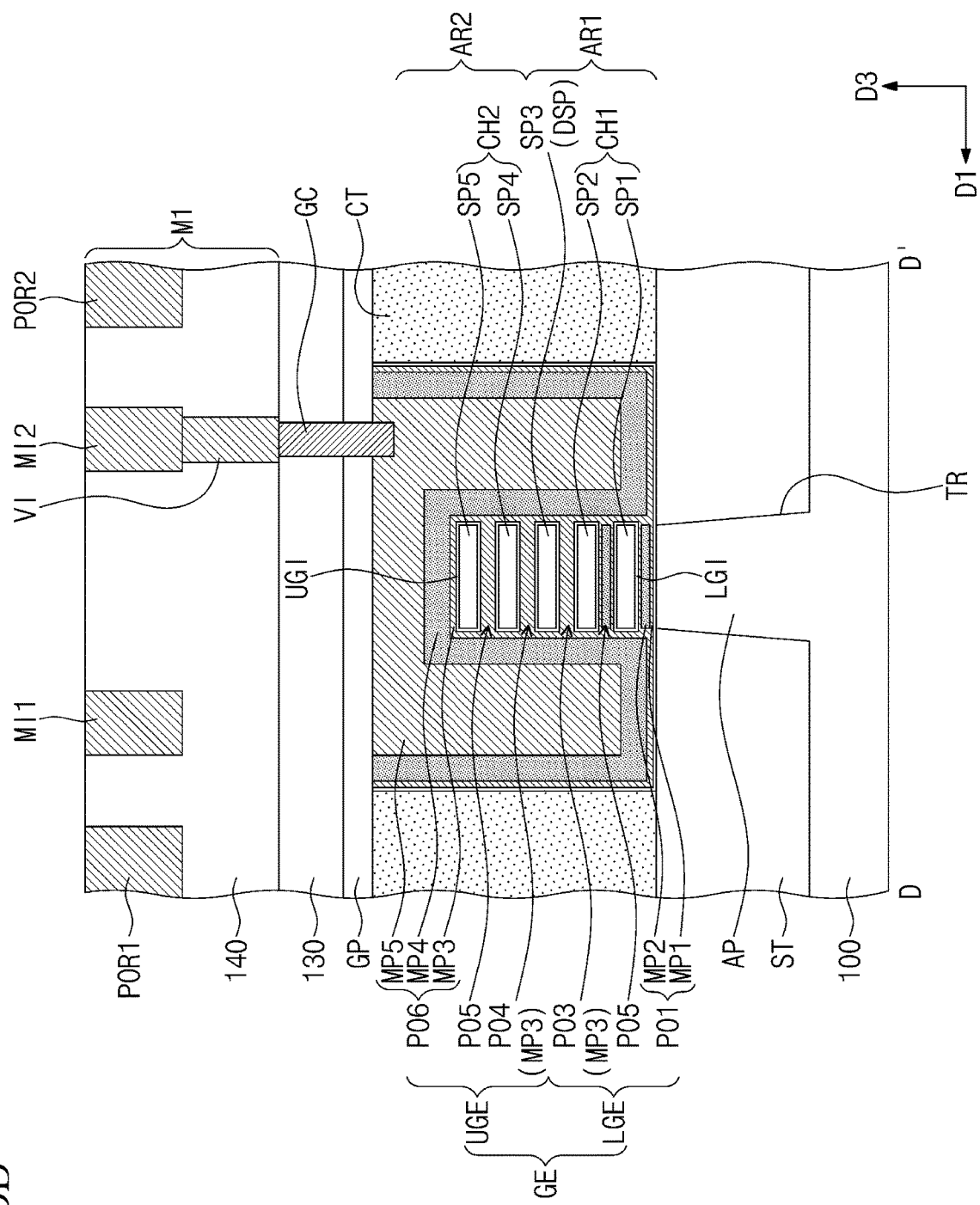

FIGS. 23A and 23B are sectional views, which are respectively taken along the lines A-A' and D-D' of FIG. 3 to illustrate a three-dimensional semiconductor device according to an embodiment. FIGS. 24A, 24B, 25A, 25B, 26A, and 26B are sectional views, which are respectively taken along the lines A-A' and D-D' of FIG. 3 to illustrate a three-dimensional semiconductor device according to an embodiment. In the following description, an element previously described with reference to FIGS. 3 and 4A to 4D may be identified by the same reference number without repeating an overlapping description thereof, for the sake of brevity.

Referring to FIG. 3 and FIGS. 23A and 23B, unlike the first and second portions PO1 and PO2, the third portion PO3 of the lower gate electrode LGE may not include the first and second metal patterns MP1 and MP2. The third portion PO3 may include the third metal pattern MP3. The third portion PO3 may include the same work function metal (i.e., the second or p-type work function metal) as the fourth and fifth portions PO4 and PO5 of the upper gate electrode UGE.

The first and second portions PO1 and PO2 of the lower gate electrode LGE may be respectively provided adjacent to bottom and top surfaces of the first semiconductor pattern SP1 of the lower channel pattern CH1. The first and second portions PO1 and PO2 may include the first work function metal (i.e., the n-type work function metal). In this regard, the first semiconductor pattern SP1 may be enclosed by the first work function metal and may have a relatively low threshold voltage.

By contrast, the first work function metal of the second portion PO2 may be adjacent to a bottom surface of the second semiconductor pattern SP2, and the second work function metal of the third portion PO3 may be adjacent to a top surface of the second semiconductor pattern SP2. The second semiconductor pattern SP2 may be enclosed by different work function metals (e.g., the n-type and p-type work function metals). Because the p-type work function metal of the third portion PO3 is adjacent to the second semiconductor pattern SP2, which is a channel pattern of an NFET, a threshold voltage of the second semiconductor pattern SP2 may be relatively increased. Due to this increase of the threshold voltage, there may be no or little current flowing through the second semiconductor pattern SP2.

According to the present embodiment, in the lower channel pattern CH1, the number of the semiconductor patterns enclosed by the first work function metal may be one (i.e., the first semiconductor pattern SP1). In the lower channel pattern CH1, the number of the semiconductor patterns connected to the lower source/drain pattern SD1 may be two (i.e., the first and second semiconductor patterns SP1 and SP2). In this regard, the number of the semiconductor patterns enclosed by the first work function metal may be smaller than the number of the semiconductor patterns connected to the lower source/drain pattern SD1. In an embodiment, the expression "the semiconductor pattern is enclosed by the first work function metal" may indicate that the first work function metal is adjacent to at least two surfaces (e.g., bottom and top surfaces) of the semiconductor pattern.

For the three-dimensional semiconductor device according to the present embodiment, in the lower channel pattern CH1, the number of the semiconductor patterns enclosed by the second metal pattern MP2 (i.e., the first work function metal) may be one. In the upper channel pattern CH2, the number of the semiconductor patterns enclosed by the third metal pattern MP3 (i.e., the second work function metal) may be two. The transistor (e.g., PFET) of the second active region AR2 may have a large current, compared with the transistor (e.g., NFET) of the first active region AR1. Thus, it may be possible to adjust an NP ratio (NFET current/PFET current) of the device according to the present embodiment to a relatively small value. For example, the NP ratio of the device according to the present embodiment may be smaller than one.

Figure 24A:
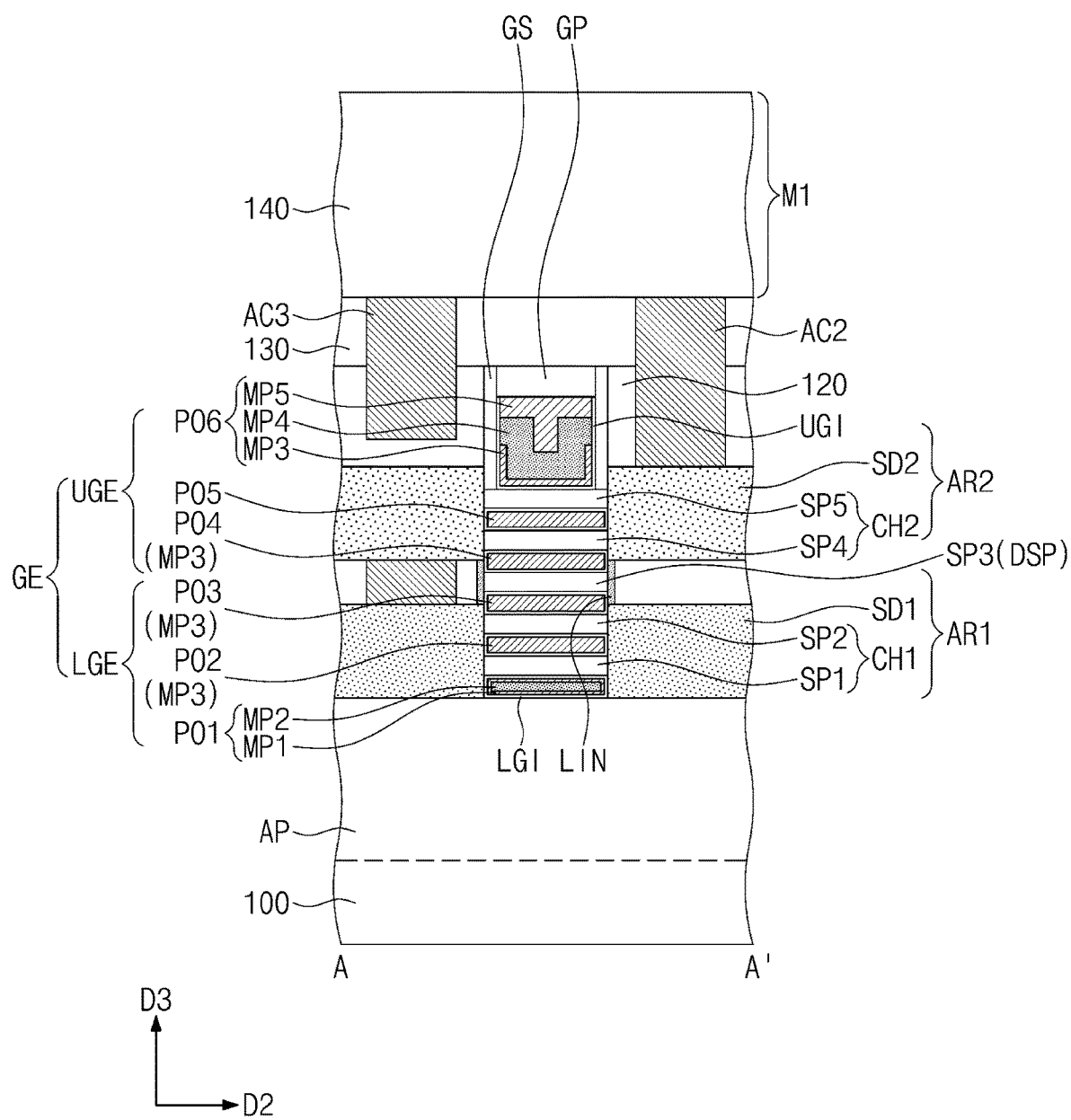
FIGS. 24A, 24B, 25A, 25B, 26A, and 26B are sectional views, which are respectively taken along the lines A-A' and D-D' of FIG. 3 to illustrate a three-dimensional semiconductor device according to an embodiment.
Figure 24B:
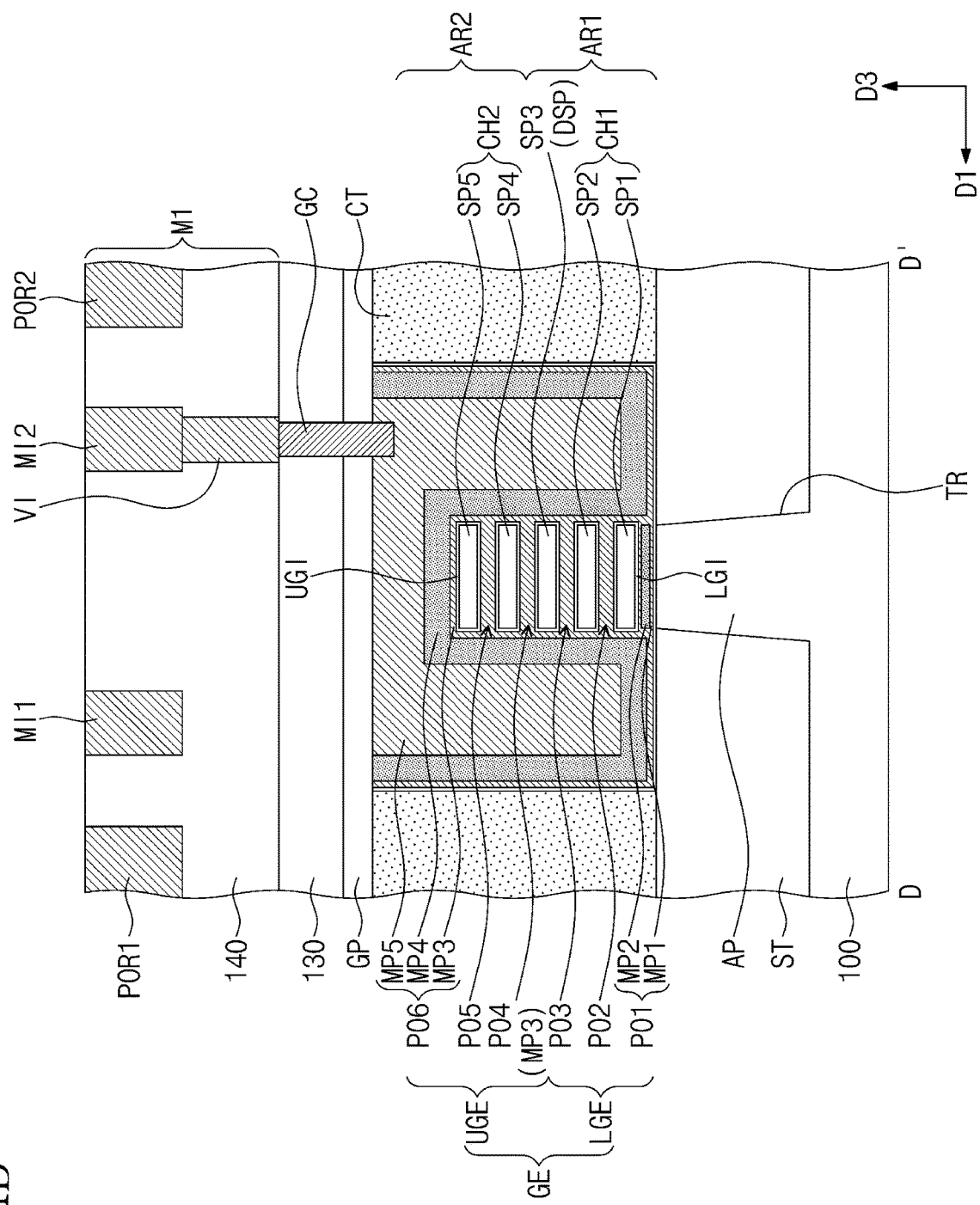

Referring to FIGS. 3, 24A, and 24B, not only the third portion PO3 of the lower gate electrode LGE but also the second portion PO2 may not include the first and second metal patterns MP1 and MP2. The second and third portions PO2 and PO3 may include the third metal pattern MP3. The second and third portions PO2 and PO3 may include the second work function metal (i.e., the p-type work function metal).

The second and third portions PO2 and PO3 may be respectively provided adjacent to bottom and top surfaces of the second semiconductor pattern SP2 of the lower channel pattern CH1. Because the second and third portions PO2 and PO3 include the second work function metal, the second semiconductor pattern SP2 may be enclosed by the p-type work function metal and thereby may have a very high threshold voltage.

The first and second portions PO1 and PO2 may be respectively provided adjacent to bottom and top surfaces of the first semiconductor pattern SP1 of the lower channel pattern CH1. The second portion PO2 may include the second work function metal, but the first portion PO1 may include the first work function metal (i.e., the n-type work function metal). In this regard, the first semiconductor pattern SP1 may have a relatively high threshold voltage but may have a threshold voltage lower than the second semiconductor pattern SP2.

For the transistor (e.g., NFET) of the first active region AR1 according to the present embodiment, little current may flow through the lower channel pattern CH1, due to a high threshold voltage. By contrast, the transistor (e.g., PFET) of the second active region AR2 may be a very large current, compared with the transistor of the first active region AR1. Thus, it may be possible to adjust an NP ratio (NFET current/PFET current) of the device according to the present embodiment to an ultimately small value.

Figure 25A:
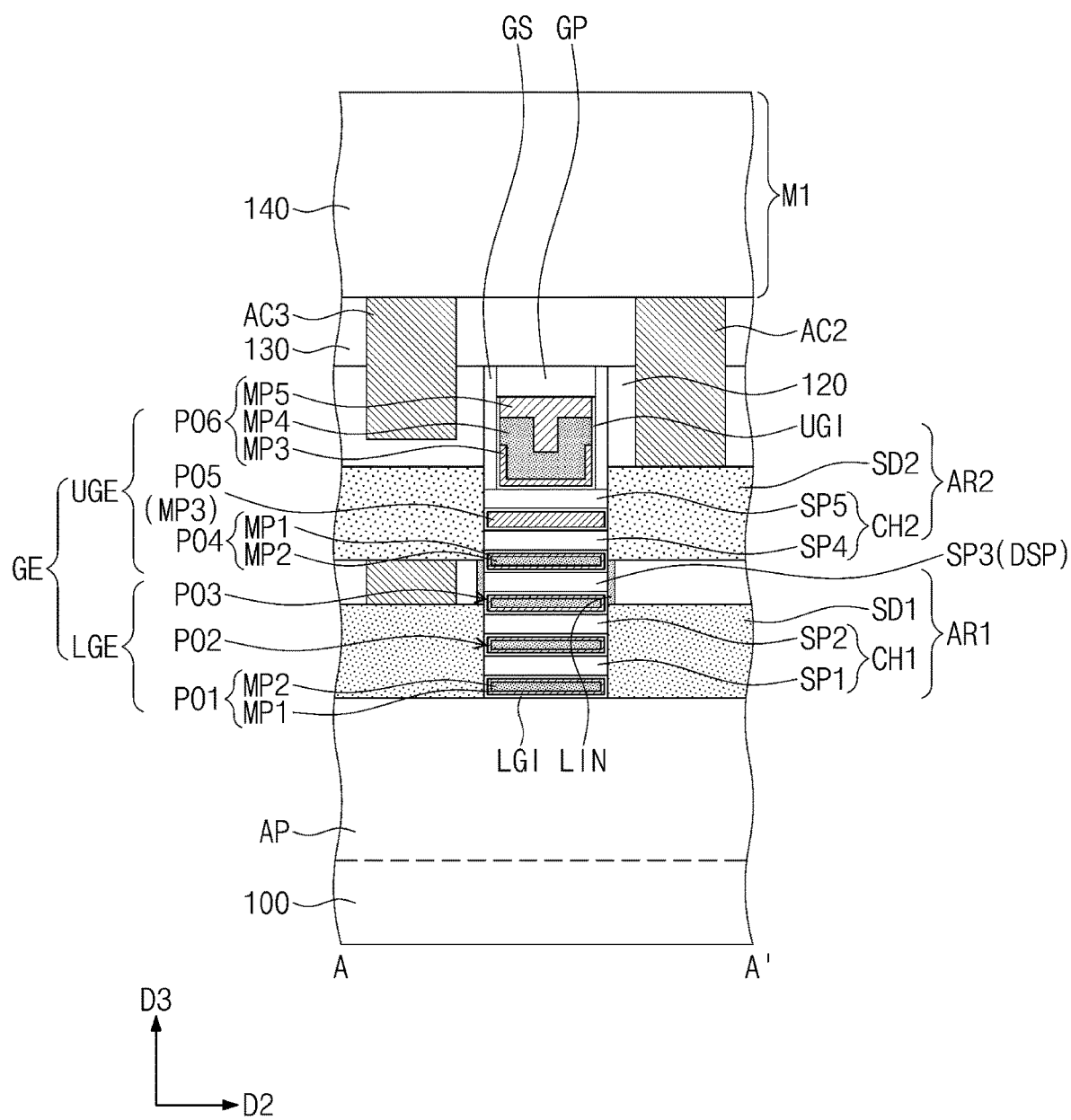
Figure 25B:
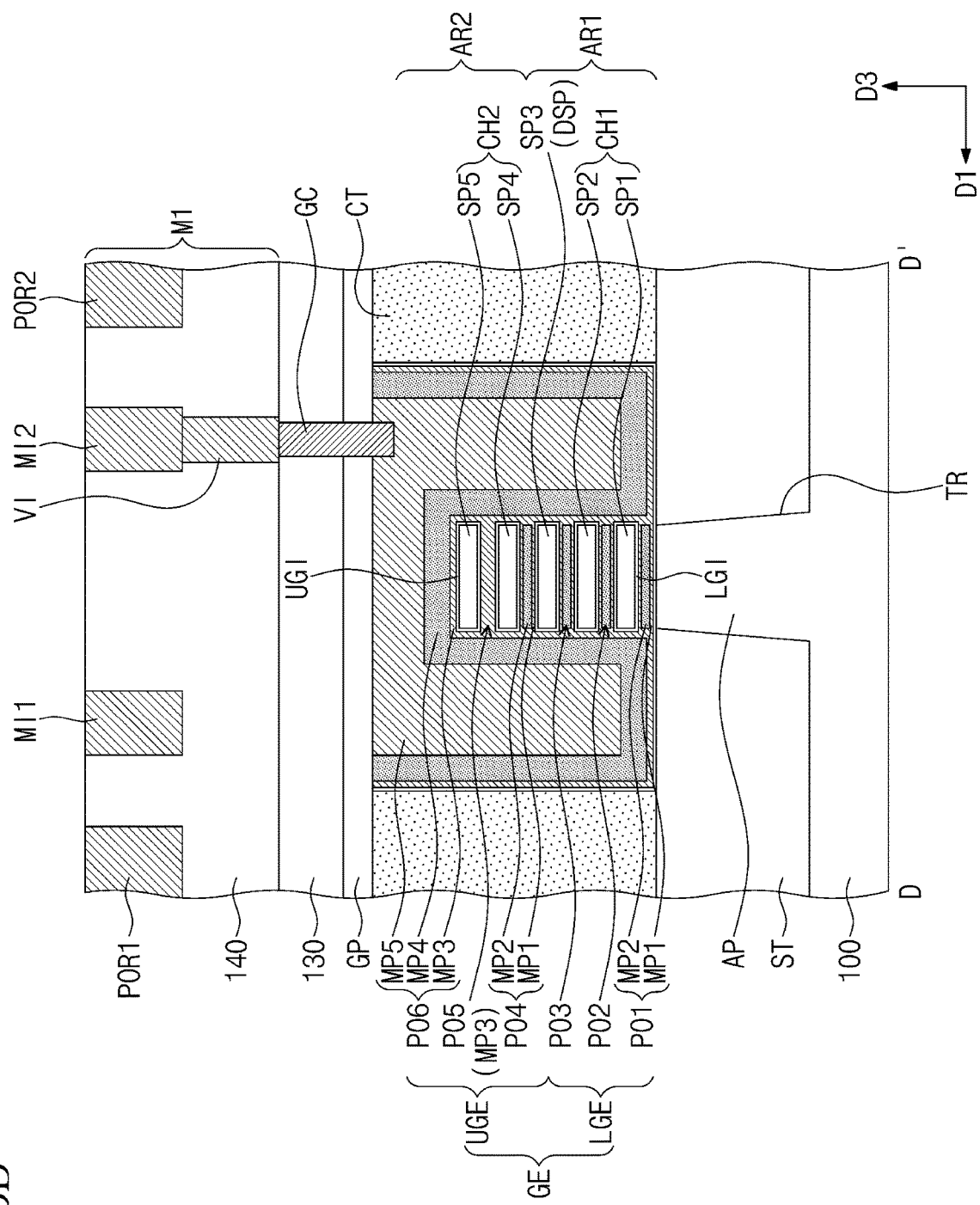

Referring to FIGS. 3, 25A, and 25B, the fourth portion PO4 of the upper gate electrode UGE may not include the third metal pattern MP3, unlike the fifth portion PO5. The fourth portion PO4 may include the first and second metal patterns MP1 and MP2. The fourth portion PO4 may include the same work function metal (e.g., the first or n-type work function metal) as the first to third portions PO1-PO3 of the lower gate electrode LGE.

The fifth and sixth portions PO5 and PO6 of the upper gate electrode UGE may be respectively provided adjacent to bottom and top surfaces of the fifth semiconductor pattern SP5 of the upper channel pattern CH2. The fifth and sixth portions PO5 and PO6 may include the second work function metal (i.e., the p-type work function metal). In this regard, the fifth semiconductor pattern SP5 may be enclosed by the second work function metal and may have a relatively low threshold voltage.

By contrast, the second work function metal of the fifth portion PO5 may be adjacent to a top surface of the fourth semiconductor pattern SP4, and the first work function metal of the fourth portion PO4 may be adjacent to a bottom surface of the fourth semiconductor pattern SP4. The fourth semiconductor pattern SP4 may be enclosed by different work function metals (e.g., the n-type and p-type work function metals). Because the n-type work function metal of the fourth portion PO4 is adjacent to the fourth semiconductor pattern SP4, which is a channel pattern of a PFET, a threshold voltage of the fourth semiconductor pattern SP4 may be relatively increased. Due to this increase of the threshold voltage, there may be no or little current flowing through the fourth semiconductor pattern SP4.

According to the present embodiment, in the upper channel pattern CH2, the number of the semiconductor patterns enclosed by the second work function metal may be one (i.e., the fifth semiconductor pattern SP5). In the upper channel pattern CH2, the number of the semiconductor patterns connected to the upper source/drain pattern SD2 may be two (i.e., the fourth and fifth semiconductor patterns SP4 and SP5). That is, the number of the semiconductor patterns enclosed by the second work function metal may be smaller than the number of the semiconductor patterns connected to the upper source/drain pattern SD2.

For the three-dimensional semiconductor device according to the present embodiment, in the lower channel pattern CH1, the number of the semiconductor patterns enclosed by the second metal pattern MP2 (i.e., the first work function metal) may be two. In the upper channel pattern CH2, the number of the semiconductor patterns enclosed by the third metal pattern MP3 (i.e., the second work function metal) may be one. The transistor (e.g., NFET) of the first active region AR1 may have a large current, compared with the transistor (e.g., PFET) of the second active region AR2. Thus, it may be possible to adjust an NP ratio (NFET current/PFET current) of the device according to the present embodiment to a relatively large value. For example, the NP ratio of the device according to the present embodiment may be greater than one.

Figure 26A:
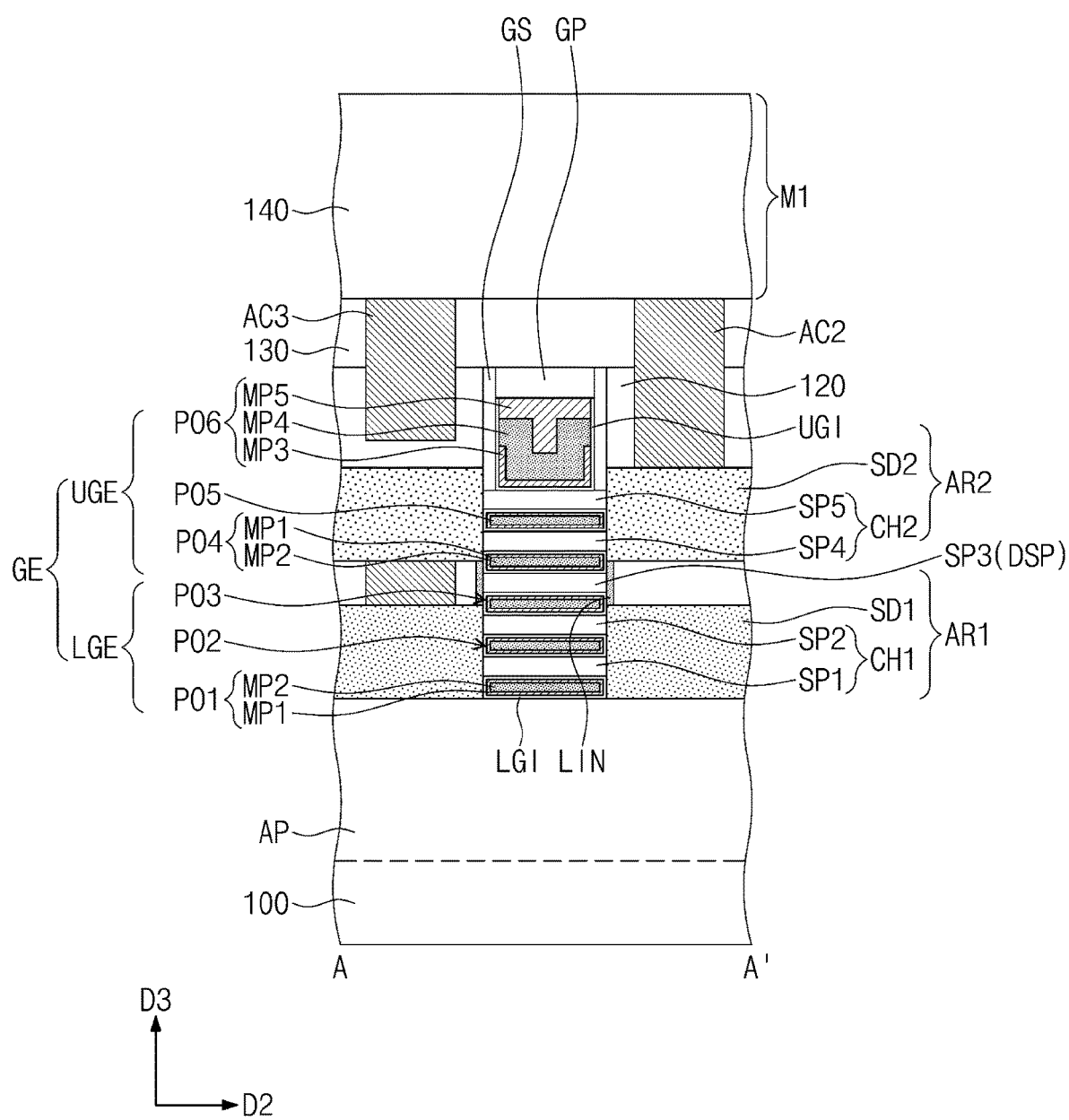
Figure 26B:
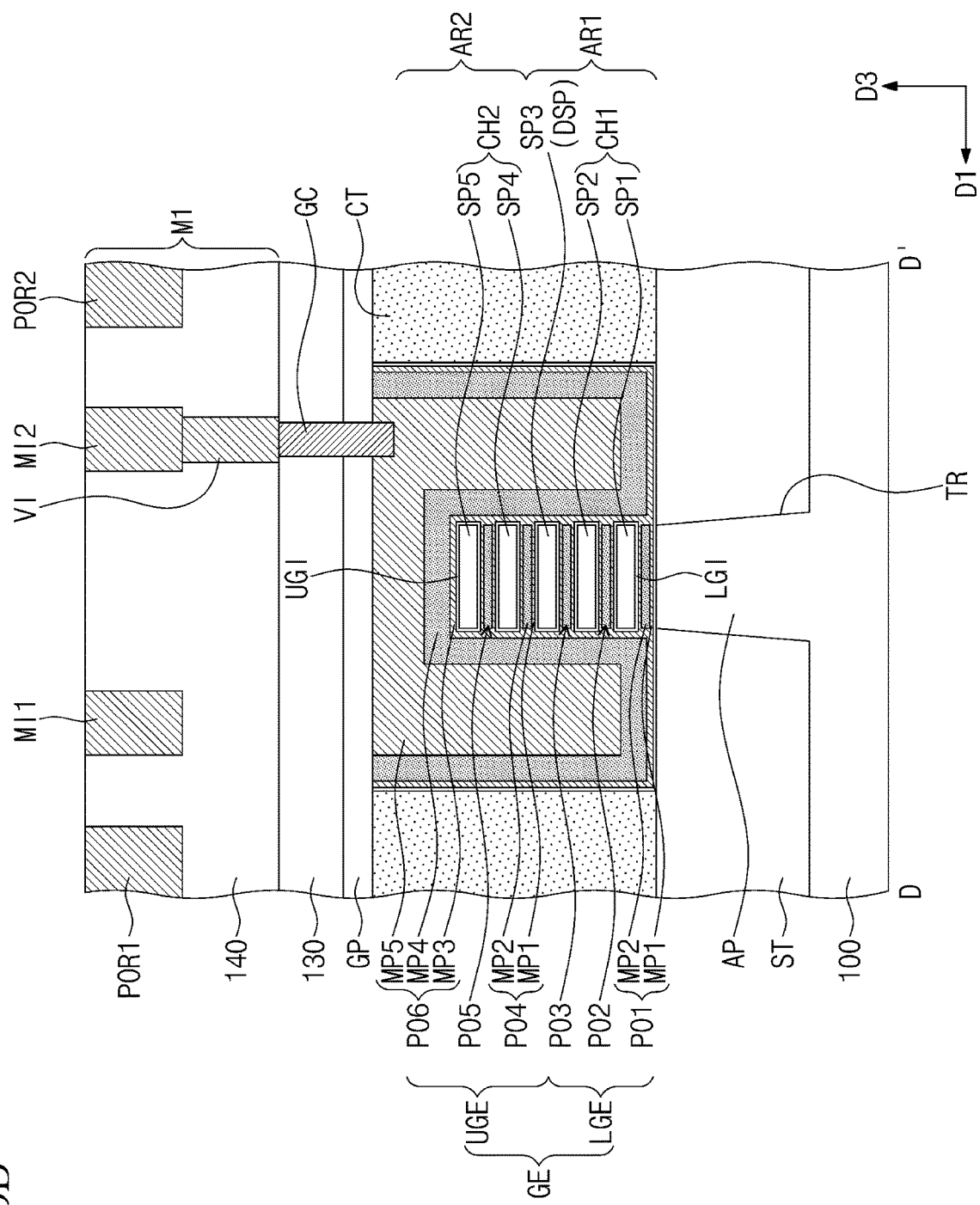

Referring to FIGS. 3, 26A, and 26B, not only the fourth portion PO4 of the upper gate electrode UGE but also the fifth portion PO5 may not include the third metal pattern MP3. The fourth and fifth portions PO4 and PO5 may include the first and second metal patterns MP1 and MP2. The fourth and fifth portions PO4 and PO5 may include the first work function metal (i.e., the n-type work function metal).

The fourth and fifth portions PO4 and PO5 may be respectively provided adjacent to bottom and top surfaces of the fourth semiconductor pattern SP4 of the upper channel pattern CH2. Because the fourth and fifth portions PO4 and PO5 include the first work function metal, the fourth semiconductor pattern SP4 may be enclosed by the n-type work function metal and thereby may have a very high threshold voltage.

The fifth and sixth portions PO5 and PO6 may be respectively provided adjacent to bottom and top surfaces of the fifth semiconductor pattern SP5 of the upper channel pattern CH2. The fifth portion PO5 may include the first work function metal, and the sixth portion PO6 may include the second work function metal (i.e., the p-type work function metal). In this regard, the fifth semiconductor pattern SP5 may have a threshold voltage that is relatively high but is lower than that of the fourth semiconductor pattern SP4.

For the transistor (e.g., PFET) of the second active region AR2 according to the present embodiment, little current may flow through the upper channel pattern CH2, due to a high threshold voltage thereof. By contrast, the transistor (e.g., NFET) of the first active region AR1 may be a very large current, compared with the transistor of the second active region AR2. Thus, it may be possible to adjust an NP ratio (NFET current/PFET current) of the device according to the present embodiment to an ultimately large value.

A gate electrode forming method according to the embodiments described with reference to FIGS. 23A to 26B may be similar to that described with reference to FIGS. 14 to 19. In the gate electrode forming method according to the present embodiment, by adjusting a level of the top surface of the second mask layer MA2 of FIG. 18, it may be possible to control heights of regions to be filled with the second and third metal patterns MP2 and MP3.

In a three-dimensional semiconductor device according to an embodiment, a lower gate electrode and an upper gate electrode may be stably formed on a lower channel pattern and an upper channel pattern, respectively. As a result, it may be possible to reliably realize a three-dimensional device including NMOSFET and PMOSFET which are vertically stacked.

In the three-dimensional semiconductor device, an NP ratio may be controlled to a desired value by reducing a current of at least one of the stacked NMOSFET and PMOSFET. Accordingly, it may be possible to optimize a logic cell including the stacked NMOSFET and PMOSFET and thereby to improve electrical characteristics of the device.

In the three-dimensional semiconductor device, by reducing a volume of a source/drain pattern or realizing a desired threshold voltage using a work function metal, a current of at least one of the stacked NMOSFET and PMOSFET may be easily reduced without adding a separate process.

While aspects of example embodiments have been particularly shown and described, it will be understood by one of ordinary skill in the art that variations in form and detail may be made therein without departing from the spirit and scope of the attached claims.

What is claimed is:

1. A three-dimensional semiconductor device, comprising:
   a first active region on a substrate, the first active region comprising a pair of lower source/drain regions and a lower channel structure between the pair of lower source/drain regions;
   a second active region on the first active region, the second active region comprising a pair of upper source/drain regions and an upper channel structure between the pair of upper source/drain regions; and
   a gate electrode on the lower channel structure and the upper channel structure,
   wherein the lower channel structure comprises a plurality of lower semiconductor layers, which are spaced apart from each other along a direction perpendicular to an upper surface of the substrate, wherein the upper channel structure comprises a plurality of upper semiconductor layers spaced apart from each other along the direction, wherein the gate electrode comprises:
  a first metal structure comprising a first metal and enclosing at least one of the plurality of lower semiconductor layers; and
  a second metal structure comprising a second metal and enclosing at least one of the plurality of upper semiconductor layers, wherein the first metal structure is provided adjacent to a bottom surface of one of an uppermost layer among the plurality of lower semiconductor layers and a lowermost layer among the plurality of upper semiconductor layers, and wherein the second metal structure is provided adjacent to a top surface of the one of the uppermost layer and the lowermost layer.

2. The device of claim 1, wherein the plurality of lower semiconductor layers connect the pair of lower source/drain regions to each other, and
  wherein the plurality of upper semiconductor layers connect the pair of upper source/drain regions to each other.

3. The device of claim 1, wherein the at least one of the plurality of upper semiconductor layers overlaps with the pair of lower source/drain regions along a second direction parallel to the upper surface of the substrate.

4. The device of claim 3, wherein a number of the plurality of lower semiconductor layers is smaller than a number of the plurality of upper semiconductor layers.

5. The device of claim 4, wherein a current of a transistor of the first active region is smaller than a current of a transistor of the second active region.

6. The device of claim 1, wherein the at least one of the plurality of lower semiconductor layers overlaps with the pair of upper source/drain regions along a second direction parallel to the upper surface of the substrate.

7. The device of claim 6, wherein a number of the plurality of upper semiconductor layers is smaller than a number of the plurality of lower semiconductor layers.

8. The device of claim 7, wherein a current of a transistor of the second active region is smaller than a current of a transistor of the first active region.

9. The device of claim 1, further comprising a dummy channel structure between the lower channel structure and the upper channel structure,
  wherein the dummy channel structure comprises at least one semiconductor layer that is spaced apart from the pair of lower source/drain regions and the pair of upper source/drain regions.

10. The device of claim 1, wherein the first active region is an NMOSFET region,
  wherein the second active region is a PMOSFET region,
  wherein the first metal is an n-type metal, and
  wherein the second metal is a p-type metal.

11. A three-dimensional semiconductor device, comprising:
  a plurality of lower semiconductor layers on a substrate and spaced apart from each other along a direction perpendicular to an upper surface of the substrate;
  a lower source/drain region connected to the plurality of lower semiconductor layers;
  a lower gate electrode on the plurality of lower semiconductor layers; layers,
  a plurality of upper semiconductor layers spaced apart from each other along the direction on the plurality of lower semiconductor layers;
  an upper source/drain region connected to the plurality of upper semiconductor layers; and
  a dummy channel structure between the plurality of lower semiconductor layers and the plurality of upper semiconductor layers, wherein the dummy channel structure comprises at least one semiconductor layer that is spaced apart from the lower source/drain region and the upper source/drain region, wherein the lower gate electrode comprises a first metal structure comprising a first metal and enclosing at least one of the plurality of lower semiconductor layers, and wherein a number of semiconductor layers in the plurality of lower semiconductor layers that are enclosed by the first metal structure, is smaller than a number of the plurality of lower semiconductor layers connected to the lower source/drain region.

12. The device of claim 11, further comprising:
  an upper gate electrode on the plurality of upper semiconductor layers,
  wherein the lower gate electrode and the upper gate electrode are connected to each other and constitute a single gate electrode,
  wherein the upper gate electrode comprises a second metal structure comprising a second metal and enclosing at least one of the plurality of upper semiconductor layers, and
  wherein a number of semiconductor layers included in the plurality of upper semiconductor layers that are enclosed by the second metal structure, is equal to a number of the plurality of upper semiconductor layers connected to the upper source/drain region.

13. The device of claim 12, wherein the first metal structure is adjacent to a bottom surface of an uppermost one of the plurality of lower semiconductor layers, and the second metal structure is adjacent to a top surface of the uppermost one of the plurality of lower semiconductor layers.

14. The device of claim 11, wherein the first metal structure is adjacent to a bottom surface of at least one of the plurality of lower semiconductor layers and is omitted from a top surface of the at least one of the plurality of lower semiconductor layers.

15. The device of claim 11, wherein the plurality of lower semiconductor layers comprise a first semiconductor layer and a second semiconductor layer,
  wherein the lower gate electrode comprises:
    a first portion interposed between the substrate and the first semiconductor layer;
    a second portion interposed between the first semiconductor layer and the second semiconductor layer; and
    a third portion on the second semiconductor layer,
  wherein the first portion comprises the first metal structure, and
  wherein the first metal structure is omitted from the third portion.

16. A three-dimensional semiconductor device, comprising:
  a first active region on a substrate, the first active region comprising a lower channel structure and a lower source/drain region connected to the lower channel structure;
  a second active region on the first active region, the second active region comprising an upper channel structure and an upper source/drain region connected to the upper channel structure; and a gate electrode on the lower channel structure and the upper channel structure, wherein a center portion of the lower source/drain region has a first thickness, wherein a center portion of the upper source/drain region has a second thickness different from the first thickness, wherein each of the lower source/drain region and the upper source/drain region comprises a first vertex on a side surface, which protrudes in a first direction, and a second vertex, which is an inflection point defined by the side surface and a top surface thereof, wherein a distance between the first vertex and the second vertex of the lower source/drain region in the first direction is a first horizontal distance, and wherein a distance between the first vertex and the second vertex of the upper source/drain region in the first direction is a second horizontal distance different from the second horizontal distance.

17. The device of claim 16, wherein the first thickness is smaller than the second thickness, and wherein the first horizontal distance is smaller than the second horizontal distance.

18. The device of claim 16, wherein the first thickness is larger than the second thickness, and wherein the first horizontal distance is larger than the second horizontal distance.

19. The device of claim 16, wherein the lower channel structure comprises a plurality of lower semiconductor layers, which are spaced apart from each other along a direction perpendicular to an upper surface of the substrate, wherein the upper channel structure comprises a plurality of upper semiconductor layers, which are spaced apart from each other along the direction, and wherein a number of the plurality of lower semiconductor layers connected to the lower source/drain region is different from a number of the plurality of upper semiconductor layers connected to the upper source/drain region.

20. The device of claim 16, wherein the lower source/drain region is adjacent to the lower channel structure along a second direction crossing the first direction, and wherein the upper source/drain region is adjacent to the upper channel structure in the second direction.

* * * * *